(12) United States Patent
Kawashima et al.

(10) Patent No.: US 12,080,095 B2
(45) Date of Patent: Sep. 3, 2024

(54) IMAGING DEVICE AND DRIVING METHOD THEREOF

(71) Applicant: Semiconductor Energy Laboratory Co., Ltd., Atsugi (JP)

(72) Inventors: Susumu Kawashima, Atsugi (JP); Kazunori Watanabe, Machida (JP); Koji Kusunoki, Isehara (JP); Satoshi Yoshimoto, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 15 days.

(21) Appl. No.: 17/639,632

(22) PCT Filed: Sep. 2, 2020

(86) PCT No.: PCT/IB2020/058145
§ 371 (c)(1),
(2) Date: Mar. 2, 2022

(87) PCT Pub. No.: WO2021/048695
PCT Pub. Date: Mar. 18, 2021

(65) Prior Publication Data
US 2022/0292871 A1     Sep. 15, 2022

(30) Foreign Application Priority Data
Sep. 13, 2019   (JP) ................................ 2019-167175

(51) Int. Cl.
*G06V 40/13*     (2022.01)
*G06F 3/041*     (2006.01)
(Continued)

(52) U.S. Cl.
CPC ........ *G06V 40/1365* (2022.01); *G06F 3/0412* (2013.01); *G06V 40/1318* (2022.01); *H04N 25/75* (2023.01)

(58) Field of Classification Search
CPC .......... G06V 40/1365; G06V 40/1318; H04N 25/75; G06F 3/0412
See application file for complete search history.

(56) References Cited

U.S. PATENT DOCUMENTS 5,410,348 A * 4/1995 Hamasaki .............. H04N 25/75
348/304
9,055,250 B2   6/2015 Park et al.
(Continued)

FOREIGN PATENT DOCUMENTS

CN     108989712 A    12/2018
CN     110537366 A    12/2019
(Continued)

OTHER PUBLICATIONS

International Search Report (Application No. PCT/IB2020/058145) Dated Dec. 8, 2020.
(Continued)

*Primary Examiner* — Stephen G Sherman
(74) *Attorney, Agent, or Firm* — Eric J. Robinson; Robinson Intellectual Property Law Office, P.C.

(57) ABSTRACT

To provide an imaging device having a function of biometric authentication and a function of a touch sensor or a near touch sensor. The imaging device includes pixels, current mirror circuits, and CDS circuits. The pixels, the current mirror circuits, and the CDS circuits are electrically connected to read lines. The current mirror circuit includes a first and a second transistor. One of a source and a drain of the first transistor is electrically connected to the read line, and a power supply potential is supplied to the other of a source and a drain of the second transistor. The imaging device outputs imaging data written to the pixel, as a first signal, to the read line in a first period, and then, resets the imaging data and outputs a second signal from the pixel to the read line in a second period. In the first period, a first (Continued)

potential is supplied to terminals, and in the second period, a second potential is supplied to terminals. A difference between the second potential and the power supply potential is greater than a difference between the first potential and the power supply potential.

6 Claims, 25 Drawing Sheets

(51) Int. Cl.
*G06V 40/12* (2022.01)
*H04N 25/75* (2023.01)

(56) References Cited

U.S. PATENT DOCUMENTS

| | | | |
|---|---|---|---|
| 10,462,396 B2 | 10/2019 | Shouho et al. | |
| 10,951,850 B2 | 3/2021 | Yamamoto et al. | |
| 11,019,289 B2 | 5/2021 | Shouho et al. | |
| 2011/0109592 A1* | 5/2011 | Kurokawa | G06F 3/0416 345/175 |
| 2013/0075594 A1 | 3/2013 | Kozuma | |
| 2015/0189209 A1 | 7/2015 | Yang et al. | |
| 2016/0021319 A1 | 1/2016 | Okamoto et al. | |
| 2016/0093652 A1 | 3/2016 | Ikeda et al. | |
| 2018/0130539 A1 | 5/2018 | Ikeda et al. | |
| 2018/0352179 A1 | 12/2018 | Shouho et al. | |
| 2019/0130087 A1 | 5/2019 | Mori et al. | |
| 2020/0106975 A1 | 4/2020 | Oike et al. | |

FOREIGN PATENT DOCUMENTS

| | | | |
|---|---|---|---|
| CN | 110832845 A | 2/2020 | |
| EP | 3654635 A | 5/2020 | |
| JP | 2018-182496 A | 11/2018 | |
| JP | 2018-207488 A | 12/2018 | |
| JP | 2019-079415 A | 5/2019 | |
| KR | 101029619 B1 * | 4/2011 | ........... H04N 25/766 |
| KR | 2019-0132402 A | 11/2019 | |
| KR | 2020-0028967 A | 3/2020 | |
| WO | WO-2011027508 A1 * | 3/2011 | ........... H04N 5/3591 |
| WO | WO-2018/190127 | 10/2018 | |
| WO | WO-2019/012369 | 1/2019 | |

OTHER PUBLICATIONS

Written Opinion (Application No. PCT/IB2020/058145) Dated Dec. 8, 2020.

* cited by examiner $C_{FD2} = C_a + C_b + C_{PC}$   $k_{FD2} = (C_a + C_b)/(C_a + C_b + C_{PC})$ $C_{FD2} = C_a + C_{PC}$   $k_{FD2} = C_a/(C_a + C_{PC})$ FIG. 9A
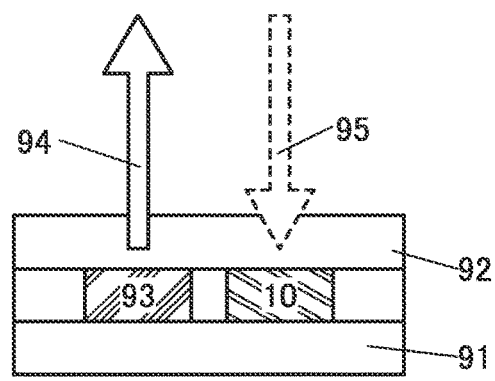
FIG. 9B1
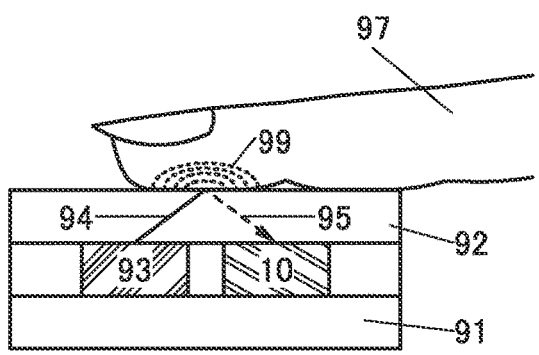
FIG. 9B2
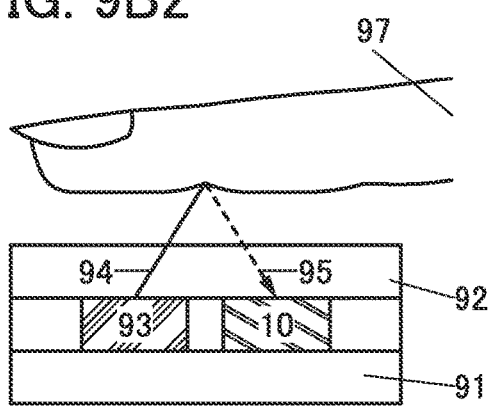

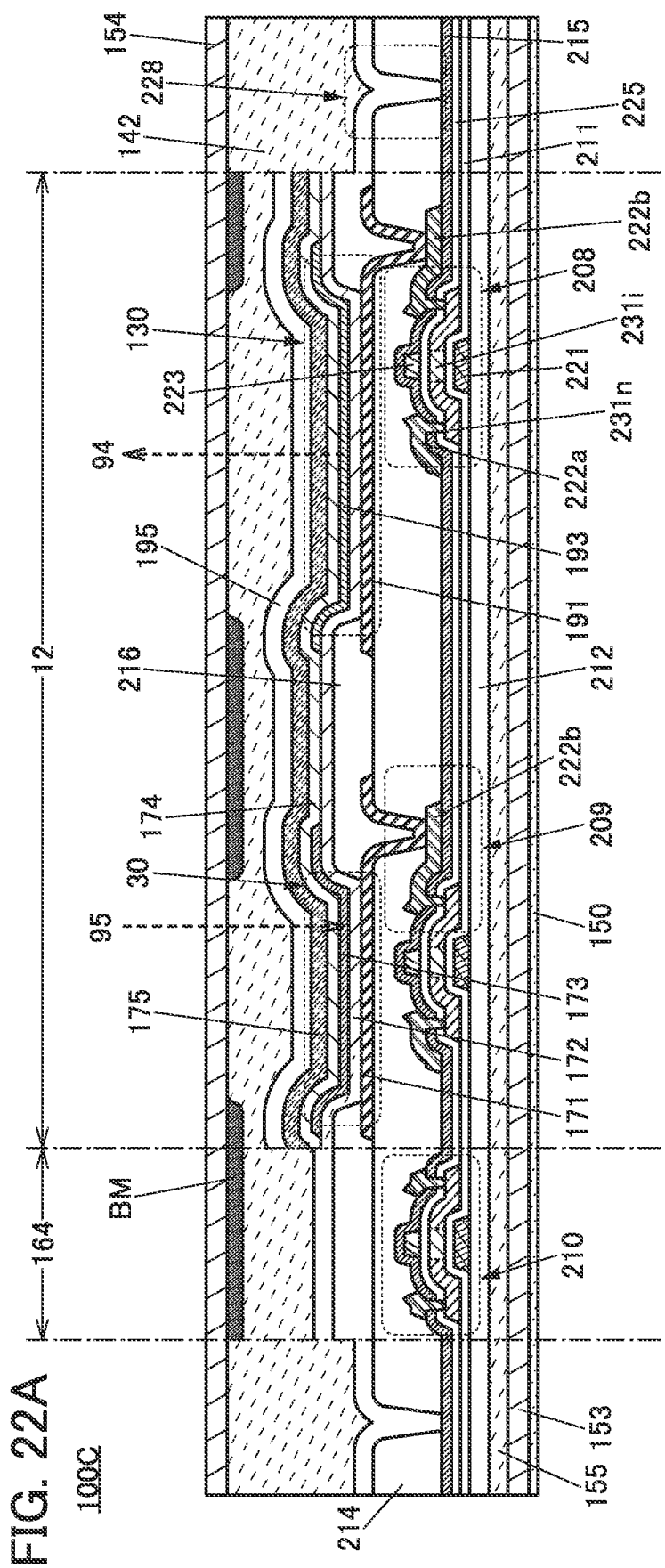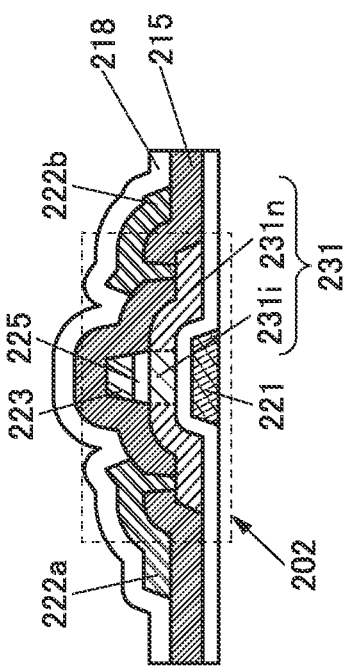

IMAGING DEVICE AND DRIVING METHOD THEREOF

TECHNICAL FIELD

One embodiment of the present invention relates to an imaging device and a driving method thereof.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device (e.g., touch sensor), an input/output device (e.g., touch panel), a driving method thereof, and a manufacturing method thereof. A semiconductor device refers to every device that can function by utilizing semiconductor characteristics.

BACKGROUND ART

Imaging devices are typically used to take a photograph or a moving image, and in recent years, they have also been applied to biometric authentication such as face authentication, fingerprint authentication, and vein authentication or input devices such as touch sensors or motion sensors, for example; that is, the usage has been diversified. Patent Document 1 discloses electronic devices such as smartphones capable of fingerprint authentication.

REFERENCE

Patent Document

[Patent Document 1] Japanese Published Patent Application No. 2019-79415

SUMMARY OF THE INVENTION

Problems to be Solved by the Invention

For example, in an electronic device that includes an imaging device and has a function of a touch sensor or a near touch sensor and a biometric authentication function such as fingerprint authentication, when the function of a touch sensor or a near touch sensor is used, it is preferable that image capturing be performed at a high frame frequency so that the motion of a sensing target such as a finger can be sensed with high accuracy. When biometric authentication is performed, it is preferable to perform high-accuracy image capturing to increase the accuracy of authentication.

An object of one embodiment of the present invention is to provide an imaging device that can perform image capturing at a high frame frequency. Another object is to provide an imaging device that can perform high-accuracy image capturing. Another object is to provide an imaging device that can perform high-accuracy biometric authentication. Another object is to provide an imaging device that can sense the position of a sensing target with high accuracy. Another object is to provide a reliable imaging device. Another object is to provide a novel imaging device. Another object is to provide a semiconductor device including the above imaging device.

An object of one embodiment of the present invention is to provide a driving method for an imaging device that can perform image capturing at a high frame frequency. Another object is to provide a driving method for an imaging device that can perform high-accuracy image capturing. Another object is to provide a driving method for an imaging device that can perform high-accuracy biometric authentication. Another object is to provide a driving method for an imaging device that can sense the position of a sensing target with high accuracy. Another object is to provide a driving method for a reliable imaging device. Another object is to provide a driving method for a novel imaging device. Another object is to provide a semiconductor device including an imaging device that is driven by the above method.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is an imaging device including a pixel and a CDS circuit, in which the CDS circuit includes a first transistor, a second transistor, a third transistor, a first capacitor, and a second capacitor, the pixel is electrically connected to one of a source and a drain of the first transistor and one electrode of the first capacitor through a wiring, the other of the source and the drain of the first transistor is electrically connected to one electrode of the second capacitor, and one of a source and a drain of the second transistor is electrically connected to a gate of the third transistor, the other electrode of the first capacitor, and the other electrode of the second capacitor.

In the above embodiment, the pixel may have a first period in which imaging data written to the pixel is output as a first signal to the wiring, and a second period in which the imaging data written to the pixel is reset and a second signal is output to the wiring, and the CDS circuit may have a function of turning on the second transistor in the first period and a function of turning off the second transistor in the second period.

In the above embodiment, the first transistor and the second transistor may each include a metal oxide in a channel formation region, and the metal oxide may contain In, Zn, and M (M is Al, Ti, Ga, Sn, Y, Zr, La, Ce, Nd, or Hf).

Another embodiment of the present invention is a method for driving an imaging device including a pixel and a current mirror circuit, in which the pixel and the current mirror circuit are electrically connected to a wiring, the current mirror circuit includes a first transistor and a second transistor, and one of a source and a drain of the first transistor is electrically connected to the wiring. In the method for driving the imaging device, in a first period, imaging data written to the pixel is output as a first signal to the wiring, and in a second period, the imaging data written to the pixel is reset and a second signal is output from the pixel to the wiring. In the first period, a first potential is supplied to a gate of the first transistor, a gate of the second transistor, and one of a source and a drain of the second transistor, and a power supply potential is supplied to the other of the source and the drain of the second transistor. In the second period, a second potential is supplied to the gate of the first transistor, the gate of the second transistor, and the one of the source and the drain of the second transistor, and the power supply potential is supplied to the other of the source and the drain of the second transistor. A difference between the second potential and the power supply potential is larger than a difference between the first potential and the power supply potential.

In the method for driving an imaging device, according to the above embodiment, the imaging device includes a CDS circuit, the CDS circuit includes a third transistor, a fourth transistor, a fifth transistor, a first capacitor, and a second capacitor, the wiring is electrically connected to one of a source and a drain of the third transistor and one electrode of the first capacitor, the other of the source and the drain of the third transistor is electrically connected to one electrode of the second capacitor, and one of a source and a drain of the fourth transistor is electrically connected to a gate of the fifth transistor, the other electrode of the first capacitor, and the other electrode of the second capacitor; in the first period, the fourth transistor may be in an on state; and in the second period, the fourth transistor may be in an off state.

In the above embodiment, the third transistor and the fourth transistor may each include a metal oxide in a channel formation region, and the metal oxide may contain In, Zn, and M (M is Al, Ti, Ga, Sn, Y, Zr, La, Ce, Nd, or Hf).

Effect of the Invention

According to one embodiment of the present invention, an imaging device that can perform image capturing at a high frame frequency can be provided. An imaging device that can perform high-accuracy image capturing can be provided. An imaging device that can perform high-accuracy biometric authentication can be provided. An imaging device that can sense the position of a sensing target with high accuracy can be provided. A reliable imaging device can be provided. A novel imaging device can be provided. A semiconductor device including the above imaging device can be provided.

According to one embodiment of the present invention, a driving method for an imaging device that can perform image capturing at a high frame frequency can be provided. A driving method for an imaging device that can perform high-accuracy image capturing can be provided. A driving method for an imaging device that can perform high-accuracy biometric authentication can be provided. A driving method for an imaging device that can sense the position of a sensing target with high accuracy can be provided. A driving method for a reliable imaging device can be provided. A driving method for a novel imaging device can be provided. A semiconductor device including an imaging device that is driven by the above method can be provided.

Note that the description of these effects does not preclude the existence of other effects. One embodiment of the present invention does not have to have all of these effects. Other effects can be derived from the description of the specification, the drawings, the claims, and the like.

BRIEF DESCRIPTION OF THE DRAWINGS

FIG. 9A, FIG. 9B1, and FIG. 9B2 are schematic diagrams illustrating a structure example of a semiconductor device.

FIG. 22A and FIG. 22B are cross-sectional views illustrating a structure example of a semiconductor device.

MODE FOR CARRYING OUT THE INVENTION

Figure 1A:
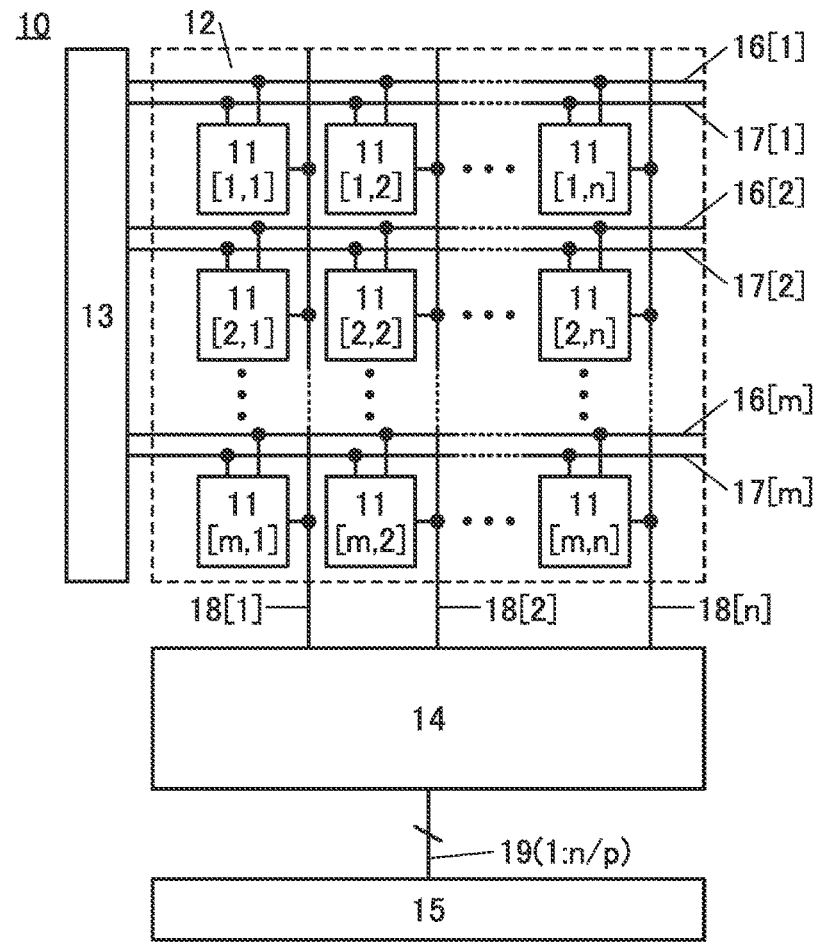
FIG. 1A and FIG. 1B are block diagrams illustrating a configuration example of an imaging device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in the structures of the invention described below, the same portions or portions having similar functions are denoted with the same reference numerals in different drawings, and description of such portions is not repeated.

The position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in the drawings and the like. For example, in an actual manufacturing process, a resist mask or the like might be unintentionally reduced in size by treatment such as etching, which might not be reflected in the drawings for easy understanding.

In addition, in this specification and the like, the terms "electrode" and "wiring" do not functionally limit these components. For example, an "electrode" is used as part of a "wiring" in some cases, and vice versa. Furthermore, the terms "electrode" and "wiring" can also include the case where a plurality of "electrodes" and "wirings" are formed in an integrated manner.

In this specification and the like, the resistance value of a "resistor" is sometimes determined depending on the length of a wiring. Alternatively, the resistance value is sometimes determined through the connection of a conductive layer used for a wiring to a conductive layer with resistivity different from that of the conductive layer. Alternatively, the resistance value is sometimes determined through impurity doping in a semiconductor layer.

In this specification and the like, a "terminal" in an electric circuit refers to a portion that inputs or outputs current or voltage or receives or transmits a signal. Accordingly, part of a wiring or an electrode functions as a terminal in some cases.

Note that the term "over", "above", "under", or "below" in this specification and the like does not necessarily mean that a component is placed directly over and in contact with or directly under and in contact with another component. For example, the expression "electrode B over insulating layer A" does not necessarily mean that the electrode B is formed over and in direct contact with the insulating layer A, and does not exclude the case where another component is provided between the insulating layer A and the electrode B. Additionally, the expression "conductive layer D above conductive layer C" does not necessarily mean that the conductive layer D is formed over and in direct contact with the conductive layer C, and does not exclude the case where another component is provided between the conductive layer C and the conductive layer D. The term "above" or "below" does not exclude the case where a component is placed in an oblique direction.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Therefore, the terms source and drain can be switched in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected. Thus, even when the expression "electrically connected" is used, there is a case where no physical connection is made and a wiring just extends in an actual circuit. In addition, the expression "directly connected" includes the case where different conductive layers are connected to each other through a contact to form a wiring. Thus, a wiring may be formed of conductive layers that contain one or more of the same elements or may be formed of conductive layers that contain different elements.

In this specification and the like, the terms "identical", "same", "equal", "uniform", and the like used in describing calculation values and actual measurement values allow for a margin of error of ±20% unless otherwise specified.

A voltage refers to a voltage difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" and an "insulator" can be replaced with each other. In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" and a "conductor" can be replaced with each other. In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor can be regarded as being electrically short-circuited. Furthermore, an "off state" of the transistor refers to a state in which the source and the drain of the transistor can be regarded as being electrically disconnected. For example, the transistor in an on state can operate in a linear region.

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer where the resistivity is lower than or equal to a given value. A source electrode refers to part of a conductive layer which is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer where the resistivity is lower than or equal to a given value. A drain electrode refers to part of a conductive layer which is connected to a drain region. A drain wiring refers to a wiring for electrically connecting at least one drain electrode of a transistor to another electrode or another wiring.

Embodiment 1

In this embodiment, an imaging device of one embodiment of the present invention will be described.

An imaging device of one embodiment of the present invention includes a pixel portion in which pixels are arranged in a matrix of m rows and n columns (m and n are each an integer of 1 or more). Read lines are electrically connected to the pixels. Imaging data written to the pixels are read out by being output as imaging signals from the read lines. The pixels in the same column can be electrically connected to the same read line. That is, n read lines can be provided in the imaging device of one embodiment of the present invention.

The imaging device of one embodiment of the present invention includes current mirror circuits and CDS (Correlated Double Sampling) circuits. The read lines are electrically connected to the current mirror circuits and the CDS circuits, in addition to the pixels. The current mirror circuit and the CDS circuit can be provided for each pixel column. In other words, n current mirror circuits and n CDS circuits can be provided.

The current mirror circuits each include a first transistor and a second transistor. One of a source and a drain of the first transistor is electrically connected to the read line. A gate of the first transistor, a gate of the second transistor, and one of a source and a drain of the second transistor are electrically connected to one terminal. A first power supply potential is supplied to the other of the source and the drain of the first transistor and the other of the source and the drain of the second transistor.

The current mirror circuits each have a function of a load. Controlling the potential of the terminal can control the amount of current that flows to the current mirror circuit. In other words, the size of the load can be controlled. Thus, the terminal can be referred to as a load control signal input terminal.

The CDS circuits each include a first capacitor. The read line is electrically connected to one electrode of the first capacitor.

In the imaging device of one embodiment of the present invention, imaging data are written to the pixels in a writing period and the imaging data written to the pixels are read out in a reading period. In the reading period, in a first period, the imaging data written to the pixels are output as imaging signals to the read lines and then, in a second period, the imaging data written to the pixels are reset and the reset imaging data are output as reference signals to the read lines.

In one embodiment of the present invention, potentials supplied to the load control signal input terminal provided in the current mirror circuit are different between the first period and the second period. In the first period, the value of the potential supplied to the load control signal input terminal is set to a value close to the first power supply potential supplied to the other of the source and the drain of the second transistor. Accordingly, the amount of current flowing to the current mirror circuit in a current flowing from the pixel to the read wiring can be reduced, so that a large part of current can flow to the CDS circuit. Therefore, electric charge can be quickly stored in the first capacitor provided in the CDS circuit.

In the second period, a difference between the value of the potential supplied to the load control signal input terminal and the value of the first power supply potential supplied to the other of the source and the drain of the second transistor is increased. Thus, the amount of current flowing between the CDS circuit and the first transistor can be increased, so that electric charge stored in the first capacitor can be released quickly.

As described above, in one embodiment of the present invention, the first capacitor provided in the CDS circuit can be charged and discharged at high speed. Therefore, a reading operation can be performed at high speed, resulting in high-speed driving of the imaging device of one embodiment of the present invention. Thus, the imaging device of one embodiment of the present invention can perform image capturing at a high frame frequency.

Here, the CDS circuit can include a second capacitor, a third transistor, a fourth transistor, and a fifth transistor in addition to the first capacitor. The read line is electrically connected to the one electrode of the first capacitor and one of a source and a drain of the third transistor in the CDS circuit having such a configuration. The other of the source and the drain of the third transistor is electrically connected to one electrode of the second capacitor. One of a source and a drain of the fourth transistor is electrically connected to a gate of the fifth transistor, the other electrode of the first capacitor, and the other electrode of the second capacitor. A second power supply potential can be supplied to the other of the source and the drain of the fourth transistor.

In the CDS circuit, the fourth transistor is turned on in the first period, in which the pixel outputs an imaging signal to the read line. Accordingly, the potential of a node where the one of the source and the drain of the fourth transistor, the gate of the fifth transistor, the other electrode of the first capacitor, and the other electrode of the second capacitor are electrically connected can be set to the second power supply potential regardless of the potential of the imaging signal. In other words, the potential of the node is reset to the second power supply potential in the first period. Thus, the first period can be referred to as a CDS reset period.

In the second period, in which the pixel outputs the reference signal to the read line, the fourth transistor is turned off. Accordingly, the potential of the node is changed by a difference between the potential of the imaging signal and the potential of the reference signal. That is, the potential of the node becomes a potential corresponding to the potential of the imaging signal. Consequently, the signal corresponding to the imaging signal is output to the outside of the CDS circuit from one of a source and a drain of the fifth transistor. Thus, the second period can be referred to as a CDS output period.

Here, parasitic capacitance is generated in the node. For example, parasitic capacitance between the gate of the fifth transistor and the source of the fifth transistor is generated. Furthermore, parasitic capacitance between the gate of the fifth transistor and the drain of the fifth transistor is generated. Owing to the parasitic capacitance, the range of a change in the potential of the node in the second period is smaller than a difference between the potential of the imaging signal and the potential of the reference signal. In this manner, the value of the potential of the node reflects the influence of the parasitic capacitance, so that the S/N ratio of signals to be output from the CDS circuit decreases.

In view of the above, when the third transistor is turned on in the first period, electric charge corresponding to the imaging signal can be stored in both of the first capacitor and the second capacitor. Thus, the influence of the parasitic capacitance generated in the node can be relatively reduced. Thus, the S/N ratio of signals to be output from the CDS circuit can be increased. Consequently, the imaging device of one embodiment of the present invention can perform high-accuracy image capturing.

When the third transistor is turned off in the first period, electric charge corresponding to the imaging signal is stored only in the first capacitor. This shortens time required for storing and releasing electric charge in and from the capacitor provided in the CDS circuit; thus, the first and second periods can be shortened. Therefore, the reading operation can be performed at high speed, and the imaging device of one embodiment of the present invention can be driven at high speed. Thus, the imaging device of one embodiment of the present invention can perform image capturing at a high frame frequency.

As described above, in one embodiment of the present invention, the driving mode of the CDS circuit can be changed depending on the accuracy of image capturing and frame frequency that are needed. Here, a driving mode in which the third transistor is in an on state in the first period is referred to as a first mode, and a driving mode in which the third transistor is in an off state in the first period is referred to as a second mode. In the case where high-accuracy image capturing needs to be performed, the CDS circuit can be driven in the first mode, and in the case where image capturing needs to be performed at a high frame frequency, the CDS circuit can be driven in the second mode.

Here, the imaging device of one embodiment of the present invention can have a function of biometric authentication such as fingerprint authentication, for example. Furthermore, the imaging device of one embodiment of the present invention can have a function of sensing the position of a sensing target such as a finger touching the imaging device or being not in contact with but near the imaging device, for example. In other words, the imaging device can function as a touch sensor or a near touch sensor. Here, the near touch sensor means a sensor that has a function of sensing a near object. For example, in the case where a near touch sensor is provided in a pixel included in the imaging device, the near touch sensor refers to a sensor that has a function of sensing an object near the pixel. That is, even when an object is not in contact with the near touch sensor, the near touch sensor can sense the object.

In the case where biometric authentication is performed, it is preferable to perform high-accuracy image capturing to increase the accuracy of authentication. Thus, in the case where the imaging device of one embodiment of the present invention performs biometric authentication, the CDS circuit is preferably driven in the first mode. In the case where the position of a sensing target such as a finger touching the pixel portion or being near the pixel portion is sensed (a touch operation or a near touch operation is sensed), image capturing is preferably performed at a high frame frequency so that the motion of the sensing target can be sensed with high accuracy. Therefore, in the case where the imaging device of one embodiment of the present invention senses a touch operation or a near touch operation, the CDS circuit is preferably driven in the second mode. Thus, the imaging device of one embodiment of the present invention can have both a function of performing biometric authentication or the like with high accuracy and a function of sensing the motion of a sensing target with high accuracy.

Configuration Example of Imaging Device

FIG. 1A is a block diagram illustrating a configuration example of an imaging device 10. The imaging device 10 includes a pixel portion 12 in which pixels 11 are arranged in a matrix of m rows and n columns (m and n are each an integer of 1 or more), a gate driver circuit 13, a read circuit 14, and an A/D (Analog to Digital) converter circuit 15.

In this specification and the like, when a plurality of components are denoted with the same reference numerals, and in particular need to be distinguished from each other, an identification sign such as "[1]", "[m]", "[1,1]", "[m,n]", "<1>", "<p>", "(1)", or "(n/p)" is sometimes added to the reference numerals. For example, the pixel 11 in the first row and the first column is denoted as a pixel 11[1,1], and the pixel 11 in the m-th row and the n-th column is denoted as a pixel 11[m,n].

The gate driver circuit 13 is electrically connected to the pixels 11 through wirings 16. The gate driver circuit 13 is electrically connected to the pixels 11 through wirings 17. The read circuit 14 is electrically connected to the pixels 11 through wirings 18. The read circuit 14 is electrically connected to the A/D converter circuit 15 through wirings 19.

FIG. 1A illustrates a configuration in which the pixels 11 in the same row are electrically connected to the same wiring 16 and the same wiring 17, and the pixels 11 in the same column are electrically connected to the same wiring 18. In this specification and the like, for example, the wiring 16 electrically connected to the pixels 11 in the first row is denoted as a wiring 16[1], and the wiring 16 electrically connected to the pixels 11 in the m-th row is denoted as a wiring 16[m]. For example, the wiring 17 electrically connected to the pixels 11 in the first row is denoted as a wiring 17[1], and the wiring 17 electrically connected to the pixels 11 in the m-th row is denoted as a wiring 17[m]. For example, the wiring 18 electrically connected to the pixels 11 in the first column is referred to as a wiring 18[1], and the wiring 18 electrically connected to the pixels 11 in the n-th column is referred to as a wiring 18[n].

Although the details will be described later, the read circuit 14 and the A/D converter circuit 15 are electrically connected to each other through n/p (p is an integer of 1 or more) wirings 19. That is, the number of the wirings 19 can be smaller than or equal to the number of the wirings 18. In FIG. 1A, a wiring 19(1) to a wiring 19(n/p) are collectively referred to as a wiring 19(1:n/p). Similar representations are shown in other drawings and the like.

The gate driver circuit 13 has a function of selecting the pixels 11 from which imaging data is read out. Specifically, the pixels 11 from which imaging data is read out can be selected by supplying a signal to the wiring 16. Furthermore, the gate driver circuit 13 has a function of supplying a signal to the wiring 17.

The read circuit 14 has a function of controlling the reading operation for the imaging data written to the pixel 11. The imaging data written to the pixel 11 is output and read out as an imaging signal to the read circuit 14 through the wiring 18. Thus, the wiring 18 can be referred to as a read line.

The A/D converter circuit 15 has a function of converting an analog signal corresponding to the imaging signal, which is output from the read circuit 14, into a digital signal. For example, the A/D converter circuit 15 has a function of outputting a digital signal with a digital value corresponding to the level of the potential of the analog signal input to the A/D converter circuit 15.

Figure 1B:
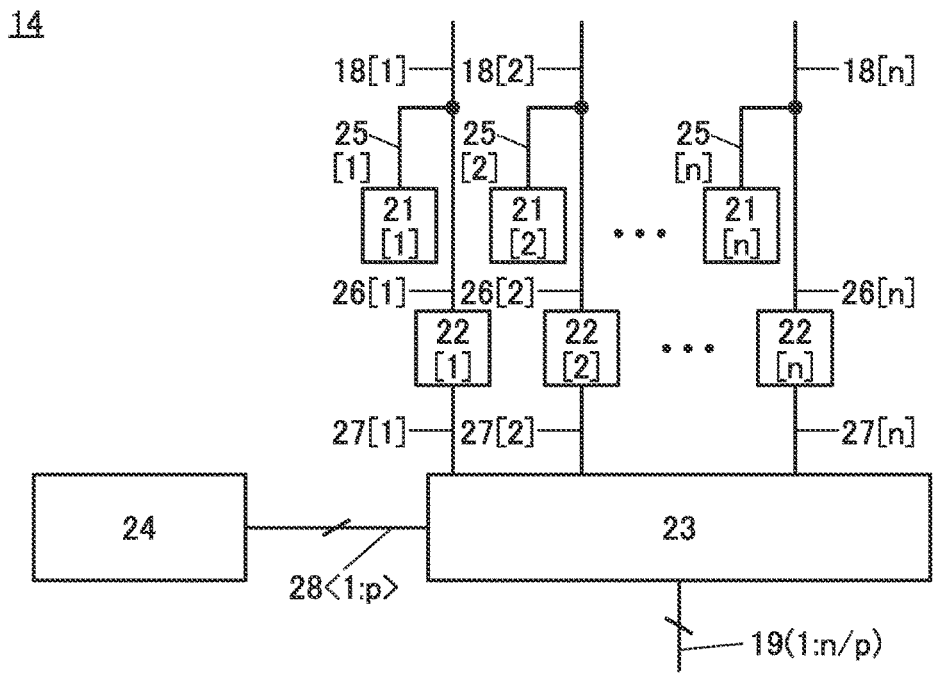

FIG. 1B is a block diagram illustrating a configuration example of the read circuit 14. The read circuit 14 includes load circuits 21, CDS circuits 22, a signal output circuit 23, and a shift register circuit 24.

The load circuit 21 and the CDS circuit 22 can be provided for each column of the pixels 11, for example. That is, n load circuits 21 and n CDS circuits 22 can be provided, for example.

As illustrated in FIG. 1B, the wiring 18 branches out into a wiring 25 and a wiring 26. The wiring 25 is electrically connected to the load circuit 21, and the wiring 26 is electrically connected to the CDS circuit 22. In other words, the load circuit 21 is electrically connected to the pixel 11 through the wiring 18 and the wiring 25, and the CDS circuit 22 is electrically connected to the pixel 11 through the wiring 18 and the wiring 26. The CDS circuit 22 is electrically connected to the signal output circuit 23 through the wiring 27. Note that the wiring 25 and the wiring 26 may be referred to as read lines like the wiring 18.

An input terminal of the CDS circuit 22 is electrically connected to the pixel 11 through the wiring 26, and an output terminal of the CDS circuit 22 is electrically connected to the signal output circuit 23 through the wiring 27. Thus, it can be said that the CDS circuit 22 has functions of processing a signal output from the pixel 11 and supplying the processed signal to the signal output circuit 23. This processing will be described in detail later.

In this specification and the like, the wiring 25 electrically connected to the wiring 18[1] is referred to as a wiring 25[1], and the wiring 25 electrically connected to the wiring 18[n] is referred to as a wiring 25[n], for example. For example, the load circuit 21 electrically connected to the wiring 25[1] is referred to as a load circuit 21[1], and the load circuit 21 electrically connected to the wiring 25[n] is referred to as a load circuit 21[n]. The wiring 26 electrically connected to the wiring 18[1] is referred to as a wiring 26[1], and the wiring 26 electrically connected to the wiring 18[n] is referred to as a wiring 26[n]. For example, the CDS circuit 22 electrically connected to the wiring 26[1] is referred to as a CDS circuit 22[1], and the CDS circuit 22 electrically connected to the wiring 26[n] is referred to as a CDS circuit 22[n]. For example, the wiring 27 electrically connected to the CDS circuit 22[1] is referred to as a wiring 27[1], and the wiring 27 electrically connected to the CDS circuit 22[n] is referred to as a wiring 27[n].

The shift register circuit 24 is electrically connected to the signal output circuit 23 through p wirings 28. In FIG. 1B, a wiring 28<1> to a wiring 28<p> are collectively referred to as a wiring 28<1:p>. Similar representations are shown in other drawings and the like.

As described above, the signal output circuit 23 is electrically connected to n wirings 27, p wirings 28, and n/p wirings 19, for example. Thus, the product of the number of the wirings 28 and the number of the wirings 19 can be the number of the wirings 27.

The load circuit 21 has a function of a current source. The CDS circuit 22 has a function of performing correlated double sampling. The signal output circuit 23 has a function of controlling the output of a signal output from the CDS circuit 22, to the A/D converter circuit 15. Specifically, the signal output circuit 23 has a function of selecting a signal to be output to the A/D converter circuit 15 from the CDS circuit 22 on the basis of a signal output from the shift register circuit 24. The configurations, functions and the like of the load circuit 21 and the CDS circuit 22 will be described in detail later.

Configuration Example of Pixels

Figure 2:
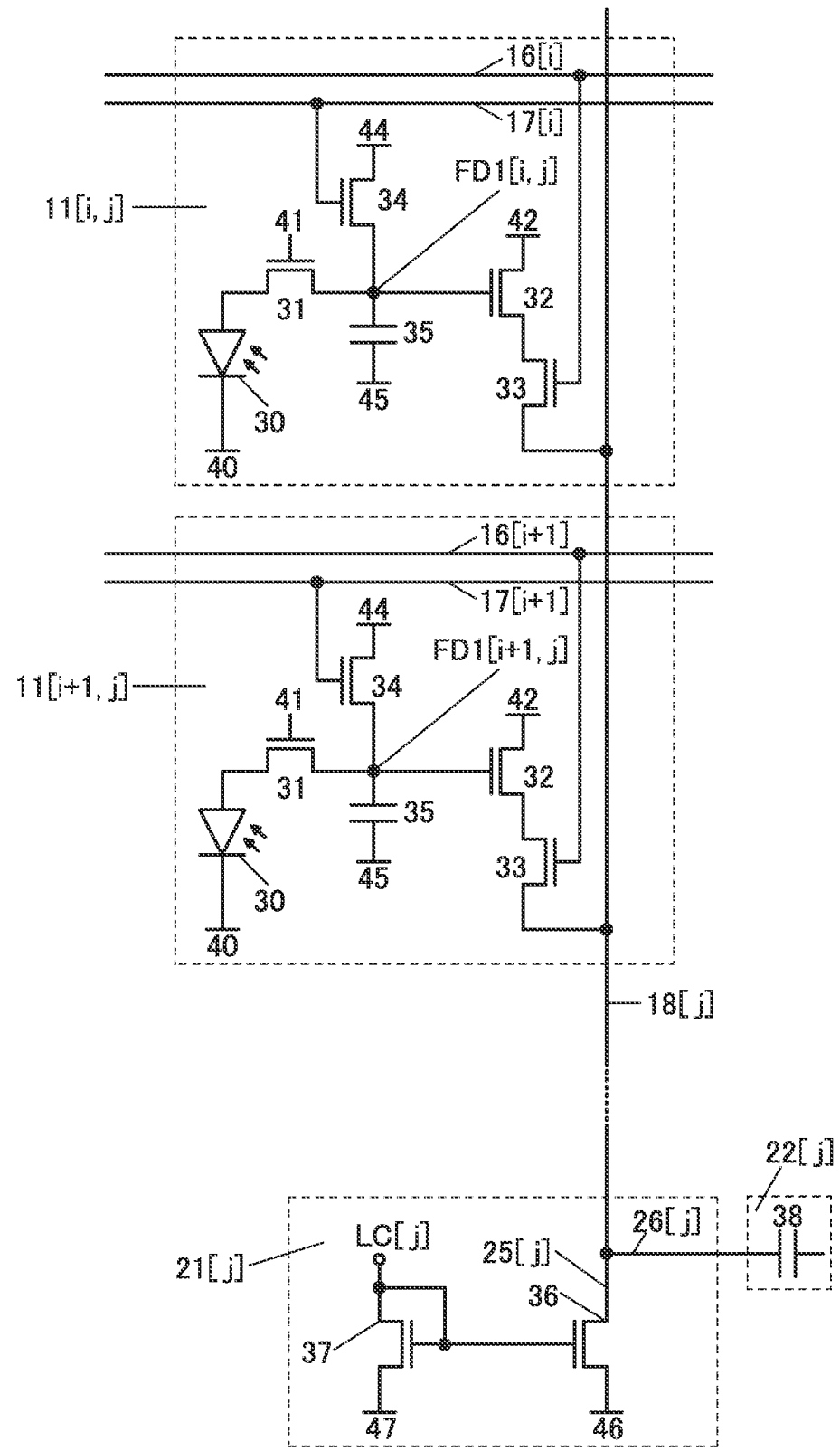
FIG. 2 is a circuit diagram illustrating a configuration example of an imaging device.

FIG. 2 is a circuit diagram illustrating a configuration example of the pixels 11, the load circuit 21, and the CDS circuit 22. Specifically, a configuration example of a pixel 11[i,j] (i is an integer of 1 or more and m−1 or less, and j is an integer of 1 or more and n or less), a pixel 11[i+1,j], a load circuit 21[j], and a CDS circuit 22[j] is illustrated.

In FIG. 2, all transistors are n-channel transistors; however, when the magnitude relation of the potentials is reversed as appropriate, for example, the following description can also apply to the case where part of or all transistors are p-channel transistors. The same applies to circuit configurations illustrated in other drawings.

The pixel 11 with the configuration illustrated in FIG. 2 includes a photoelectric conversion element 30, a transistor 31, a transistor 32, a transistor 33, a transistor 34, and a capacitor 35. The capacitor 35 does not need to be provided in the case where the gate capacitance of the transistor 32 is sufficiently large.

One electrode of the photoelectric conversion element 30 is electrically connected to one of a source and a drain of the transistor 31. The other of the source and the drain of the transistor 31 is electrically connected to a gate of the transistor 32. One of a source and a drain of the transistor 32 is electrically connected to one of a source and a drain of the transistor 33. A gate of the transistor 32 is electrically connected to one of a source and a drain of the transistor 34. One of the source and the drain of the transistor 34 is electrically connected to one electrode of the capacitor 35. Note that a node where the other of the source and the drain of the transistor 31, the gate of the transistor 32, one of the source and the drain of the transistor 34, and the one electrode of the capacitor 35 are electrically connected is referred to as a node FD1. Here, the node FD1 provided in the pixel 11[1,j] is referred to as a node and the node FD1 provided in the pixel 11[i+1,j] is referred to as a node FD1[i+1,j].

A gate of the transistor 31 is electrically connected to a wiring 41. A gate of the transistor 33 is electrically connected to the wiring 16. A gate of the transistor 34 is electrically connected to the wiring 17. The other of the source and the drain of the transistor 33 is electrically connected to the wiring 18. The other electrode of the photoelectric conversion element 30 is electrically connected to a wiring 40. The other of the source and the drain of the transistor 32 is electrically connected to a wiring 42. The other of the source and the drain of the transistor 34 is electrically connected to a wiring 44. The other electrode of the capacitor 35 is electrically connected to a wiring 45.

The operation of the transistor 33 can be controlled by controlling the potential of the wiring 16. For example, the transistor 33 is turned on when the potential of the wiring 16 is set to a high potential, and the transistor 33 is turned off when the potential of the wiring 16 is set to a low potential. Similarly, the operation of the transistor 34 can be controlled by controlling the potential of the wiring 17, and the operation of the transistor 31 can be controlled by controlling the potential of the wiring 41.

A power supply potential can be supplied to the wiring 40, the wiring 42, the wiring 44, and the wiring 45. Thus, it can be said that the wiring 40, the wiring 42, the wiring 44, and the wiring 45 can each have a function of a power supply line. For example, a high potential can be supplied to the wiring 42, and a low potential can be supplied to the wiring 45. In the case where a cathode of the photoelectric conversion element 30 is electrically connected to the wiring 40 as illustrated in FIG. 2, the wiring 40 can have a high potential and the wiring 44 can have a low potential. In contrast, in the case where an anode of the photoelectric conversion element 30 is electrically connected to the wiring 18, the wiring 40 can have a low potential and the wiring 44 can have a high potential.

In this specification and the like, a high potential refers to a potential higher than a low potential. In the case where the potentials of a plurality of wirings are high potentials, the specific levels of the high potentials may be different between the wirings. For example, in the case where the potential of the wiring 40 and the potential of the wiring 42 are each set to a high potential, the potential of the wiring 40 and the potential of the wiring 42 may be different from each other. For example, the potential of the wiring 40 can be set to 0 V and the potential of the wiring 42 can be set to 6 V. Similarly, in the case where the potentials of the plurality of wirings are set to low potentials, the specific levels of the low potentials may be different between the wirings. For example, in the case where the potential of the wiring 44 and the potential of the wiring 45 are set to low potentials, the potential of the wiring 44 and the potential of the wiring 45 may different from each other. For example, the potential of the wiring 44 can be set to −4 V and the potential of the wiring 45 can be set to 0 V.

In the case where a plurality of potentials regarded as high potentials and a plurality of potentials regarded as low potentials exist, all the high potentials do not necessarily need to be higher than all the low potentials. A potential that is higher than at least one of the plurality of potentials regarded as low potentials can be regarded as a high potential. A potential that is lower than at least one of the plurality of potentials regarded as high potentials can be regarded as a low potential. For example, in the above case, the potential of the wiring 40 and the potential of the wiring 45 can be set to 0 V. However, since the potential of the wiring 40 is higher than −4 V, which can be set as the potential the wiring 44, the potential of the wiring 40 can be regarded as a high potential. Since the potential of the wiring 45 is lower than 6 V, which can be set as the potential of the wiring 42, the potential of the wiring 45 can be regarded as a low potential.

The load circuit 21 having the configuration illustrated in FIG. 2 includes a transistor 36 and a transistor 37. One of a source and a drain of the transistor 36 is electrically connected to the wiring 25. A gate of the transistor 36, a gate of the transistor 37, and one of a source and a drain of the transistor 37 are electrically connected to a terminal LC. The other of the source and the drain of the transistor 36 is electrically connected to a wiring 46. The other of the source and the drain of the transistor 37 is electrically connected to a wiring 47. Thus, it can be said that a current mirror circuit is formed using the transistor 36 and the transistor 37. Therefore, it can be said that the load circuit 21 includes the current mirror circuit.

A power supply potential can be supplied to the wiring 46 and the wiring 47. Thus, it can be said that the wiring 46 and the wiring 47 each have a function of a power supply line. The potential of the wiring 46 and the potential of the wiring 47 can be lower than the potential of the wiring 42. Thus, it can be said that the potential of the wiring 46 and the potential of the wiring 47 are low potentials.

The potential of the wiring 44 and the potentials of the wiring 46 and the wiring 47 can be set to low potentials, and the specific value of the potential of the wiring 44 and the specific value of the potentials of the wiring 46 and the wiring 47 can be different from each other. For example, the potentials of the wiring 46 and the wiring 47 can be lower than the potential of the wiring 44. For example, when the potential of the wiring 44 is set to −4 V as described above, the potentials of the wiring 46 and the wiring 47 can be set to −16 V.

A signal can be input to the terminal LC. The potential of the signal can be higher than the potential of the wiring 47. Controlling the potential of the signal input to the terminal LC can control the amount of current flowing between the drain and the source of the transistor 37; thus, the amount of current flowing through the wiring 25 can be controlled. That is, the size of load of the load circuit 21 can be controlled. Thus, the signal input to the terminal LC can be referred to as a load control signal, and the terminal LC can be referred to as a load control signal input terminal.

The CDS circuit 22 includes a capacitor 38. The wiring 26 is electrically connected to one electrode of the capacitor 38.

Example 1 of Driving Method for Imaging Device

Figure 3:
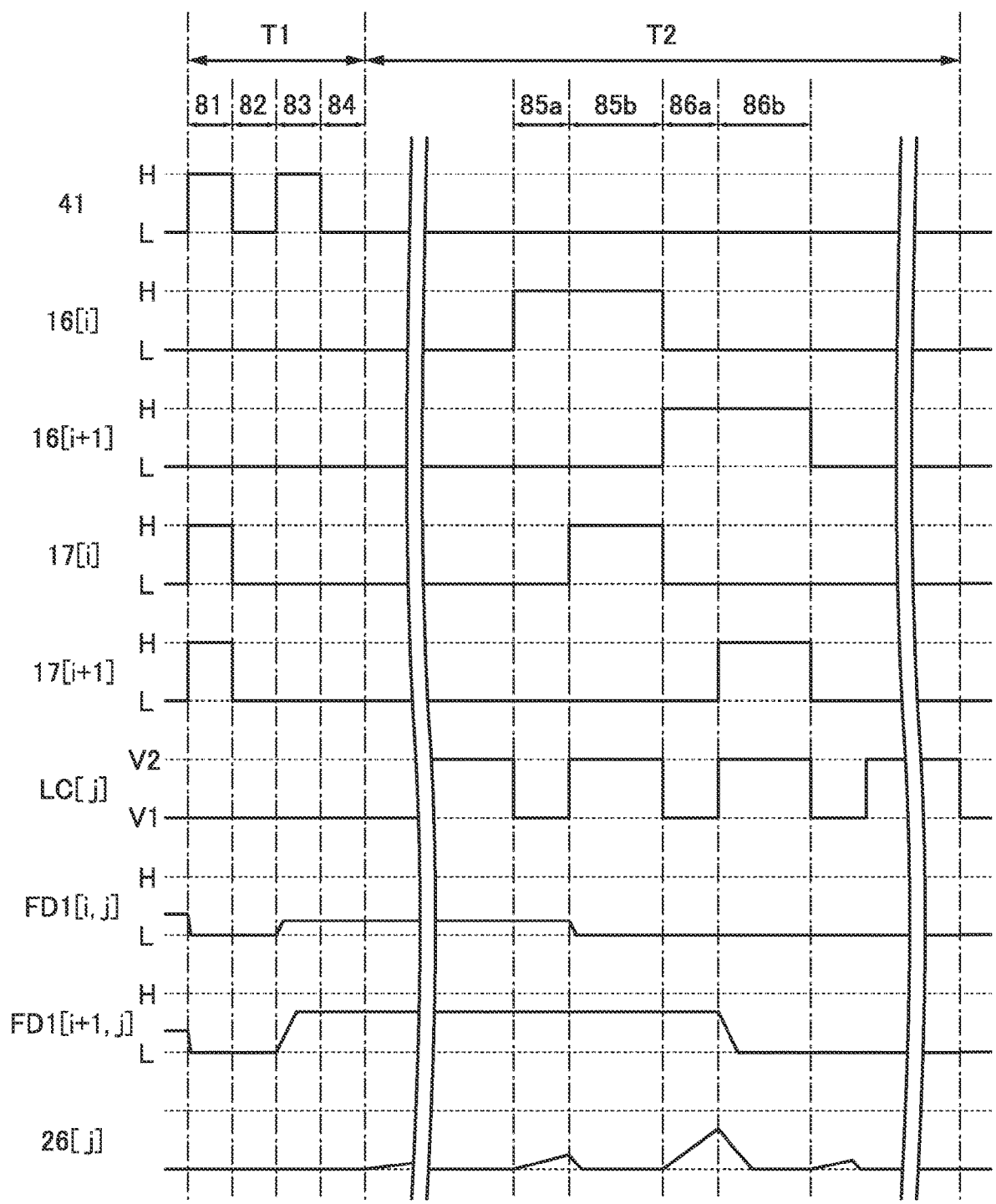
FIG. 3 is a timing chart showing an example of a method for driving an imaging device.

FIG. 3 is a timing chart showing an example of a driving method for the pixel the pixel 11[i+1,j], and the load circuit 21 that have the configuration illustrated in FIG. 2. Here, the potentials of the wiring 40 and the wiring 42 are set to high potentials and the potentials of the wiring 44, the wiring 45, the wiring 46, and the wiring 47 are set to low potentials. The potentials of the wiring 46 and the wiring 47 are set lower than the potential of the wiring 44. In FIG. 3, "H" means a high potential and "L" means a low potential. Similar representations are shown in other drawings and the like.

In FIG. 3, a period T1 and a period T2 are shown as periods in which the pixel 11[i,j], the pixel 11[i+1,j], and the load circuit 21 are driven. The period T1 includes a period 81, a period 82, a period 83, and a period 84, and the period T2 includes a period 85a, a period 85b, a period 86a, and a period 86b.

First, an example of the driving method for the period T1 will be described. In the period 81, the potentials of the wiring 41 and the wiring 17 are set to high potentials and the potential of the wiring 16 is set to a low potential. Accordingly, the transistor 31 and the transistor 34 are turned on and the transistor 33 is turned off. When the transistor 34 is turned on, the potential of the node FD1 becomes a low potential that is the potential of the wiring 44. Other than the transistor 34, the transistor 31 is turned on, so that the potential of a node where the one electrode of the photoelectric conversion element 30 and one of a source and a drain of the transistor 31 are electrically connected becomes a low potential that is the potential of the wiring 44. Consequently, electric charge stored in the capacitor 35 and the like is reset. Thus, the period 81 can be referred to as a reset period.

In the period 82, the potentials of the wiring 41 and the wiring 17 are set to low potentials. Thus, the transistor 31 and the transistor 34 are turned off. When the photoelectric conversion element 30 is irradiated with light in such a state, electric charge according to the illuminance of the light is accumulated in the node where the one electrode of the photoelectric conversion element 30 and the one of the source and the drain of the transistor 31 are electrically connected. Thus, the period 82 can be referred to as an exposure period.

In the period 83, the potential of the wiring 41 is set to a high potential. Accordingly, the transistor 31 is turned on. Accordingly, the electric charge accumulated in the node where the one electrode of the photoelectric conversion element 30 and the one of the source and the drain of the transistor 31 are electrically connected is transferred to the node FD1. Accordingly, the potential of the node FD1 is increased. Therefore, the period 83 can be referred to as a transfer period.

In the period 84, the potential of the wiring 41 is set to a low potential. Thus, the transistor 31 is turned off, and the potential of the node FD1 is retained.

The above is an example of the driving method for the period T1. In the period T1, imaging data is written to the pixel 11. Specifically, the potential of the node FD1 becomes a potential corresponding to the imaging data. Thus, the period T1 can be referred to as a writing period.

Next, an example of the driving method for the period T2 will be described. In the period 85a, the potential of the wiring 16[i] is set to a high potential. The potential of a terminal LC[j] is set to a potential V1. When the potential of the wiring 16[i] is set to a high potential, the transistor 33 provided in the pixel 11[i,j] is turned on, so that imaging data written to the pixel 11[i,j] is read out. Specifically, an imaging signal having a potential corresponding to imaging data written to the pixel 11[i,j] is output to a wiring 18[j]. The imaging signal output to the wiring 18[j] is supplied to the CDS circuit 22[j] through a wiring 26[j]. Thus, the period 85a can be referred to as an imaging signal output period.

In the period 85b, the potential of a wiring 17[i] is set to a high potential. The potential of the terminal LC[j] is set to a potential V2. When the potential of the wiring 17[i] is set to a high potential, the transistor 34 provided in the pixel 11[i,j] is turned on and imaging data written to the pixel 11[i,j] is reset. Specifically, the potential of the node FD1[i,j] becomes a low potential that is the potential of the wiring 44. Here, since the transistor 33 provided in the pixel 11[i,j] is in an on state, the potentials of the wiring 18[j] and the wiring 26[j] also change according to a change in the potential of the node Consequently, a reference signal that is a signal corresponding to the reset imaging data is supplied from the pixel 11[i,j] to the CDS circuit 22[j] through the wiring 18[j]. Thus, the period 85b can be referred to as a reference signal output period. In the period 85b, the potential of the node FD1[i,j] becomes a low potential that is the potential of the wiring 44; however, the transistor 32 is not turned off because the potential of the wiring 46 is lower than the potential of the wiring 44.

In the reference signal output period, the CDS circuit 22[j] outputs a signal corresponding to a difference between the imaging signal and the reference signal. Thus, the CDS circuit 22 extracts the difference between the imaging signal and the reference signal, that is, performs a CDS operation, whereby a signal corresponding to imaging data, from which the influence of noise included in the imaging signal is reduced, can be output to the outside of the imaging device 10.

Here, the potential V1 and the potential V2 are set higher than the potential of the wiring 47. Therefore, a current flows between the drain and the source of the transistor 37, so that a current also flows through the wiring 25[j] and between the drain and the source of the transistor 36, and the load circuit 21 can function as a load. Although the details will be described later, the potential V2 is set higher than the potential V1. That is, a difference between the potential of the terminal LC[j] and the potential of the wiring 47 in the period 85b is made larger than a difference between the potential of the terminal LC[j] and the potential of the wiring 47 in the period 85a. The potential V1 can be set to 6 V, for example, the potential V2 can be set to −14 V, for example, and the potential of the wiring 47 can be set to −16 V, for example.

In the period 86a, the potentials of the wiring 16[i] and the wiring 17[i] are set to low potentials. Accordingly, the transistor 33 and the transistor 34 provided in the pixel 11[i,j] are turned off. In the period 86a, the potential of the wiring 16[i+1] is set to a high potential, and the potential of the terminal LC[j] is set to the potential V1. When the potential of the wiring 16[i+1] is set to a high potential, the transistor 33 provided in the pixel 11[i+1,j] is turned on, and imaging data written to the pixel 11[i+1,j] is read out. Specifically, an imaging signal having a potential corresponding to imaging data written to the pixel 11[i+1,j] is output to the wiring 18[j]. The imaging signal output to the wiring 18[j] is supplied to the CDS circuit 22[j] through the wiring 26[j]. Thus, the period 86a can be referred to as an imaging signal output period, like the period 85a. In the period 86b, the transistor 32 is not turned off as in the period 85b.

In the period 86b, the potential of the wiring 17[i+1] is set to a high potential. The potential of the terminal LC[j] is set to the potential V2. When the potential of the wiring 17[i+1] is set to a high potential, the transistor 34 provided in the pixel 11[i+1,j] is turned on, and the imaging data written to the pixel 11[i+1,j] is reset. Specifically, the potential of the node FD1[i+1,j] becomes a low potential that is the potential of the wiring 44. Here, since the transistor 33 provided in the pixel 11[i+1,j] is in an on state, the potentials of the wiring 18[j] and the wiring 26[j] also change according to a change in the potential of the node FD1[i+1,j]. Consequently, a reference signal is supplied to the CDS circuit 22[j]. Thus, the period 86b can be referred to as a reference signal output period, like the period 85b.

As described above, the potential V2 is higher than the potential V1. Therefore, a difference between the potential of the terminal LC[j] and the potential of the wiring 47 in the period 86b is larger than a difference between the potential of the terminal LC[j] and the potential of the wiring 47 in the period 86a.

After the period 86b, the potential of the wiring 16[i+1] and the potential of the wiring 17[i+1] are set to low potentials. Consequently, the transistor 33 and the transistor 34 included in the pixel 11[i+1,j] are turned off.

The above is an example of the driving method for the period T2. In the period T2, the imaging data written to the pixel 11 is read out. Specifically, the potential of the wiring 18 becomes a potential corresponding to the imaging data written to the pixel 11. Thus, the period T2 can be referred to as a reading period.

Imaging data is preferably written to the pixel 11[1,1] to the pixel 11[m,n] in the global shutter mode. Here, the global shutter mode refers to a method of writing imaging data in all the pixels at the same time. When imaging data is written in the global shutter mode, simultaneousness of image capturing can be secured; thus, an image with few distortions can be easily obtained even though an object moves fast.

In contrast, imaging data is read out from the pixel 11[1,1] to the pixel 11[m,n] row by row, for example. Therefore, in the case of writing imaging data in the global shutter mode, there is the pixel 11 whose period from writing imaging data to reading the imaging data is long. Therefore, it is preferable that electric charge accumulated in the node FD be held for a long time.

In order to hold electric charge in the node FD for a long time, the transistor electrically connected to the node FD may be a transistor with a low off-state current. Examples of the transistor with a low off-state current include a transistor using a metal oxide in a channel formation region (hereinafter, an OS transistor). Thus, the transistor 31 and the transistor 34 are preferably OS transistors.

The channel formation region of an OS transistor preferably includes a metal oxide. The metal oxide used for the OS transistor is preferably an oxide that contains at least one of indium (In) and zinc (Zn).

Examples of such oxides include an In-M-Zn oxide, an In-M oxide, a Zn-M oxide, and an In—Zn oxide (the element M is one or more selected from aluminum (Al), gallium (Ga), yttrium (Y), tin (Sn), boron (B), silicon (Si), titanium (Ti), iron (Fe), nickel (Ni), germanium (Ge), zirconium (Zr), molybdenum (Mo), lanthanum (La), cerium (Ce), neodymium (Nd), vanadium (V), beryllium (Be), hafnium (Hf), tantalum (Ta), and tungsten (W), for example). Typical examples of the In-M-Zn oxide include an In—Ga—Zn oxide, an In—Sn—Zn oxide, and an In—Ga—Sn—Zn oxide.

The off-state current per channel width of 1 μm of an OS transistor can be as low as approximately 1 yA/μm (y: yocto, $10^{-24}$) to 1 zA/μm (z: zepto, $10^{-21}$).

A CAC (Cloud-Aligned Composite)-OS is preferably used for the OS transistor. The details of the CAC-OS will be described in a subsequent embodiment.

As the transistor 31 and the transistor 34, transistors other than an OS transistor can be used if having a low off-state current. For example, a transistor using a wide-bandgap semiconductor may be used. In some cases, the wide-bandgap semiconductor refers to a semiconductor with a bandgap of 2.2 eV or greater. Examples include silicon carbide, gallium nitride, and diamond.

Note that the transistor 31 and the transistor 34 may be transistors including silicon in their channel formation regions (hereinafter, Si transistors), or the like. A Si transistor has a higher off-state current than an OS transistor. However, by making the capacitance of the capacitor 35 large, for example, imaging data can be written to the pixel 11[1,1] to the pixel 11[m,n] in the global shutter mode even when the on-state current of the transistor 31 and the transistor 34 is high. Note that imaging data may be written to the pixel 11[1,1] to the pixel 11[m,n] in the rolling shutter mode. In that case, the capacitance of the capacitor 35 does not need to be increased even when the transistor 31 and the transistor 34 are transistors with a high off-state current.

The transistor 32 and the transistor 33 may be Si transistors or OS transistors. For example, when transistors including crystalline silicon (typically, low-temperature polysilicon, single crystal silicon, or the like) are used as the transistor 32 and the transistor 33, the on-state current of the transistor 32 and the transistor 33 can be increased. This enables high-speed reading of imaging data. In contrast, when all the transistor 31 to the transistor 34 are OS transistors, all the transistors included in the pixel 11 can be formed in the same layer. When all the transistors including the transistor 31 to the transistor 34 in the imaging device 10 are OS transistors, all the transistors included in the imaging device 10 can be formed in the same layer. Therefore, the manufacturing process of the imaging device 10 can be simplified.

Figure 4:
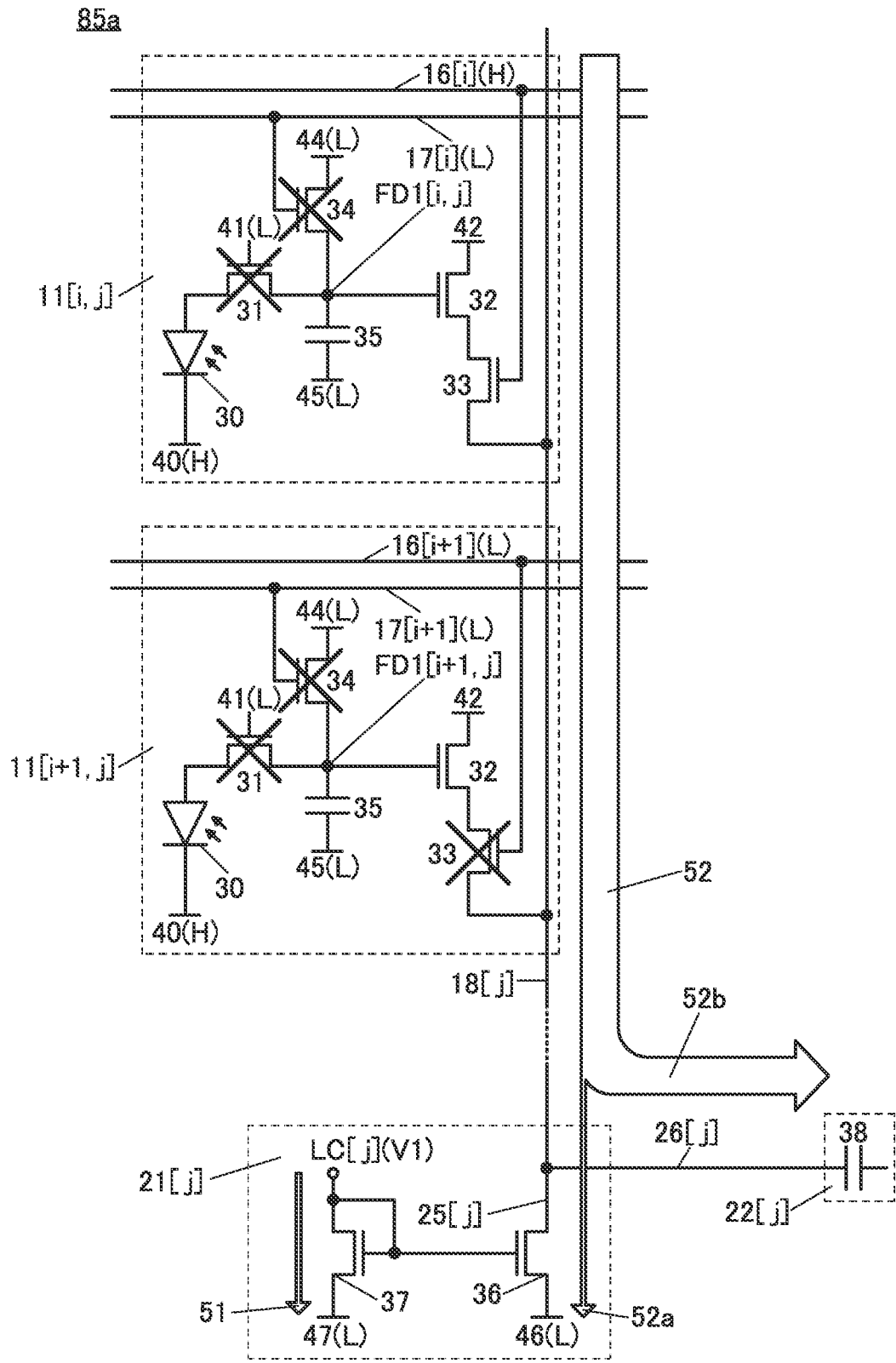
FIG. 4 is a circuit diagram illustrating an example of a method for driving an imaging device.
Figure 5:
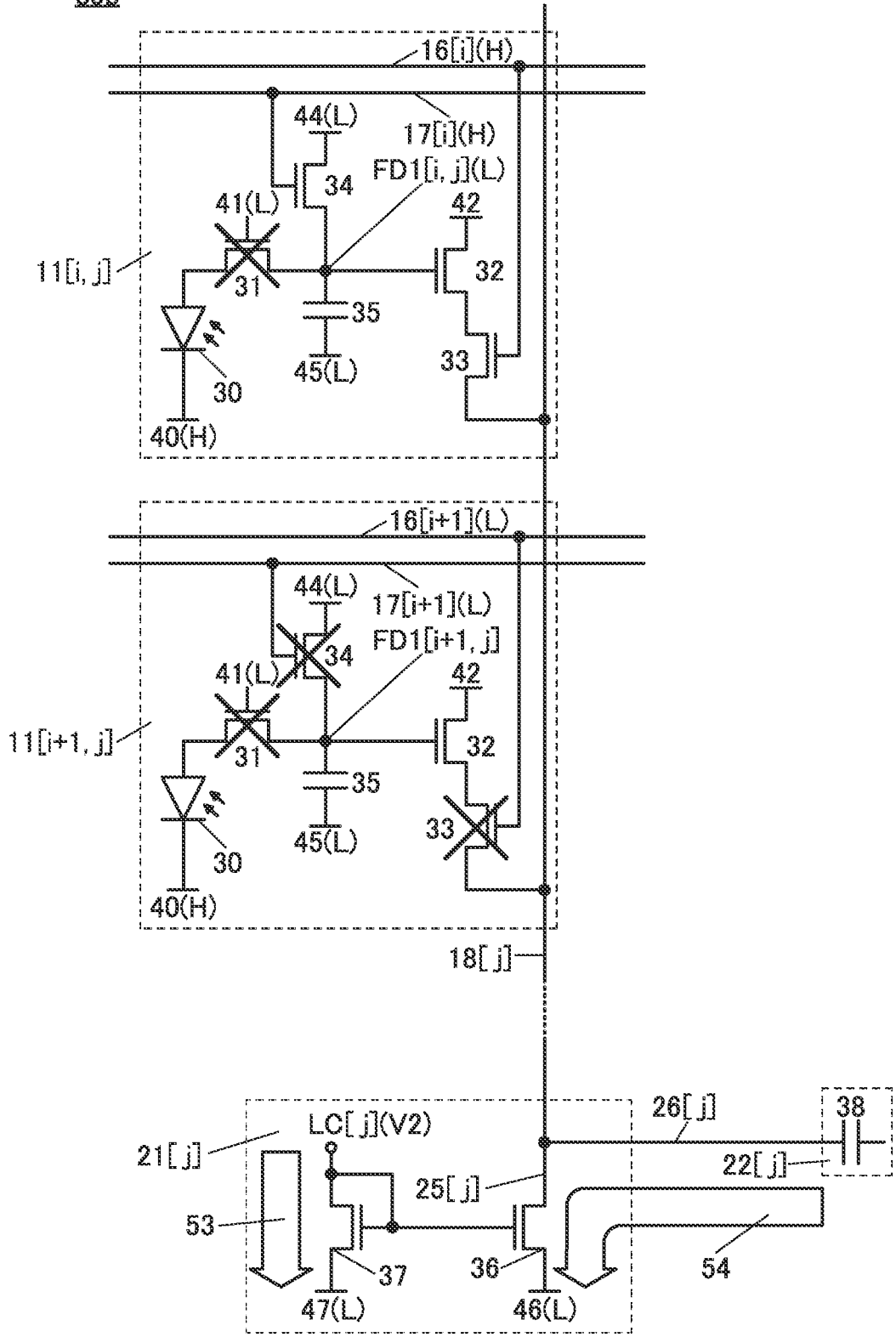
FIG. 5 is a circuit diagram illustrating an example of a method for driving an imaging device.

FIG. 4 is a circuit diagram illustrating a driving method for the period 85a, which is the imaging signal output period, and FIG. 5 is a circuit diagram illustrating a driving method for the period 85b, which is the reference signal output period. In FIG. 4 and FIG. 5, transistors that are in an off state are marked with crosses.

As illustrated in FIG. 4, in the period 85a, a current 52 flows through the wiring 18[j]. The current 52 divides at a connection point of the wiring 25[j] and the wiring 26[j], a current 52a flows through the wiring 25[j], and a current 52b flows through the wiring 26[j]. Here, although the potential V1 is higher than the potential of the wiring 47, a difference between the potential V1 and the potential of the wiring 47 is small. Therefore, a potential difference between the drain and the source of the transistor 37 is small, and thus the amount of current flowing between the drain and the source of the transistor 37 is small. Since a current mirror circuit is formed by the transistor 37 and the transistor 36, the amount of current flowing between the drain and the source of the transistor 36 is also small. Thus, the amount of current 52a flowing to the load circuit 21[j] through the wiring 25[j] can be reduced, so that most of the current 52 can flow to the CDS circuit 22[j] through the wiring 26[j]. This allows electric charge to be quickly stored in the capacitor 38 provided in the CDS circuit 22[j]. The explanation shown in FIG. 4 can also be referred to for the period 86a.

As illustrated in FIG. 5, in the period 85b, electric charge stored in the capacitor 38 is released toward the load circuit 21. Accordingly, a current 54 flows between the capacitor 38 and the wiring 46. Here, as described above, the potential V2 is set higher than the potential V1. Therefore, a potential difference between the drain and the source of the transistor 37 is large, and thus the amount of current flowing between the drain and the source of the transistor 37 is large. Thus, the amount of current flowing between the drain and the source of the transistor 36 is also large. Therefore, compared with the case where the potential of the terminal LC[j] remains the potential V1 in the period 85b, electric charge stored in the capacitor 38 can be quickly released. In the period 85b, as the amount of current flowing between the drain and the source of the transistor 36 increases, the potential of the wiring 18[j] becomes closer to the potential of the wiring 46, and thus, a difference between the potential of the wiring 42 and the potential of the wiring 18[j] at the start of the period 86a can be increased. Thus, the amount of current flowing through the wiring 18[j] in the period 86a can be increased, so that electric charge corresponding to the imaging signal output from the pixel 11[i+1,j] can be quickly stored in the capacitor 38. The explanation shown in FIG. 5 can also be referred to for the period 86b.

As described above, in one embodiment of the present invention, the capacitor 38 provided in the CDS circuit 22 can be charged and discharged at high speed. Thus, the reading operation performed in the period T2 can be performed at high speed, and the imaging device 10 can be driven at high speed. Thus, the imaging device 10 can perform image capturing at a high frame frequency.

Configuration Example of CDS Circuit

Figure 6:
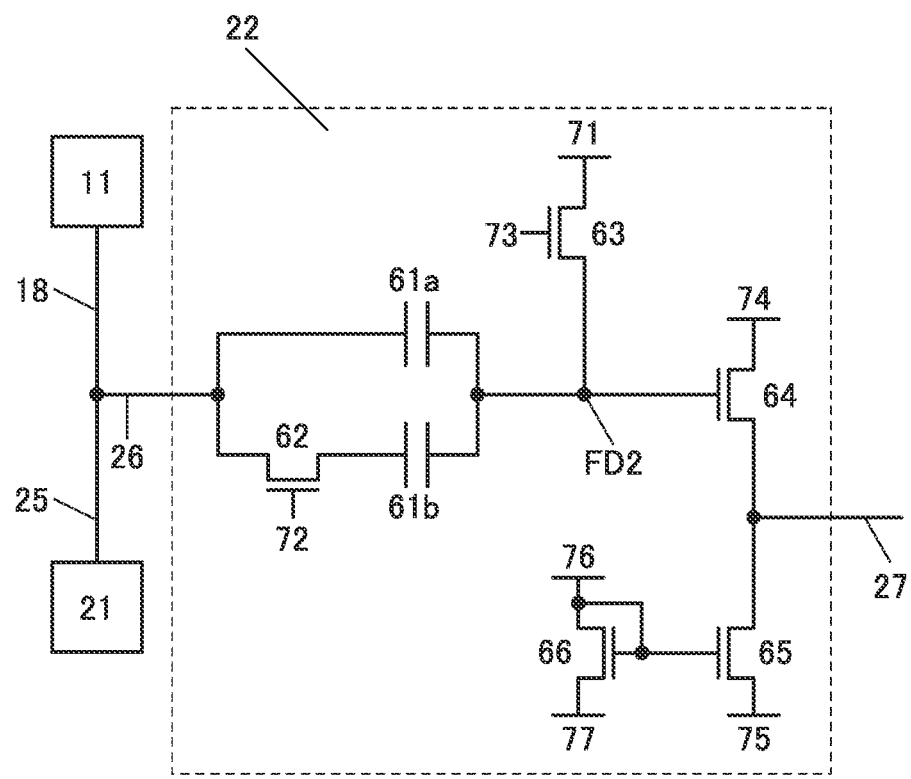
FIG. 6 is a circuit diagram illustrating a configuration example of an imaging device.

FIG. 6 is a circuit diagram illustrating a specific configuration example of the CDS circuit 22. In FIG. 6, a block representing the pixel 11 and a block representing the load circuit 21 are also shown for the convenience of explanation. As described above, the CDS circuit 22 is electrically connected to the pixel 11 through the wiring 26 and the wiring 18 and is electrically connected to the load circuit 21 through the wiring 26 and the wiring 25.

The CDS circuit 22 having the configuration illustrated in FIG. 6 includes a capacitor 61a, a capacitor 61b, a transistor 62, a transistor 63, a transistor 64, a transistor 65, and a transistor 66.

The wiring 26 is electrically connected to one electrode of the capacitor 61a and one of a source and a drain of the transistor 62. The other of the source and the drain of the transistor 62 is electrically connected to one electrode of the capacitor 61*b*. The other electrode of the capacitor 61*a* and the other electrode of the capacitor 61*b* are electrically connected to one of a source and a drain of the transistor 63 and a gate of the transistor 64. One of a source and a drain of the transistor 64 is electrically connected to the wiring 27. The wiring 27 is electrically connected to one of a source and a drain of the transistor 65. A gate of the transistor 65 is electrically connected to a gate of the transistor 66 and one of a source and a drain of the transistor 66. A node where the other electrode of the capacitor 61*a*, the other electrode of the capacitor 61*b*, the one of the source and the drain of the transistor 63, and the gate of the transistor 64 are electrically connected is referred to as a node FD2.

A gate of the transistor 62 is electrically connected to a wiring 72. A gate of the transistor 63 is electrically connected to a wiring 73. The other of the source and the drain of the transistor 64 is electrically connected to a wiring 74. The other of the source and the drain of the transistor 65 is electrically connected to a wiring 75. One of a source and a drain of the transistor 66 is electrically connected to a wiring 76. The other of the source and the drain of the transistor 66 is electrically connected to a wiring 77.

The operation of the transistor 62 can be controlled by controlling the potential of the terminal 72. For example, the transistor 62 is turned on when the potential of the wiring 72 is set to a high potential, and the transistor 62 is turned off when the potential of the wiring 72 is set to a low potential. Similarly, the potential of the wiring 73 is controlled to turn off the transistor 63.

Power supply potentials can be supplied to the wiring 71 and the wiring 74 to the wiring 77. Thus, it can be said that the wiring 71 and the wiring 74 to the wiring 77 each have a function of a power supply line. For example, high potentials can be supplied to the wiring 71, the wiring 74, and the wiring 76, and low potentials can be supplied to the wiring 75 and the wiring 77.

In the case where the CDS circuit 22 has the configuration illustrated in FIG. 6, the capacitor 38 illustrated in FIG. 2 and the like corresponds to the capacitor 61*a* illustrated in FIG. 6, for example.

Example 2 of Driving Method for Imaging Device

Figure 7:
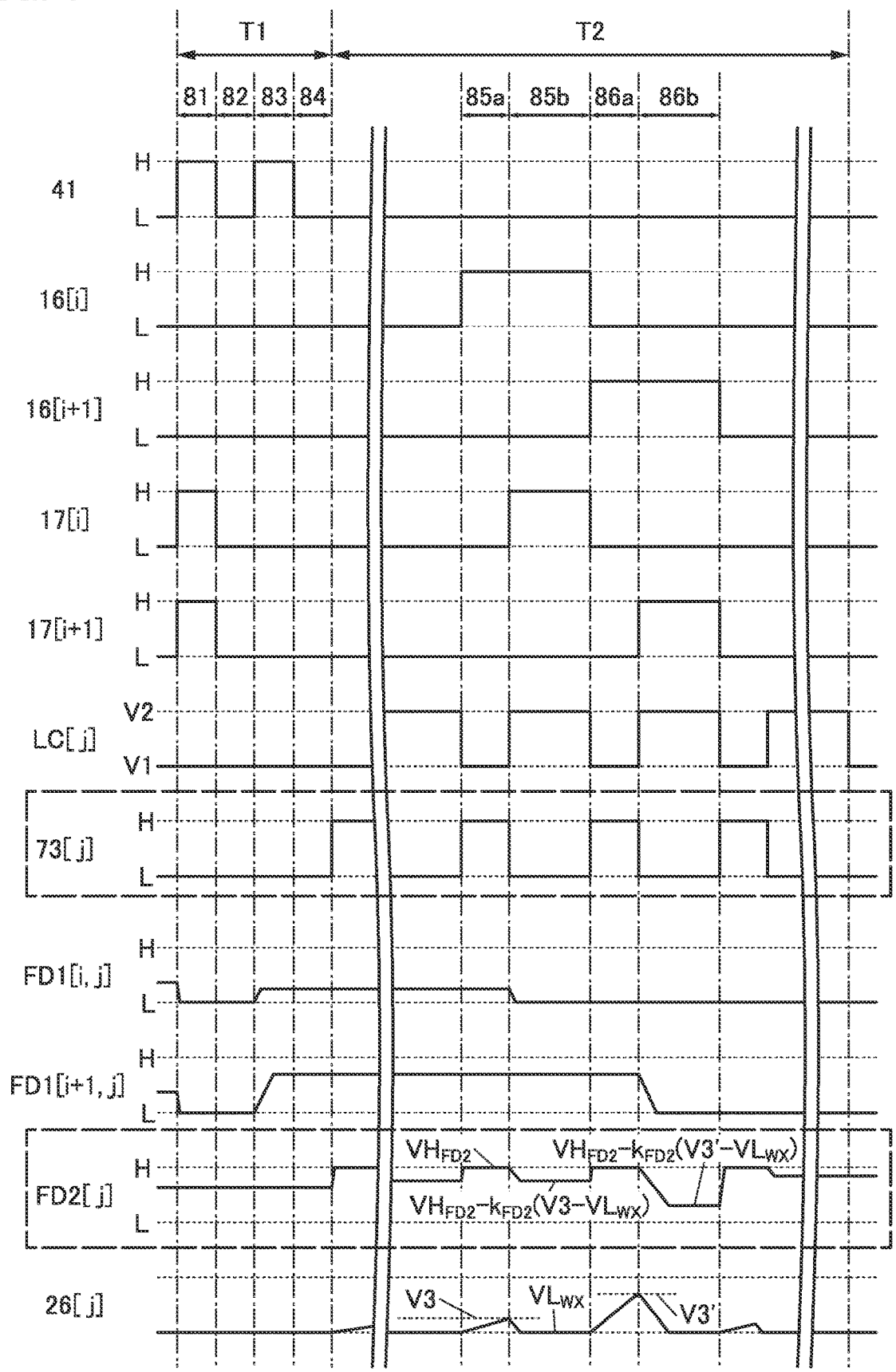
FIG. 7 is a timing chart showing an example of a method for driving an imaging device.

FIG. 7 is a timing chart showing an example of a driving method for the imaging device 10 when the CDS circuit 22 has the configuration illustrated in FIG. 6. In FIG. 7, changes in the potentials of a wiring 73[j] and a node FD2[j] are added to the driving method shown in FIG. 3. Here, the potentials of the wiring 71, the wiring 74, and the wiring 76 are set to high potentials, and the potentials of the wiring 75 and the wiring 77 are set to low potentials. The wiring 73 electrically connected to the CDS circuit 22[j] is referred to as the wiring 73[1], and the node FD2 provided in the CDS circuit 22[j] is referred to as the node FD2[j].

As shown in FIG. 7, the potential of the wiring 73[j] is set to a high potential in the period 85*a* and the period 86*a*, which are the imaging signal output periods. Thus, the transistor 63 provided in the CDS circuit 22[j] is turned on, so that the potential of the node FD2[j] can be set to a high potential that is the potential of the wiring 71. That is, the period 85*a* and the period 86*a* can each be referred to as a period for resetting the potential of the node FD2[j]. Thus, the imaging signal output periods can be referred to as CDS reset periods.

In addition, in the period 85*b* and the period 86*b*, which are the reference signal output periods, the potential of the wiring 73[j] is set to a low potential. Thus, the transistor 63 provided in the CDS circuit 22[j] is turned off, and the potential of the node FD2[j] is changed by a difference between the potential of an imaging signal and the potential of a reference signal. That is, the potential of the node FD2[j] corresponds to the potential of the imaging signal. Accordingly, a signal corresponding to the imaging signal is output from the wiring 27 to the outside of the CDS circuit 22. Thus, the period 85*b* and the period 86*b* can be referred to as CDS output periods.

Figure 8A:
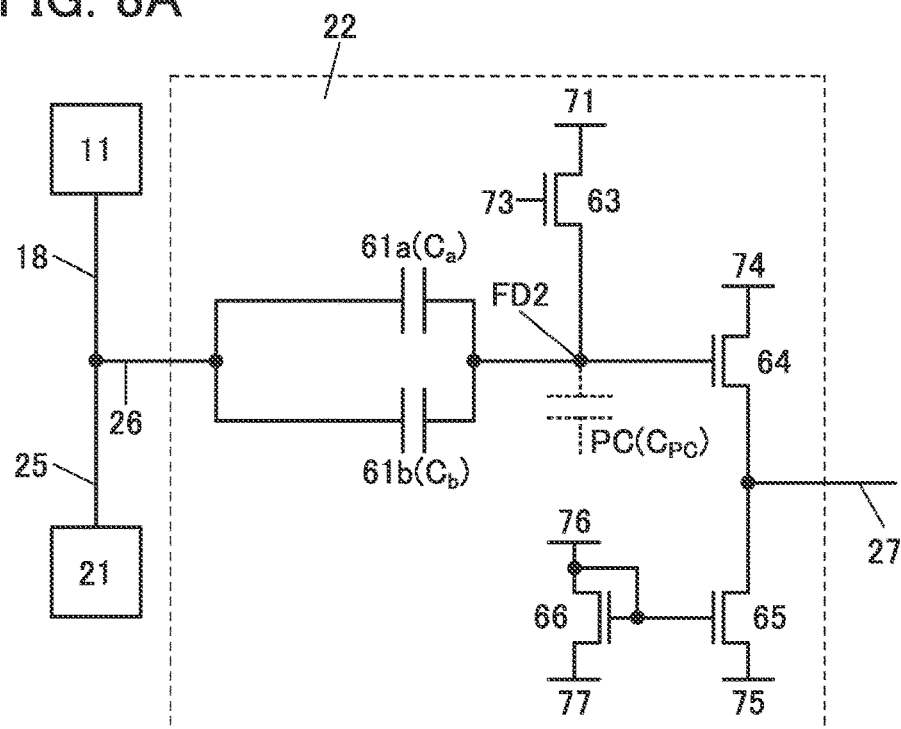
FIG. 8A and FIG. 8B are circuit diagrams each illustrating an example of a method for driving an imaging device.
Figure 8B:
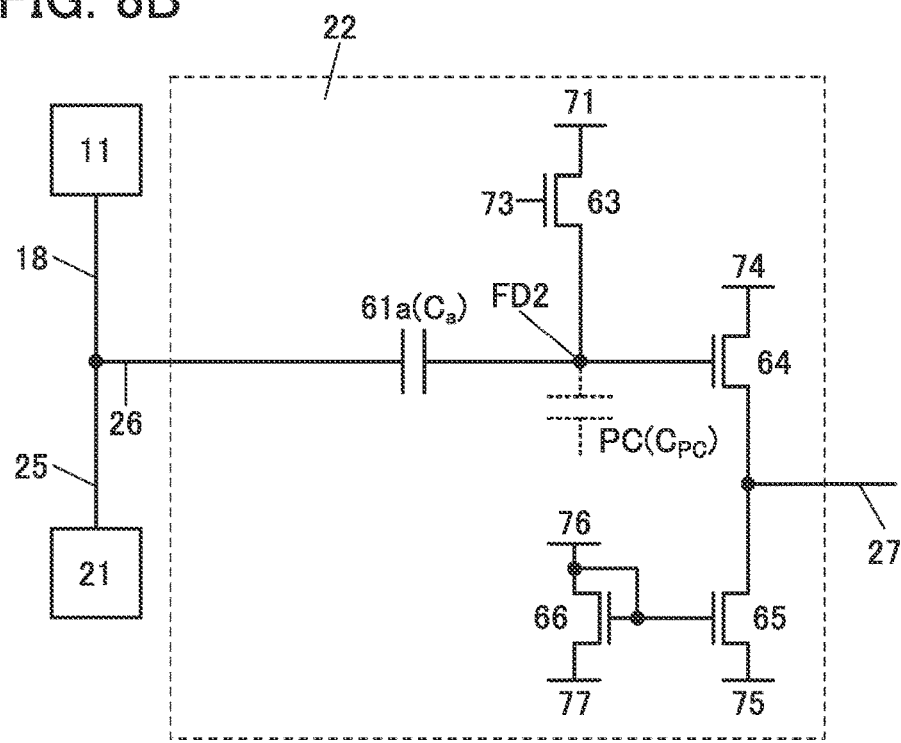

In the CDS reset periods such as the period 85*a* and the period 86*a*, the potential of the wiring 72 can be set to a high potential or a low potential. FIG. 8A is an equivalent circuit of the circuit illustrated in FIG. 6 where the potential of the wiring 72 is set to a high potential to turn on the transistor 62. FIG. 8B is an equivalent circuit of the circuit illustrated in FIG. 6 where the potential of the wiring 72 is set to a low potential to turn off the transistor 62.

In the case where the transistor 62 is in an on state, the wiring 26 is electrically connected to both the one electrode of the capacitor 61*a* and the one electrode of the capacitor 61*b* as illustrated in FIG. 8A. Thus, electric charge corresponding to an imaging signal output from the pixel 11 is stored in both the capacitor 61*a* and the capacitor 61*b*. In the case where the transistor 62 is in an off state, the wiring 26 is electrically connected only to the one electrode of the capacitor 61*a* and not to the one electrode of the capacitor 61*b* as illustrated in FIG. 8B. Thus, electric charge corresponding to an imaging signal output from the pixel 11 is stored only in the capacitor 61*a* and is not stored in the capacitor 61*b*.

Here, parasitic capacitance PC is generated in the node FD2 as illustrated in FIG. 8A and FIG. 8B. For example, parasitic capacitance between the gate of the transistor 64 and the source of the transistor 64 is generated. In addition, parasitic capacitance between the gate of the transistor 64 and the drain of the transistor 64 is generated. Owing to the parasitic capacitance PC, the range of a change in the potential of the node FD2 in the CDS output period is smaller than a difference between the potential of an imaging signal and the potential of a reference signal. For example, the range of a change in the potential of the node FD2 in the period 85*b*, which is the CDS output period, is smaller than a difference between the potential of an imaging signal supplied to the CDS circuit 22 in the period 85*a* and the potential of a reference signal supplied to the CDS circuit 22 in the period 85*b*. Furthermore, the range of a change in the potential of the node FD2 in the period 86*b*, which is the CDS output period, is smaller than a difference between the potential of an imaging signal supplied to the CDS circuit 22 in the period 86*a* and the potential of a reference signal supplied to the CDS circuit 22 in the period 86*b*. In this manner, in the CDS reset period, the value of the potential of the node FD2 reflects the influence of the parasitic capacitance PC, so that the S/N ratio of signals to be output from the CDS circuit 22 to the wiring 27 decreases.

Here, as shown in FIG. 7, a potential $V_{FD2}$ of the node FD2[j] at the end of the period 85*b* is expressed by Formula 1. Here, a potential $VH_{FD2}$ represents the potential of the node FD2[j] at the end of the period 85*a*, a potential V3 represents the potential of the wiring 26[j] at the end of the period 85*a*, and a potential $VL_{WX}$ represents the potential of the wiring 26[j] at the end of the period 85*b*.

[Formula 1]

$$V_{FD2} = VH_{FD2} - k_{FD2}(V3 - VL_{WX}) \quad (1)$$

Formula 2 expresses $k_{FD2}$. $k_{FD2}$ can be referred to as the capacitive coupling coefficient of the node FD2[j]. Capacitance $C_{FD2}$ represents the total of the capacitance of the node FD2[j] and capacitance $C_{PC}$ represents the capacitance of the parasitic capacitance PC. Although the details will be described later, the capacitance $C_{FD2}$ includes the capacitance $C_{PC}$. The maximum value of the capacitive coupling coefficient $k_{FD2}$ is 1.

[Formula 2]

$$k_{FD2} = 1 - \frac{C_{PC}}{C_{FD2}} \qquad (2)$$

Similarly, the potential $V'_{FD2}$ of the node FD2[j] at the end of the period 86b is expressed by Formula 3. Here, a potential V3' represents the potential of the wiring 26[j] at the end of the period 86a.

[Formula 3]

$$V'_{FD2} = VH_{FD2} - k_{FD2}(V3' - VL_{WX}) \qquad (3)$$

In the case where the transistor 62 is in an on state as illustrated in FIG. 8A, the capacitance $C_{FD2}$ is expressed by Formula 4. Here, capacitance $C_a$ represents the capacitance of the capacitor 61a, capacitance $C_b$ represents the capacitance of the capacitor 61b, and the capacitance $C_{PC}$ represents the capacitance of the parasitic capacitance PC.

[Formula 4]

$$C_{FD2} = C_a + C_b + C_{PC} \qquad (4)$$

From Formula 2 and Formula 4, the capacitive coupling coefficient $k_{FD2}$ of the node FD2[j] when the transistor 62 is in an on state is expressed by Formula 5.

[Formula 5]

$$k_{FD2} = \frac{C_a + C_b}{C_a + C_b + C_{PC}} \qquad (5)$$

In the case where the transistor 62 is in an off state as illustrated in FIG. 8B, the capacitance $C_{FD2}$ is expressed by Formula 6.

[Formula 6]

$$C_{FD2} = C_a + C_{PC} \qquad (6)$$

From Formula 2 and Formula 6, the capacitive coupling coefficient $k_{FD2}$ of the node FD2[j] when the transistor 62 is in an off state is expressed by Formula 7.

[Formula 7]

$$k_{FD2} = \frac{C_a}{C_a + C_{PC}} \qquad (7)$$

As expressed by Formula 5 and Formula 7, the capacitive coupling coefficient $k_{FD2}$ is larger when the transistor 62 is in an on state than when the transistor 62 is in an off state. In other words, the influence of the parasitic capacitance PC can be relatively smaller when the transistor 62 is in an on state than when the transistor 62 is in an off state. Thus, as expressed by Formula 1 and Formula 3, the range of a change in the potential of the node FD2[j] in the CDS output period can be closer to a difference between the potential of an imaging signal and the potential of a reference signal when the transistor 62 is in an on state than when the transistor 62 is in an off state. Specifically, the range of a change of the node FD2[j] in the period 85b can be close to a potential "$VH_{FD2}-(V3-VL_{WX})$", and the range of a change of the node FD2[j] in the period 86b can be close to a potential "$VH_{FD2}-(V3'-VL_{WX})$". In this manner, the CDS circuit 22[j] can output a signal with a high S/N ratio from the wiring 27[j]. Thus, the imaging device 10 can perform high-accuracy image capturing.

In contrast, when the transistor 62 is in an off state, electric charge corresponding to an imaging signal output from the pixel 11 is stored only in the capacitor 61a. Therefore, time required for storing and releasing electric charge in and from a capacitor provided in the CDS circuit 22 is reduced. Thus, the reading operation, which is an operation performed in the period T2, can be performed at high speed, resulting in high-speed driving of the imaging device 10. Thus, the imaging device 10 can perform image capturing at a high frame frequency.

In the case where the transistor 62 is in an off state, the one electrode of the capacitor 61b is in a floating state; thus, electric charge does not flow into the one electrode of the capacitor 61b. Thus, even when the potential of the node FD2[j] changes, a dielectric layer that is an insulating layer provided between the one electrode of the capacitor 61b and the other electrode of the capacitor 61b is not dielectrically polarized. Thus, even when the potential of the node FD2[j] changes, electric charge stored in the capacitor 61a and the like does not flow into the capacitor 61b. Thus, in the case where the transistor 62 is in an off state, the capacitor 61b does not affect the capacitive coupling coefficient $k_{FD2}$; therefore, the capacitor 61b does not affect the potential of the node FD2[j].

As described above, in one embodiment of the present invention, the driving mode of the CDS circuit 22 can be changed in accordance with the accuracy of image capturing and frame frequency that are required. Here, a driving mode in which the transistor 62 is in an on state in the CDS reset periods such as the period 85a and the period 86a is referred to as a first mode, a driving mode in which the transistor 62 is in an off state in the CDS reset periods is referred to as a second mode. In the case where high-accuracy image capturing needs to be performed, the CDS circuit 22 can be driven in the first mode, and in the case where image capturing needs to be performed at a high frame frequency, the CDS circuit 22 can be driven in the second mode.

Structure Example 1 of Semiconductor Device

A semiconductor device including the imaging device 10 illustrated in FIG. 1A and the like will be described below. FIG. 9A illustrates a structure example of a semiconductor device 90 including the imaging device 10. The semiconductor device 90 includes a substrate 91 and a substrate 92, and a light-emitting apparatus 93 and the imaging device 10 are provided between the substrate 91 and the substrate 92.

The light-emitting apparatus 93 has a function of emitting light 94. The light 94 can be infrared light or visible light.

The imaging device 10 has a function of sensing emitted light 95. Specifically, the imaging device 10 has a function of sensing the light 95 emitted to the photoelectric conversion element 30 illustrated in FIG. 2 and the like.

The semiconductor device 90, for example, emits the light 94 to a sensing target, and the light reflected by the sensing target can be sensed as the light 95 with the imaging device 10.

The semiconductor device 90 can be driven in an authentication mode and a position sensing mode. FIG. 9B1 is a diagram illustrating the authentication mode, and FIG. 9B2 is a diagram illustrating the position sensing mode. In FIG. 9B1 and FIG. 9B2, the sensing target is a finger 97. The finger 97 can be a finger of the user of the semiconductor device 90, for example.

In the authentication mode, the light 94 is emitted to the finger 97 and the imaging device 10 senses the light reflected by the finger 97 as the light 95, whereby a fingerprint 99 of the finger 97 can be sensed. In this manner, biometric authentication such as fingerprint authentication can be performed.

In the position sensing mode, the light-emitting apparatus 93 emits the light 94 and the imaging device 10 senses the light 95 reflected by the finger 97, whereby the position of the finger 97 can be sensed. Here, as illustrated in FIG. 9B2, as long as the finger 97, which is the sensing target, is near the semiconductor device 90, the finger 97 does not necessarily need to be in contact with the semiconductor device 90. The finger 97 may be in contact with the semiconductor device 90. In other words, in the position sensing mode, the semiconductor device 90 can function as a touch sensor or a near touch sensor. Note that the sensing target is not limited to the finger 97 and may be, for example, a stylus.

In the case where biometric authentication or the like is performed, high-accuracy image capturing is preferably performed to increase the accuracy of authentication. Thus, in the case where the semiconductor device 90 is driven in the authentication mode, the CDS circuit 22 is preferably driven in the first mode. In the case where a touch operation or a near touch operation is sensed, image capturing is preferably performed at a high frame frequency so that the motion of a sensing target can be sensed with high accuracy. Thus, in the case where the semiconductor device 90 is driven in the position sensing mode, the CDS circuit 22 is preferably driven in the second mode. Thus, the semiconductor device 90 can have both a function of performing biometric authentication or the like with high accuracy and a function of sensing the motion of a sensing target with high accuracy.

Configuration Example of Shift Register Circuit

Figure 10:
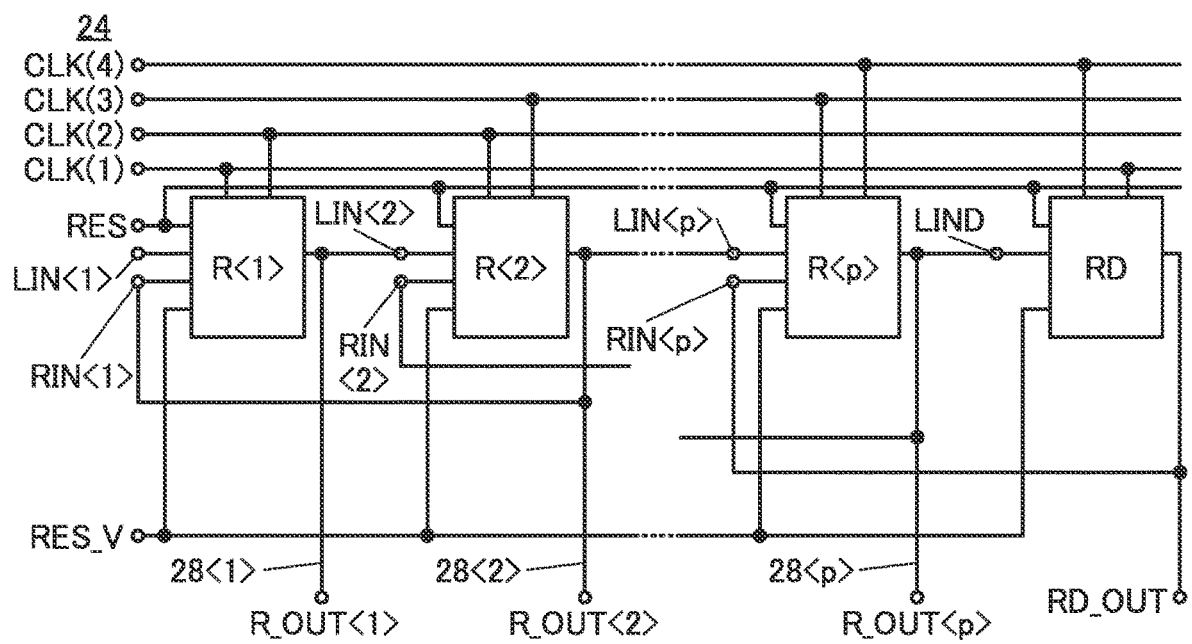
FIG. 10 is a block diagram illustrating a configuration example of an imaging device.

FIG. 10 is a block diagram illustrating a configuration example of the shift register circuit 24 illustrated in FIG. 1B. The shift register circuit 24 includes a register circuit R<1> to a register circuit R<p> and a register circuit RD.

Two of a terminal CLK(1), a terminal CLK(2), a terminal CLK(3), and a terminal CLK(4) are electrically connected to each of the register circuit R<1> to the register circuit R<p> and the register circuit RD. For example, the terminal CLK(1) and the terminal CLK(2) can be electrically connected to the register circuit R<1>, and the terminal CLK(2) and the terminal CLK(3) can be electrically connected to the register circuit R<2>. Although not illustrated, the terminal CLK(3) and the terminal CLK(4) can be electrically connected to the register circuit R<3>, and the terminal CLK(4) and the terminal CLK(1) can be electrically connected to the register circuit R<4>. In the case where p is a multiple of 4 from which 1 is subtracted (e.g., p=27), the terminal CLK(3) and the terminal CLK(4) can be electrically connected to the register circuit R<p>, and the terminal CLK(4) and the terminal CLK(1) can be electrically connected to the register circuit RD.

Terminals LIN, terminals RIN, a terminal RES, a terminal RES_V, and terminals R_OUT are electrically connected to the register circuit R<1> to the register circuit R<p>. A terminal LIND, the terminal RES, the terminal RES_V, and the terminal RD_OUT are electrically connected to the register circuit RD.

Here, the terminals LIN electrically connected to the register circuit R<1> to the register circuit R<p> are respectively referred to as a terminal LIN<1> to a terminal LIN<p>. The terminals RIN electrically connected to the register circuit R<1> to the register circuit R<p> are respectively referred to as a terminal RIN<1> to a terminal RIN<p>. The terminals R_OUT electrically connected to the register circuit R<1> to the register circuit R<p> are respectively referred to as a terminal R_OUT<1> to a terminal R_OUT<p>. The register circuit R<1> to the register circuit R<p> and the register circuit RD can be electrically connected to the same terminal RES and can be electrically connected to the same terminal RES_V.

Although the details will be described later, signals are input to the register circuits R through the terminals LIN, the terminals RIN, the terminal RES, and the terminal RES_V, and the signals are output from the register circuits R to the terminals R_OUT. Thus, it can be said that the terminals LIN, the terminals RIN, the terminal RES, and the terminal RES_V are input terminals and the terminals R_OUT are output terminals. Furthermore, a clock signal is input to the terminal CLK. Thus, it can be said that the terminal CLK is a clock signal input terminal.

A start pulse signal is input to the terminal LIN<1>. When the start pulse signal is input to the terminal LIN<1>, the register circuit R<1> can output a signal to the terminal R_OUT<1>.

The terminal R_OUT<1> is electrically connected to the terminal LIN<2>. Accordingly, the signal output from the terminal R_OUT<1> of the register circuit R<1> is input to the register circuit R<2> through the terminal LIN<2>. When the signal is input to the terminal LIN<2>, the register circuit R<2> can output the signal to the terminal R_OUT<2>.

The terminal R_OUT<p> is electrically connected to the terminal LIND. Thus, the signal output from the terminal R_OUT<p> of the register circuit R<p> is input to the register circuit RD through the terminal LIND. The signal is input to the terminal LIND, whereby the register circuit RD can output the signal to the terminal RD_OUT.

In the above manner, the register circuit R<1> to the register circuit R<p> and the register circuit RD are connected in series through the terminal LIN<2> to the terminal LIN<p> and the terminal LIND.

The register circuit R<1> to the register circuit R<p> can output signals to the terminal R_OUT<1> to the terminal R_OUT<p>, respectively. Here, the terminal R_OUT<1> to the terminal R_OUT<p> are electrically connected sequentially to the wiring 28<1> to the wiring 28<p> illustrated in FIG. 1B. As illustrated in FIG. 1B, the wiring 28<1> to the wiring 28<p> are electrically connected to the signal output circuit 23. Thus, signals output from the register circuit R to the terminal R_OUT are supplied to the signal output circuit 23.

The terminal R_OUT<2> is electrically connected to the terminal RIN<1>. Accordingly, the signal output from the register circuit R<2> to the terminal R_OUT<2> is input to the register circuit R<1> through the terminal RIN<1>. That is, a signal output from the register circuit R of the first subsequent stage can be input to the terminal RIN. Although not illustrated, the terminal RIN<2> is electrically connected to a terminal R_OUT<3> electrically connected to the register circuit R<3>.

Here, the signal output from the register circuit RD to the terminal RD_OUT is input to the terminal RIN<p>. Here, the terminal RD_OUT is not electrically connected to the wiring 28. Thus, the signal output from the register circuit RD to the terminal RD_OUT is not supplied to the signal output circuit 23. Therefore, it can be said that the register circuit RD is a dummy stage.

Providing the register circuit RD, which is a dummy stage, in the shift register circuit 24 allows a signal to be supplied to the terminal RIN<p>.

Figure 11A:
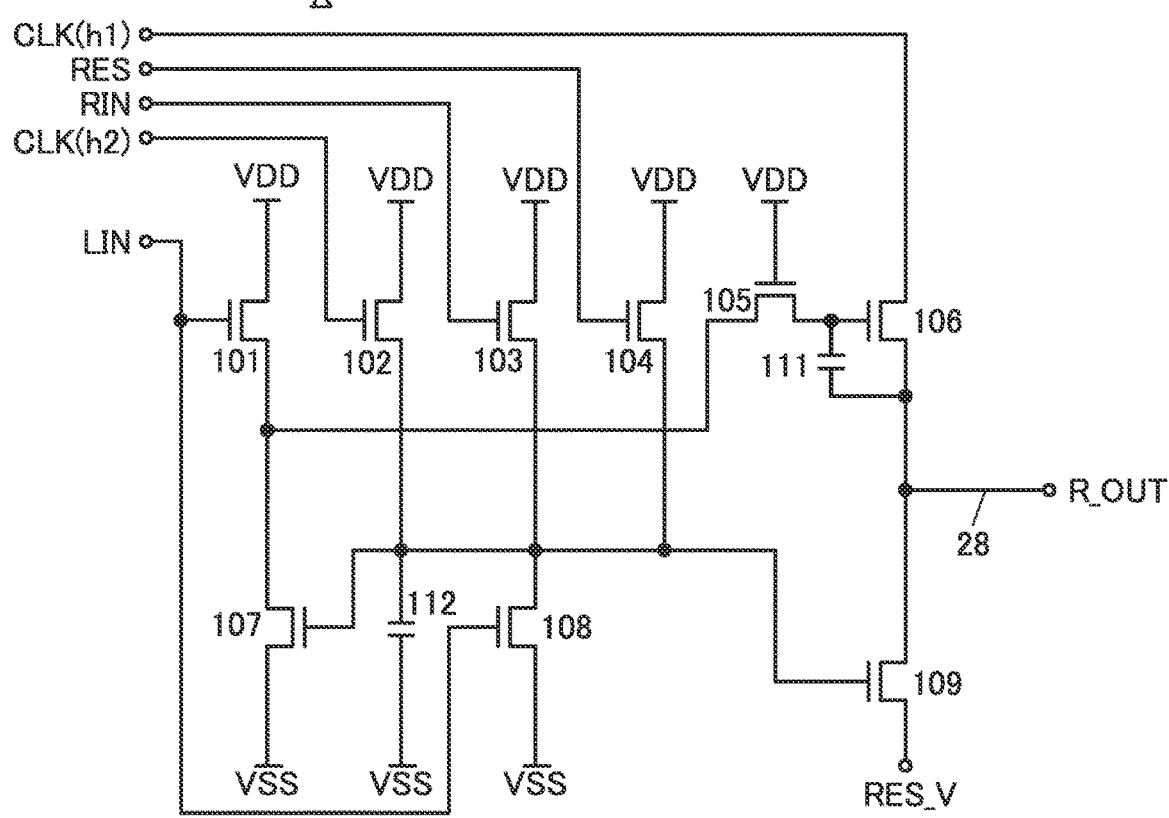
FIG. 11A and FIG. 11B are circuit diagrams illustrating a configuration example of an imaging device.

FIG. 11A is a circuit diagram illustrating a configuration example of the register circuit R. The register circuit R includes a transistor 101, a transistor 102, a transistor 103, a transistor 104, a transistor 105, a transistor 106, a transistor 107, a transistor 108, a transistor 109, a capacitor 111, and a capacitor 112. Here, a terminal CLK(h1) and a terminal CLK(h2) illustrated in FIG. 11A can serve as any of the terminal CLK(1) to the terminal CLK(4). For example, in the register circuit R<1>, the terminal CLK(h1) can serve as the terminal CLK(1) and the terminal CLK(h2) can serve as the terminal CLK(2). In the register circuit R<2>, the terminal CLK(h1) can serve as the terminal CLK(2) and the terminal CLK(h2) can serve as the terminal CLK(3). In the register circuit R<p>, the terminal CLK(h1) can serve as the terminal CLK(3) and the terminal CLK(h2) can serve as the terminal CLK(4).

The terminal CLK(h1) is electrically connected to one of a source and a drain of the transistor 106. The terminal CLK(h2) is electrically connected to a gate of the transistor 102. The terminal LIN is electrically connected to a gate of the transistor 101 and a gate of the transistor 108. The terminal RIN is electrically connected to a gate of the transistor 103. The terminal RES is electrically connected to a gate of the transistor 104. The terminal RES_V is electrically connected to one of a source and a drain of the transistor 109. The terminal R_OUT is electrically connected to the other of the source and the drain of the transistor 106, the other of the source and the drain of the transistor 109, and one electrode of the capacitor 111.

One of a source and a drain of the transistor 101 and one of a source and a drain of the transistor 107 are electrically connected to one of a source and a drain of the transistor 105. The other of the source and the drain of the transistor 105 is electrically connected to a gate of the transistor 106. The gate of the transistor 106 is electrically connected to the other electrode of the capacitor 111. One of a source and a drain of the transistor 102, one of a source and a drain of the transistor 103, and one of a source and a drain of the transistor 104 are electrically connected to a gate of the transistor 107, one of a source and a drain of the transistor 108, a gate of the transistor 109, and one electrode of the capacitor 112.

A potential VDD can be supplied to the other of the source and the drain of the transistor 101, the other of the source and the drain of the transistor 102, the other of the source and the drain of the transistor 103, and the other of the source and the drain of the transistor 104, and a gate of the transistor 105. Furthermore, a potential VSS can be supplied to the other of the source and the drain of the transistor 107, the other of the source and the drain of the transistor 108, and the other electrode of the capacitor 112. Here, the potential VDD refers to a high potential and the potential VSS refers to a low potential.

When a high-potential signal is input to the terminal LIN, the transistor 101 and the transistor 108 are turned on. When the transistor 101 is turned on, the potential of the gate of the transistor 106 becomes a high potential, whereby the transistor 106 is turned on. When the transistor 108 is turned on, the potential of the gate of the transistor 109 becomes a low potential, whereby the transistor 109 is turned off. Thus, a signal input to the terminal CLK(h1) can be output from the terminal R_OUT.

When a high-potential signal is input to the terminal CLK(h2), the transistor 102 is turned on. Thus, the potential of the gate of the transistor 107 becomes a high potential, so that the transistor 107 is turned on. When the transistor 107 is turned on, the potential of the gate of the transistor 106 becomes a low potential, so that the transistor 106 is turned off. When the transistor 102 is turned on, the potential of the gate of the transistor 109 becomes a high potential, so that the transistor 109 is turned on. Thus, a signal input to the terminal RES_V can be output from the terminal R_OUT.

In the case where a high-potential signal is input to the terminal RIN or a high-potential signal is input to the terminal RES, the transistor 109 is turned on and the transistor 106 is turned off as in the case where a high-potential signal is input to the terminal CLK(h2). Thus, a signal input to the terminal RES_V can be output from the terminal R_OUT.

Figure 11B:
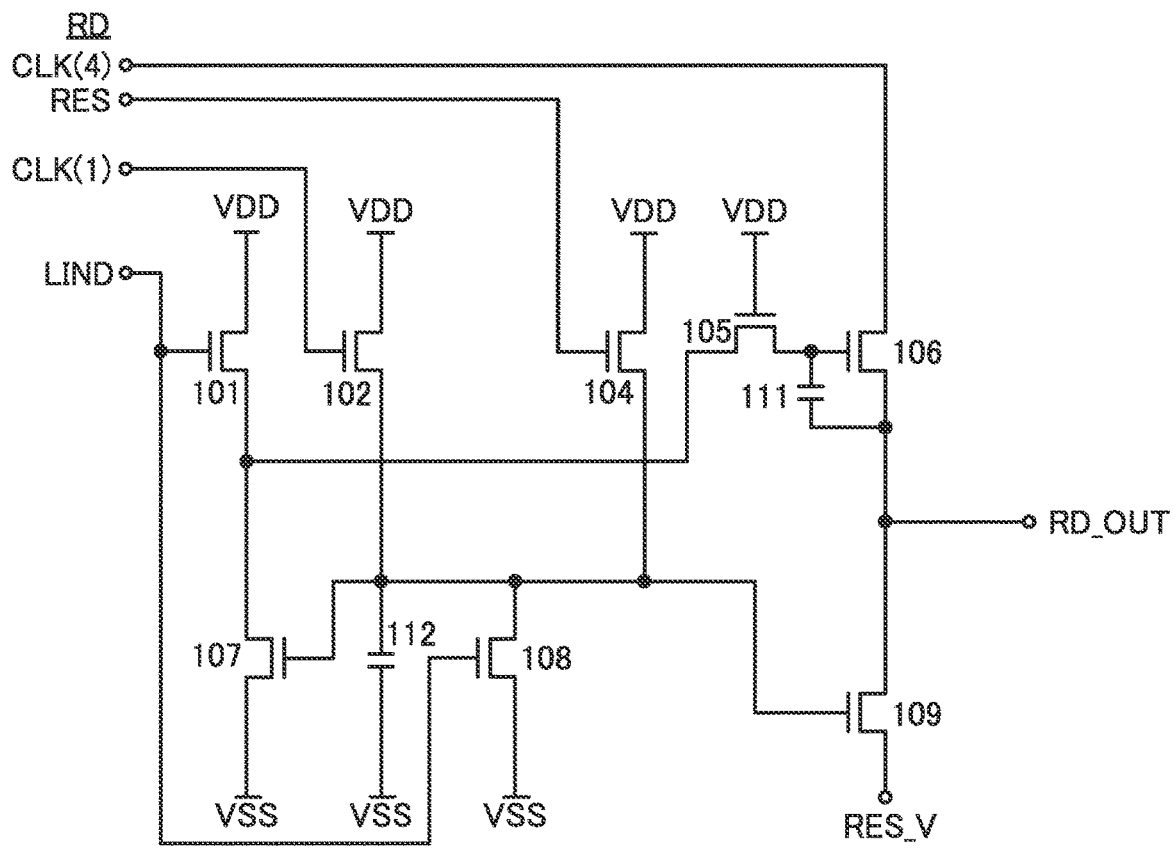

FIG. 11B is a circuit diagram illustrating a configuration example of the register circuit RD. As described above, the terminal RIN is not electrically connected to the register circuit RD. Thus, the register circuit RD is different from the register circuit R having the configuration illustrated in FIG. 11A in that the transistor 103 is not provided.

In the register circuit RD having the configuration illustrated in FIG. 11B, the one of the source and the drain of the transistor 106 is electrically connected to the terminal CLK (4). The gate of the transistor 102 is electrically connected to the terminal CLK(1). The gate of the transistor 101 and the gate of the transistor 108 are electrically connected to the terminal LIND. The other of the source and the drain of the transistor 106, the other of the source and the drain of the transistor 109, and the one electrode of the capacitor 111 are electrically connected to the terminal RD_OUT.

Configuration Example of Signal Output Circuit

Figure 12A:
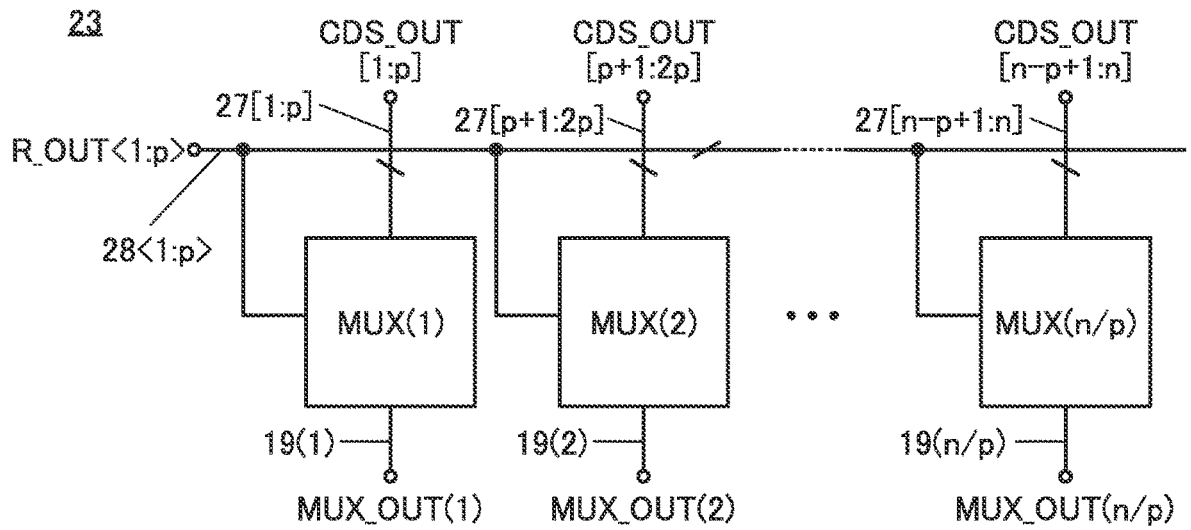
FIG. 12A is a block diagram illustrating a configuration example of an imaging device.

FIG. 12A is a block diagram illustrating a configuration example of the signal output circuit 23 illustrated in FIG. 1B. The signal output circuit 23 includes a multiplexer circuit MUX(1) to a multiplexer circuit MUX(n/p).

The multiplexer circuits MUX can each have a configuration including p selection signal input terminals, p input terminals, and one output terminal. All of the wiring 28<1> to the wiring 28<p> can be electrically connected to the selection signal input terminals of the multiplexer circuit MUX(1) to the multiplexer circuit MUX(n/p). That is, all of the terminal R_OUT<1> to the terminal R_OUT<p>, which are output terminals of the shift register circuit 24 illustrated in FIG. 10 and the like, can be electrically connected to the selection signal input terminals of the multiplexer circuit MUX(1) to the multiplexer circuit MUX(n/p). Here, the selection signal input terminals of the multiplexer circuits MUX are electrically connected to the terminals R_OUT, which are output terminals of the shift register circuit 24;

thus, it can be said that the shift register circuit 24 has a function of outputting selection signals.

The input terminals of the multiplexer circuits MUX are electrically connected to terminals CDS_OUT through the wirings 27. As illustrated in FIG. 1B and the like, the wirings 27 are electrically connected to the output terminals of the CDS circuits 22. Thus, signals output from the CDS circuits 22 are input to the terminals CDS_OUT.

Here, one terminal CDS_OUT is electrically connected to one input terminal of the multiplexer circuit MUX. That is, different terminals CDS_OUT are electrically connected to p input terminals of the multiplexer circuits MUX. Different terminals CDS_OUT are electrically connected to the input terminals of the multiplexer circuit MUX(1) to the multiplexer circuit MUX(n/p). In other words, a terminal CDS_OUT[1] to a terminal CDS_OUT[p] are electrically connected sequentially to p input terminals of the multiplexer circuit MUX(1), for example. A terminal CDS_OUT[p+1] to a terminal CDS_OUT[2p] are electrically connected sequentially to p input terminals of the multiplexer circuit MUX(2). A terminal CDS_OUT[n−p+1] to a terminal CDS_OUT[n] are electrically connected sequentially to p input terminals of the multiplexer circuit MUX(n/p).

The output terminals of the multiplexer circuits MUX are electrically connected to terminals MUX_OUT through the wirings 19. As illustrated in FIG. 1A, the wirings 19 are electrically connected to the A/D converter circuit 15. Thus, the signal output circuit 23 can output signals through the terminals MUX_OUT.

Here, different terminals MUX_OUT are electrically connected to output terminals of the multiplexer circuit MUX(1) to the multiplexer circuit MUX(n/p). For example, a terminal MUX_OUT(1) is electrically connected to the output terminal of the multiplexer circuit MUX(1), a terminal MUX_OUT(2) is electrically connected to the output terminal of the multiplexer circuit MUX(2), and a terminal MUX_OUT(n/p) is electrically connected to the output terminal of the multiplexer circuit MUX(n/p).

Figure 12B:
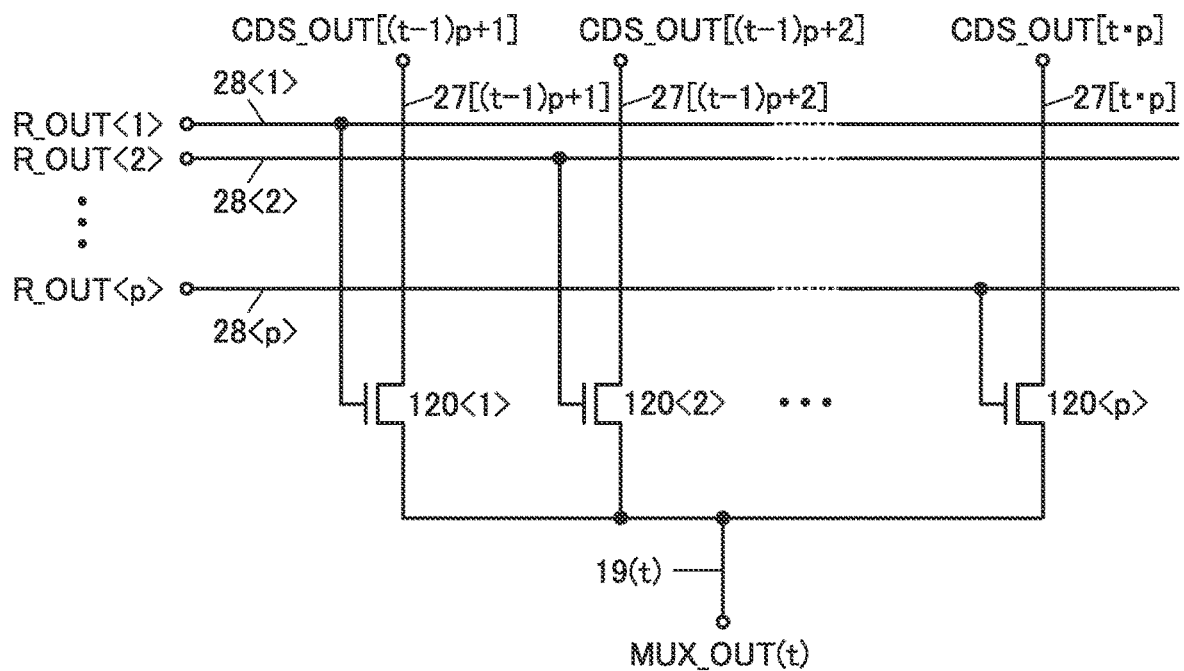
FIG. 12B is a circuit diagram illustrating a configuration example of an imaging device.

FIG. 12B is a circuit diagram illustrating a configuration example of the multiplexer circuit MUX(t) (t is an integer of 1 or more and n/p or less). The multiplexer circuit MUX(t) includes a transistor 120<1> to a transistor 120<p>.

The terminal R_OUT<1> to the terminal R_OUT<p> are electrically connected to gates of the transistor 120<1> to the transistor 120<p>, respectively. A terminal CDS_OUT [(t−1)p+1] to a terminal CDS_OUT[t·p] are electrically connected to sources or drains of the transistor 120<1> to the transistor 120<p>, respectively. A terminal MUX_OUT (t) is electrically connected to the other of the sources and the drains of the transistor 120<1> to the transistor 120<p>. That is, the transistor 120<1> to the transistor 120<p> are connected in parallel by the other of the sources and the drains of the transistor 120<1> to the transistor 120<p>.

Example of Driving Method for Shift Register Circuit and Signal Output Circuit

Figure 13:
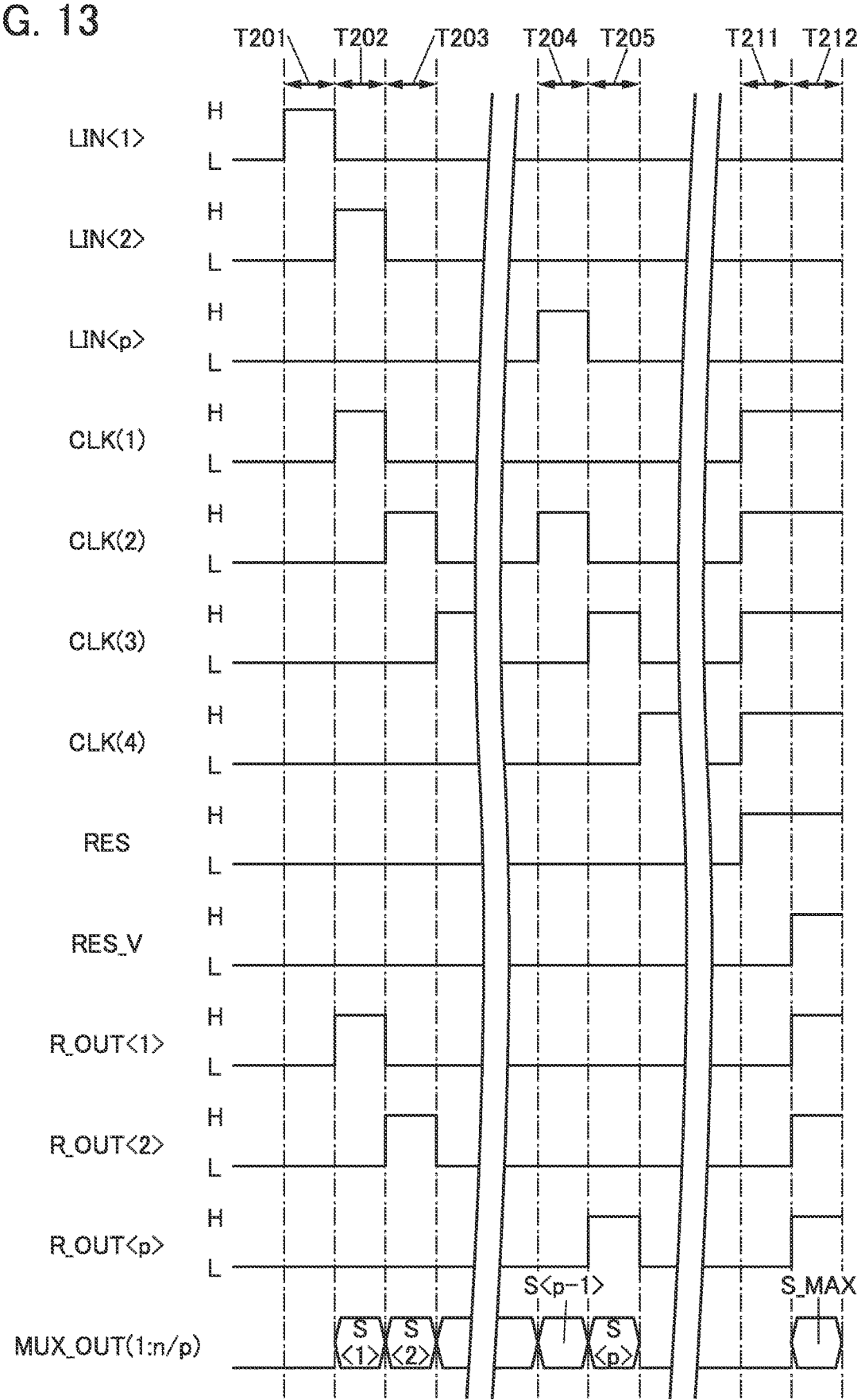
FIG. 13 is a timing chart showing an example of a method for driving an imaging device.

FIG. 13 is a timing chart showing an example of a method for driving the shift register circuit 24 and the signal output circuit 23 in the period T2, which is the reading period shown in FIG. 3. Note that in FIG. 13, an increase in potential through bootstrap, a decrease in potential through a leakage current, and the like are not considered. The same applies to the other timing charts. Assume that p is a multiple of 4 from which 1 is subtracted.

Figure 14A:
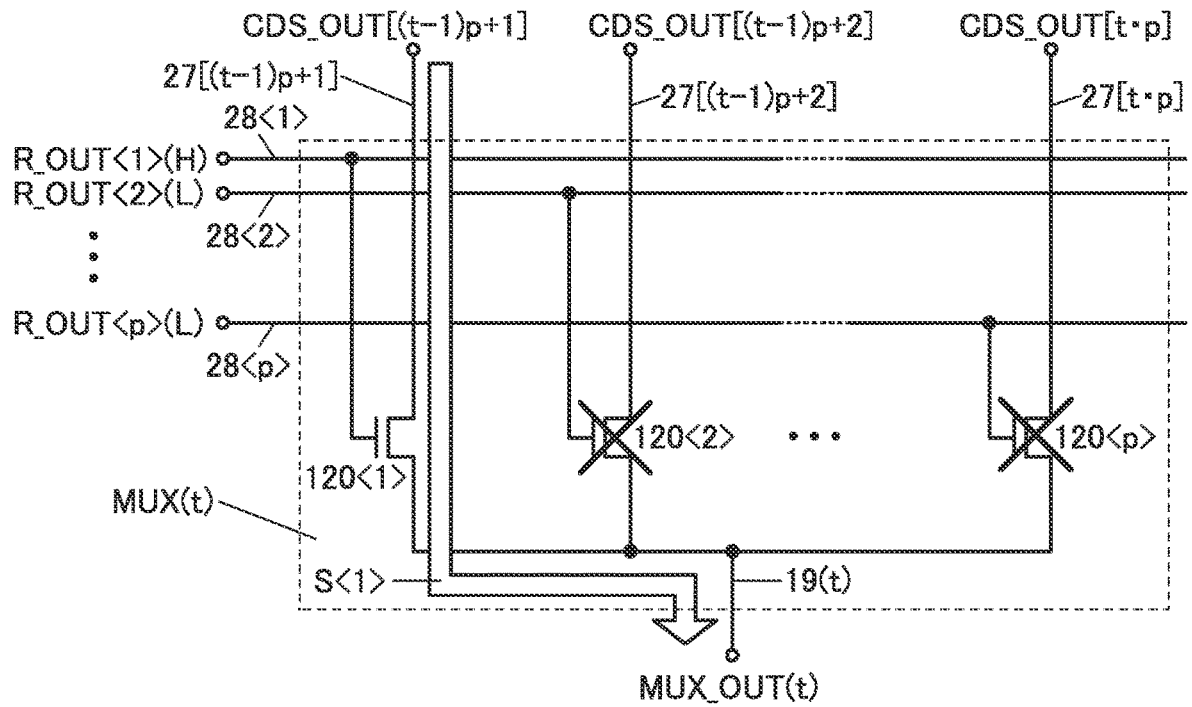
FIG. 14A and FIG. 14B are circuit diagrams illustrating an example of a method for driving an imaging device.
Figure 14B:
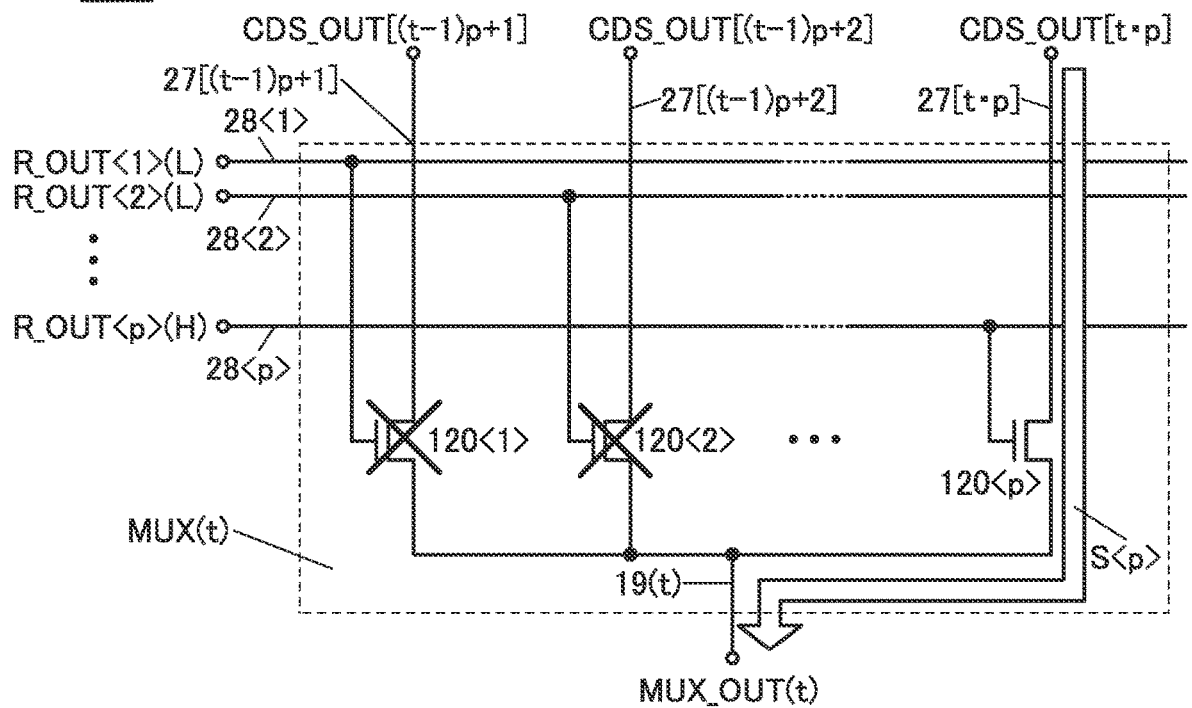
Figure 15:
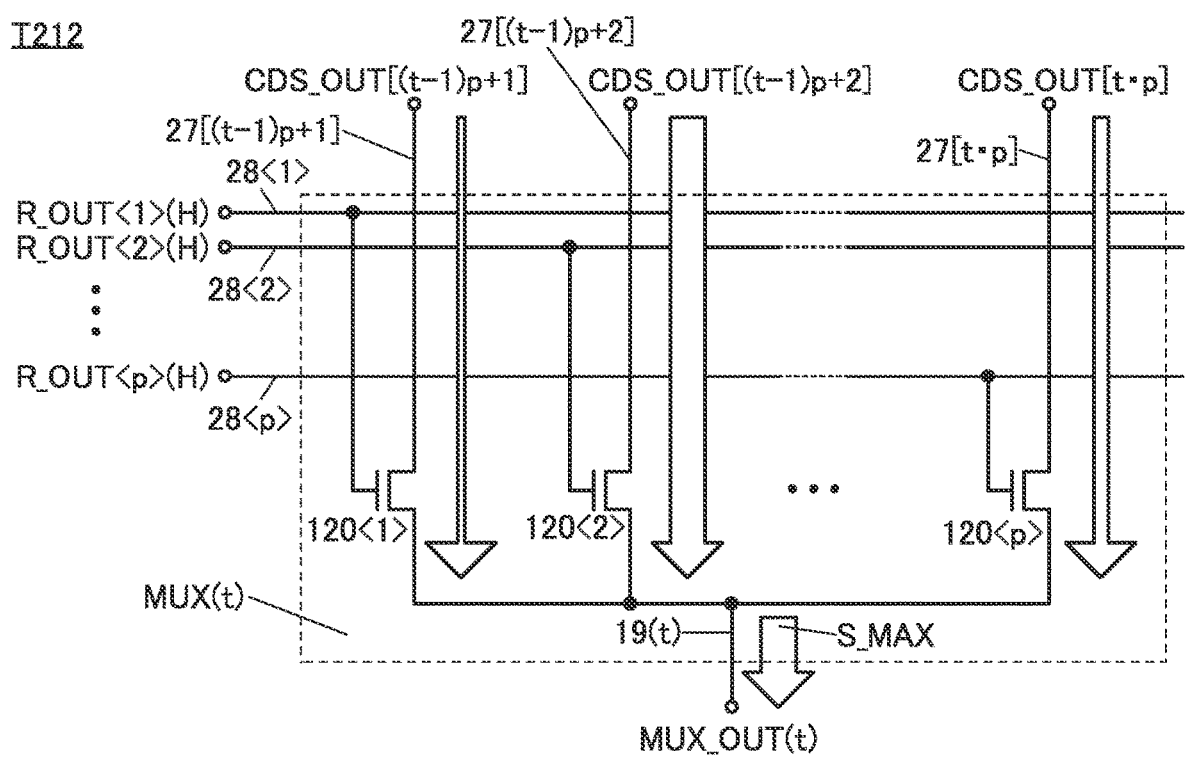
FIG. 15 is a circuit diagram illustrating an example of a method for driving an imaging device.

FIG. 14A, FIG. 14B, and FIG. 15 are circuit diagrams for illustrating an example of a driving method for the multiplexer circuit MUX(t) illustrated in FIG. 12B. In FIG. 14A, FIG. 14B, and FIG. 15, the transistors 120 that are marked with crosses are in an off state and the transistors 120 without crosses are in an on state.

First, in a period T201, a high-potential signal is input as a start pulse signal to the terminal LIN<1>. Thus, the potential of the gate of the transistor 101 included in the register circuit R<1> becomes a high potential, so that the transistor 101 included in the register circuit R<1> is turned on. Thus, the potential of the gate of the transistor 106 included in the register circuit R<1> becomes a high potential, so that the transistor 106 included in the register circuit R<1> is turned on. When a high-potential signal is input to the terminal LIN<1>, the potential of the gate of the transistor 108 included in the register circuit R<1> becomes a high potential, so that the transistor 108 included in the register circuit R<1> is turned on. Accordingly, the potentials of the gates of the transistor 107 and the transistor 109 included in the register circuit R<1> become low potentials, so that the transistor 107 and the transistor 109 included in the register circuit R<1> are turned off.

Clock signals are sequentially input to the terminal CLK (1) to the terminal CLK(4) from a period T202. Accordingly, in the period T202, the potential of the terminal CLK(1) becomes a high potential and the potentials of the terminal CLK(2), the terminal CLK(3), and the terminal CLK(4) become low potentials. In a period T203 and a period T204, the potential of the terminal CLK(2) becomes a high potential, and the potentials of the terminal CLK(1), the terminal CLK(3), and terminal CLK(4) become low potentials. In a period T205, the potential of the terminal CLK(3) becomes a high potential, and the potentials of the terminal CLK(1), the terminal CLK(2), and the terminal CLK(4) become low potentials.

In the period T202, the potential of the terminal LIN<1> becomes a low potential, so that the transistor 101 included in the register circuit R<1> is turned off; however, the transistor 107 included in the register circuit R<1> remains in an off state, and thus, the gate of the transistor 106 included in the register circuit R<1> is in a floating state. Thus, the potential of the gate of the transistor 106 included in the register circuit R<1> remains a high potential, and the transistor 106 included in the register circuit R<1> remains in an on state from the period T201. Therefore, a clock signal to be input to the terminal CLK(1) is output from the terminal R_OUT<1>. As described above, since the potential of the terminal CLK(1) in the period T202 is a high potential, a high-potential selection signal is output from the terminal R_OUT<1>. Thus, a high-potential signal is input to the terminal LIN<2> electrically connected to the terminal R_OUT<1>.

FIG. 14A is a circuit diagram for illustrating an example of a driving method for the multiplexer circuit MUX(t) in the period T202. In the period T202, the potential of the terminal R_OUT<1> becomes a high potential, and the potentials of the terminal R_OUT<2> to the terminal R_OUT<p> become low potentials. Thus, the potential of the gate of the transistor 120<1> becomes a high potential, so that the transistor 120<1> is turned on. The potentials of the gates of the transistor 120<2> to the transistor 120<p> become low potentials, so that the transistor 120<2> to the transistor 120<p> are turned off. Thus, a signal input from the terminal CDS_OUT[(t−1)p+1] to an input terminal of the multiplexer circuit MUX(t) is output as a signal S<1> to the terminal MUX_OUT(t).

In the above manner, in the period T202, the signal S<1> is output from the terminal MUX_OUT(1) to the terminal MUX_OUT(n/p), which are the output terminals of the multiplexer circuit MUX(1) to the multiplexer circuit MUX (n/p).

In the period T202, a high-potential signal is input to the terminal LIN<2>, so that the potential of the gate of the transistor 101 included in the register circuit R<2> becomes a high potential; thus, the transistor 101 included in the register circuit R<2> is turned on. Accordingly, the potential of the gate of the transistor 106 included in the register circuit R<2> becomes a high potential, so that the transistor 106 included in the register circuit R<2> is turned on. When a high-potential signal is input to the terminal LIN<2>, the potential of the gate of the transistor 108 included in the register circuit R<2> becomes a high potential, so that the transistor 108 included in the register circuit R<2> is turned on. Accordingly, the potentials of the gates of the transistor 107 and the transistor 109 included in the register circuit R<2> become low potentials, so that the transistor 107 and the transistor 109 included in the register circuit R<2> are turned off.

In the period T203, the potential of the terminal LIN<2> becomes a low potential, so that the transistor 101 included in the register circuit R<2> is turned off; however, the transistor 107 included in the register circuit R<2> remains in an off state, and thus, the gate of the transistor 106 included in the register circuit R<2> is in a floating state. Accordingly, the potential of the gate of the transistor 106 included in the register circuit R<2> remains a high potential; thus, the transistor 106 included in the register circuit R<2> remains in an on state from the period T202. Therefore, a clock signal input to the terminal CLK(2) is output from the terminal R_OUT<2>. As described above, since the potential of the terminal CLK(2) in the period T203 is a high potential, a high-potential selection signal is output from the terminal R_OUT<2>. Thus, a high-potential signal is input to a terminal LIN<3> electrically connected to the terminal R_OUT<2>.

In the period T203, the potential of the terminal R_OUT<2> becomes a high potential, and the potentials of the terminal R_OUT<1> and the terminal R_OUT<3> to the terminal R_OUT<p> become low potentials. Thus, the potential of the gate of the transistor 120<2> becomes a high potential, so that the transistor 120<2> is turned on. The potentials of the gates of the transistor 120<1> and the transistor 120<3> to the transistor 120<p> become low potentials, so that the transistor 120<1> and the transistor 120<3> to the transistor 120<p> are turned off. Accordingly, a signal input to the terminal CDS_OUT[(t−1)p+2] is output as a signal S<2> to the terminal MUX_OUT(t).

In the above manner, in the period T203, the signal S<2> is output from the terminal MUX_OUT(1) to the terminal MUX_OUT(n/p), which are output terminals of the multiplexer circuit MUX(1) to the multiplexer circuit MUX(n/p).

In the period T204, a high-potential signal is input to the terminal LIN<p>. Thus, the potential of the gate of the transistor 101 included in the register circuit R<p> becomes a high potential, so that the transistor 101 included in the register circuit R<p> is turned on. Accordingly, the potential of the gate of the transistor 106 included in the register circuit R<p> becomes a high potential, so that the transistor 106 included in the register circuit R<p> is turned on. When a high-potential signal is input to the terminal LIN<p>, the potential of the gate of the transistor 108 included in the register circuit R<p> becomes a high potential, so that the transistor 108 included in the register circuit R<p> is turned on. Accordingly, the potentials of the gates of the transistor 107 and the transistor 109 included in the register circuit R<p> become low potentials, so that the transistor 107 and the transistor 109 included in the register circuit R<p> are turned off.

In the period T205, the potential of the terminal LIN<p> becomes a low potential, so that the transistor 101 included in the register circuit R<p> is turned off; however, the transistor 107 included in the register circuit R<p> remains in an off state, and thus, the gate of the transistor 106 included in the register circuit R<p> is in a floating state. Thus, the potential of the gate of the transistor 106 included in the register circuit R<p> remains a high potential, and the transistor 106 included in the register circuit R<p> remains in an on state from the period T204. Accordingly, a clock signal input to the terminal CLK(3) is output from the terminal R_OUT<p>. As described above, since the potential of the terminal CLK(3) in the period T205 is a high potential, a high-potential selection signal is output from the terminal R_OUT<p>. Thus, a high-potential signal is input to the terminal LIND electrically connected to the terminal R_OUT<p>.

FIG. 14B is a circuit diagram for illustrating an example of a driving method for the multiplexer circuit MUX(t) in the period T205. In the period T205, the potential of the terminal R_OUT<p> becomes a high potential, and the potentials of the terminal R_OUT<1> to a terminal R_OUT<p−1> are low potentials. Thus, the potential of the gate of the transistor 120<p> becomes a high potential, so that the transistor 120<p> is turned on. The potentials of the gates of the transistor 120<1> to a transistor 120<p−1> become low potentials, so that the transistor 120<1> to the transistor 120<p−1> are turned off. Accordingly, a signal input to the terminal CDS_OUT[t·p] is output as a signal S<p> to the terminal MUX_OUT(t).

In the above manner, in the period T205, the signal S<p> is output from the terminal MUX_OUT(1) to the terminal MUX_OUT(n/p), which are output terminals of the multiplexer circuit MUX(1) to the multiplexer circuit MUX(n/p).

As described above, the start pulse signal input to the terminal LIN<1> in the period T201 shown in FIG. 13 is sequentially transmitted from the register circuit R<1> to the register circuit R<p> in the period T202 to the period T205. Accordingly, high-potential selection signals are sequentially output from the terminal R_OUT<1> to the terminal R_OUT<p>.

In a period T211 and a period T212, the shift register circuit 24 and the signal output circuit 23 are driven in a mode different from that in the period T201 to the period T205. Specifically, in the period T211, high-potential signals are input to the terminal CLK(1) to the terminal CLK(4) and the terminal RES. Accordingly, the potentials of the gates of the transistors 102 and the transistors 104 included in the register circuit R<1> to the register circuit R<p> become high potentials, so that the transistors 102 and the transistors 104 included in the register circuit R<1> to the register circuit R<p> are turned on. Thus, the potentials of the gates of the transistors 107 and the transistors 109 included in the register circuit R<1> to the register circuit R<p> become high potentials, so that the transistors 107 and the transistors 109 included in the register circuit R<1> to the register circuit R<p> are turned on. When the transistors 107 included in the register circuit R<1> to the register circuit R<p> are turned on, the potentials of the gates of the transistors 106 included in the register circuit R<1> to the register circuit R<p> become low potentials, so that the transistors 106 included in the register circuit R<1> to the register circuit R<p> are turned off. In the above manner, in the period T211, the transistors 106 included in the register circuit R<1> to the register circuit R<p> are turned off, and the transistors 109 included in the register circuit R<1> to the register circuit R<p> are turned on. Thus, a signal input to the terminal RES_V can be output from the terminal R_OUT.

In the period T212, a high-potential signal is input to the terminal RES_V. In the period T212, the transistors 106 included in the register circuit R<1> to the register circuit R<p> remain in an off state and the transistors 109 included in the register circuit R<1> to the register circuit R<p> remain in an on state, from the period T211. Thus, the high-potential signal input to the terminal RES_V is output from the terminal R_OUT<1> to the terminal R_OUT<p>.

FIG. 15 is a circuit diagram for illustrating an example of a driving method for the multiplexer circuit MUX(t) in the period T212. In the period T212, all the potentials of the terminal R_OUT<1> to the terminal R_OUT<p> are high potentials. Thus, the potentials of the gates of the transistor 120<1> to the transistor 120<p> become high potentials, so that the transistor 120<1> to the transistor 120<p> are all turned on. Accordingly, a signal having the highest potential among signals input to the input terminals of the multiplexer circuit MUX(t) from the terminal CDS_OUT[(t−1)p+1] to the terminal CDS_OUT[t·p] is output as a signal S_MAX to the terminal MUX_OUT(t).

In the above manner, in the period T212, the signal S_MAX is output from the terminal MUX_OUT(1) to the terminal MUX_OUT(n/p), which are output terminals of the multiplexer circuit MUX(1) to the multiplexer circuit MUX (n/p).

When the shift register circuit 24 and the signal output circuit 23 are driven by the method shown for the period T201 to the period T205, for example, signals corresponding to imaging signals output from corresponding pixels 11 can be all output from the read circuit 14. Thus, the imaging device 10 can perform high-accuracy image capturing. Thus, for example, in the case where the semiconductor device 90 provided with the imaging device 10 is driven in the authentication mode as illustrated in FIG. 9B1, it is preferable that the shift register circuit 24 and the signal output circuit 23 be driven by the method shown for the period T201 to the period T205 in order to increase the accuracy of authentication.

When the shift register circuit 24 and the signal output circuit 23 are driven by the method shown for the period T211 to the period T212, for example, the transistor 120<1> to the transistor 120<p> included in the multiplexer circuit MUX can be turned on concurrently. As described above, the transistor 120<1> to the transistor 120<p> are connected in parallel. Thus, it is possible to further reduce the resistance between the terminal CDS_OUT, which serves as an input terminal of the multiplexer circuit MUX, and the terminal MUX_OUT, which serves as an output terminal of the multiplexer circuit MUX, compared to the case where only one transistor 120 among the transistor 120<1> to the transistor 120<p> is in an on state, for example. Thus, the reading operation, which is an operation performed in the period T2, can be performed at high speed, and thus, the imaging device 10 can be driven at high speed. Thus, the imaging device 10 can perform image capturing at a high frame frequency. Thus, for example, in the case where the semiconductor device 90 provided with the imaging device 10 is driven in the position sensing mode as illustrated in FIG. 9B2, it is preferable that the shift register circuit 24 and the signal output circuit 23 be driven by the method shown for the period T211 and the period T212 in order to sense the motion of a sensing target with high accuracy.

As the transistors 101 and the transistors 107 included in the register circuit R having the configuration illustrated in FIG. 11A and the register circuit RD having the configuration illustrated in FIG. 11B, OS transistors or the like, which have a low off-state current, are preferably used. In that case, even when the transistor 101 and the transistor 107 are turned off and the gate of the transistor 106 is brought into a floating state, the potential of the gate of the transistor 106 can be held for a long time. Thus, the register circuit R can output a signal from the terminal R_OUT with high accuracy, and the register circuit RD can output a signal from the terminal RD_OUT with high accuracy.

As the transistors 101 and the transistors 107, Si transistors may be used. As other transistors included in the register circuit R with the configuration illustrated in FIG. 11A and the register circuit RD with the configuration illustrated in FIG. 11B, Si transistors may be used. When transistors including crystalline silicon are used as the transistor 101 to the transistor 109, the on-state current of the transistor 101 to the transistor 109 can be increased. Thus, the shift register circuit 24 can be driven at high speed.

Structure Example 2 of Semiconductor Device

Figure 16A:
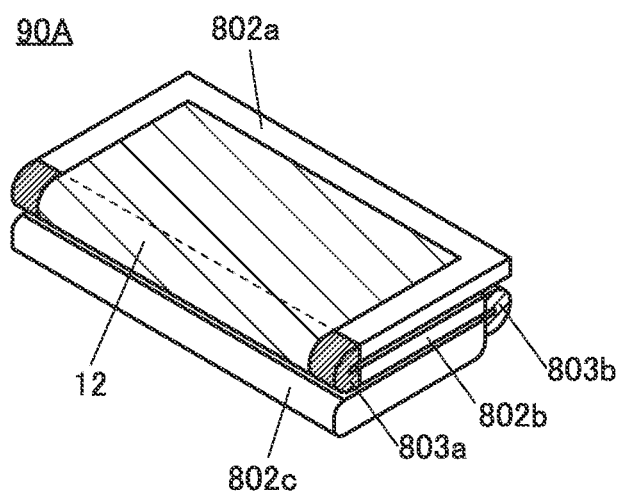
FIG. 16A and FIG. 16B are diagrams illustrating a structure example of a semiconductor device.
Figure 16B:
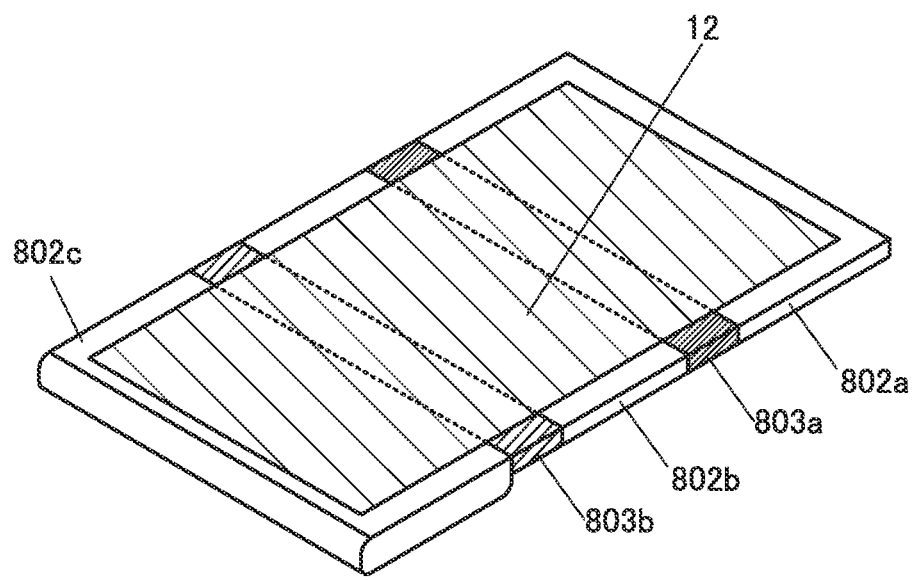

FIG. 16A and FIG. 16B are diagrams illustrating a structure example of the semiconductor device 90. The semiconductor device 90 with the structure illustrated in FIG. 16A and FIG. 16B has a threefold mechanism, and includes a region that can be folded so that the pixel portion 12 faces itself and a region that can be folded so that a surface opposite to the pixel portion 12 faces the surface. The semiconductor device 90 with the structure illustrated in FIG. 16A and FIG. 16B is referred to as a semiconductor device 90A.

The semiconductor device 90A can be folded small with folds provided in the short-axis direction even in the case where the aspect ratio of the pixel portion is relatively high, for example, 16:9, 18:9, 21:9, or the like. Accordingly, the portability of the semiconductor device 90A can be improved. When the semiconductor device 90A is folded small, the pixels 11 included in a portion that cannot be viewed in the pixel portion 12 are not driven, resulting in a reduction in the power consumption of the semiconductor device 90A.

FIG. 16A is a diagram illustrating a state where the semiconductor device 90A is folded to the minimum size (folded in three). FIG. 16B is a diagram illustrating a state where the semiconductor device 90A is unfolded.

The semiconductor device 90A includes the pixel portion 12, a housing 802a, a housing 802b, a housing 802c, a hinge 803a, and a hinge 803b.

Figure 17:
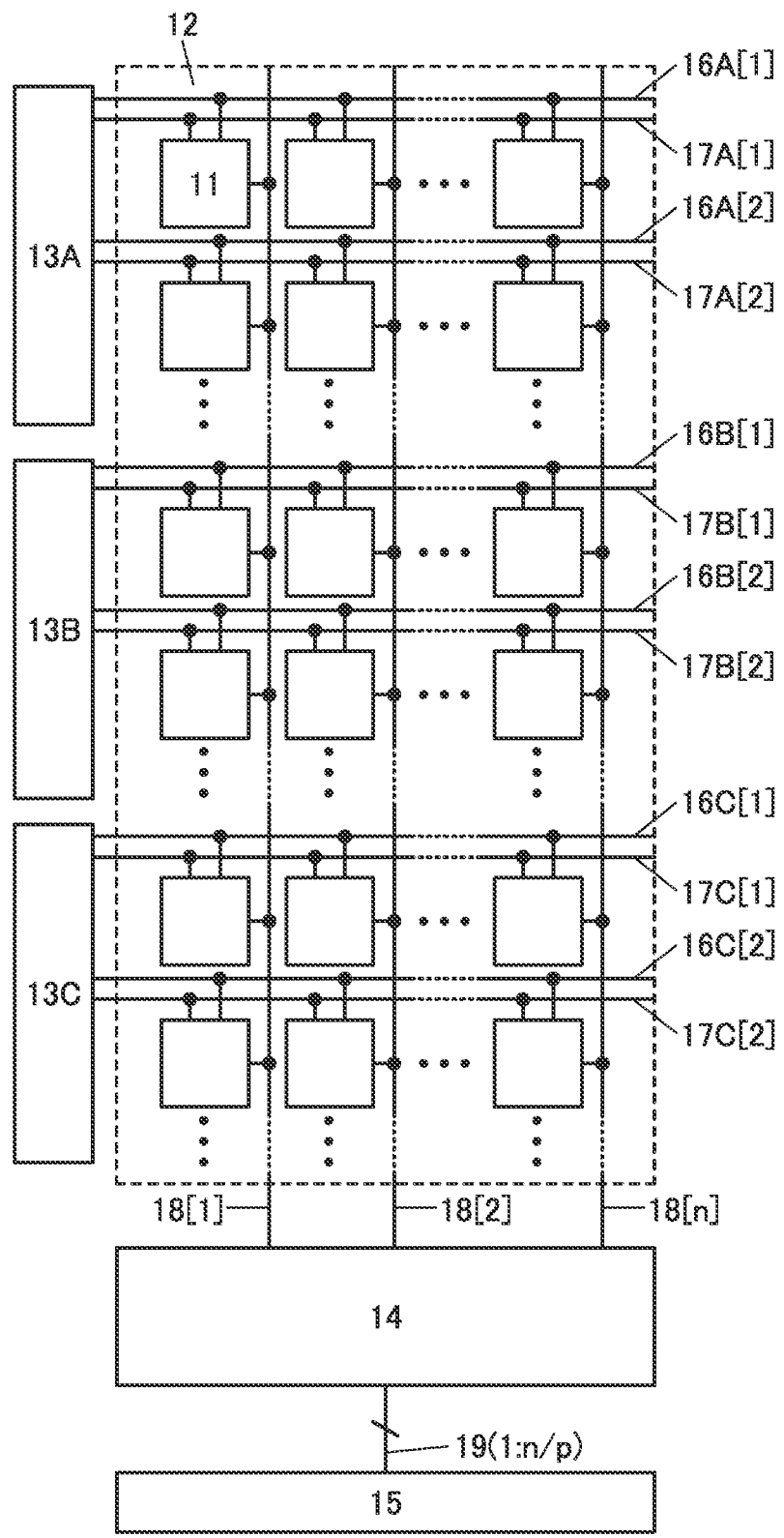
FIG. 17 is a block diagram illustrating a configuration example of an imaging device.

FIG. 17 is a block diagram illustrating a configuration example of an imaging device 10A, which is the imaging device 10 provided in the semiconductor device 90A. In the imaging device 10A, the gate driver circuit 13 is divided into three: a gate driver circuit 13A, a gate driver circuit 13B, and a gate driver circuit 13C. The wiring 16 and the wiring 17 electrically connected to the gate driver circuit 13A are referred to as a wiring 16A and a wiring 17A, respectively. The wiring 16 and the wiring 17 electrically connected to the gate driver circuit 13B are referred to as a wiring 16B and a wiring 17B, respectively. The wiring 16 and the wiring 17 electrically connected to the gate driver circuit 13C are referred to as a wiring 16C and a wiring 17C, respectively.

When the imaging device 10A has the configuration illustrated in FIG. 17, the pixels 11 included in the portion that cannot be viewed in the pixel portion 12 do not need to be driven. For example, in the case where the semiconductor device 90A is folded in three as illustrated in FIG. 16A, one of the gate driver circuit 13A to the gate driver circuit 13C is driven and the other two are not driven, whereby it is possible that the pixels 11 included in the portion that cannot be viewed not be driven. Thus, the power consumption of the semiconductor device 90A can be reduced.

Although FIG. 16A and FIG. 16B illustrate the semiconductor device 90A having a threefold mechanism as a structure example of the semiconductor device 90, one embodiment of the present invention is not limited thereto. For example, the semiconductor device 90 may have a twofold mechanism. In that case, the gate driver circuit 13 included in the imaging device 10 can be divided into two.

At least part of this embodiment can be implemented in combination with the other embodiments described in this specification, as appropriate.

Embodiment 2

In this embodiment, structure examples of semiconductor devices of embodiments of the present invention will be described with reference to FIG. 18 to FIG. 22. Specifically, structure examples that can be used for the semiconductor device 90 described in Embodiment 1, for example, will be described with reference to FIG. 18 to FIG. 22.

Detailed structures of semiconductor devices of embodiments of the present invention will be described below with reference to FIG. 18 and FIG. 19.

[Semiconductor Device 900A]

Figure 18A:
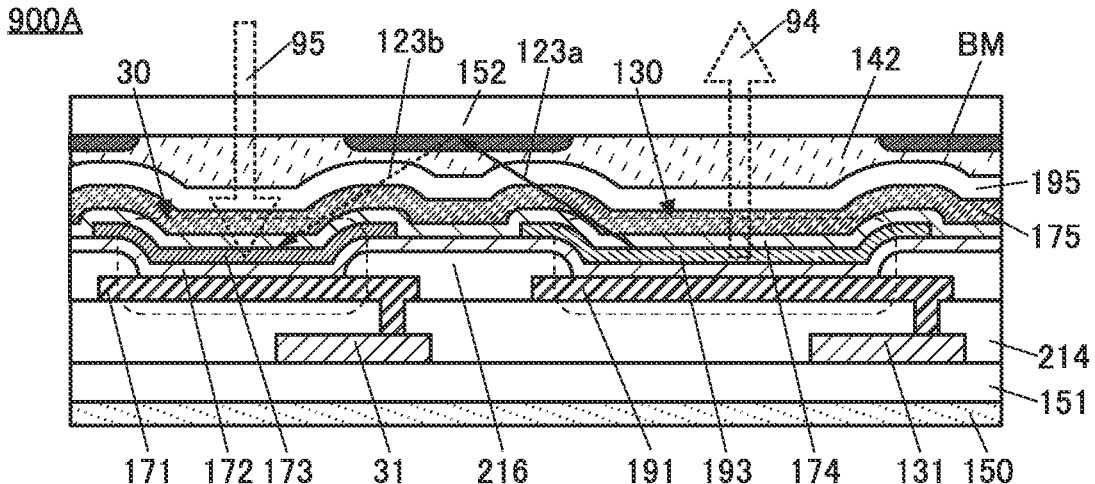
FIG. 18A to FIG. 18C are cross-sectional views each illustrating a structure example of a semiconductor device.

FIG. 18A illustrates a cross-sectional view of a display device 900A.

The display device 900A includes the photoelectric conversion element 30 and a light-emitting device 130.

The photoelectric conversion element 30 includes a pixel electrode 171, a common layer 172, an active layer 173, a common layer 174, and a common electrode 175.

The light-emitting device 130 includes a pixel electrode 191, the common layer 172, a light-emitting layer 193, the common layer 174, and the common electrode 175.

The pixel electrode 171, the pixel electrode 191, the common layer 172, the active layer 173, the light-emitting layer 193, the common layer 174, and the common electrode 175 may each have a single-layer structure or a stacked-layer structure.

The pixel electrode 171 and the pixel electrode 191 are positioned over an insulating layer 214. The pixel electrode 171 and the pixel electrode 191 can be formed using the same material in the same process.

The common layer 172 is positioned over the pixel electrode 171 and the pixel electrode 191. The common layer 172 is a layer shared by the photoelectric conversion element 30 and the light-emitting device 130.

The active layer 173 overlaps with the pixel electrode 171 with the common layer 172 therebetween. The light-emitting layer 193 overlaps with the pixel electrode 191 with the common layer 172 therebetween. The active layer 173 includes a first organic compound, and the light-emitting layer 193 includes a second organic compound that is different from the first organic compound.

The common layer 174 is positioned over the common layer 172, the active layer 173, and the light-emitting layer 193. The common layer 174 is a layer shared by the photoelectric conversion element 30 and the light-emitting device 130.

The common electrode 175 includes a portion overlapping with the pixel electrode 171 with the common layer 172, the active layer 173, and the common layer 174 therebetween. The common electrode 175 further includes a portion overlapping with the pixel electrode 191 with the common layer 172, the light-emitting layer 193, and the common layer 174 therebetween. The common electrode 175 is a layer shared by the photoelectric conversion element 30 and the light-emitting device 130.

In the semiconductor device of this embodiment, an organic compound is used for the active layer 173 of the photoelectric conversion element 30. In the photoelectric conversion element 30, the layers other than the active layer 173 can have structures in common with the layers in the light-emitting device 130 (EL device). Therefore, the photoelectric conversion element 30 can be formed concurrently with the light-emitting device 130 only by adding a step of depositing the active layer 173 in the manufacturing process of the light-emitting device 130. The light-emitting device 130 and the photoelectric conversion element 30 can be formed over the same substrate. Accordingly, the photoelectric conversion element 30 can be incorporated in the semiconductor device without a significant increase in the number of manufacturing steps.

The semiconductor device 900A illustrates an example in which the photoelectric conversion element 30 and the light-emitting device 130 have a common structure except that the active layer 173 of the photoelectric conversion element 30 and the light-emitting layer 193 of the light-emitting device 130 are separately formed. Note that the structures of the photoelectric conversion element 30 and the light-emitting device 130 are not limited thereto. The photoelectric conversion element 30 and the light-emitting device 130 may include separately formed layers other than the active layer 173 and the light-emitting layer 193 (see a semiconductor device 900D, a semiconductor device 900E, and a semiconductor device 900F to be described later). The photoelectric conversion element 30 and the light-emitting device 130 preferably include at least one layer used in common (common layer). Thus, the photoelectric conversion element 30 can be incorporated in the semiconductor device without a significant increase in the number of manufacturing steps.

The semiconductor device 900A includes the photoelectric conversion element 30, the light-emitting device 130, a transistor 31, a transistor 131, and the like between a pair of substrates (substrate 151 and substrate 152).

An adhesive layer 150 is provided on the outer side of the substrate 151. The semiconductor device 900A can be fixed to an object with the adhesive layer 150. As the adhesive layer 150, an adhesive capable of being peeled off may be used. Furthermore, an adhesive capable of reattachment after being peeled off may be employed. As the adhesive layer 150, an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used. In particular, a material with low moisture permeability, such as an epoxy resin, is preferred. Alternatively, a two-component resin may be used. An adhesive sheet or the like may be used.

In the photoelectric conversion element 30, the common layer 172, the active layer 173, and the common layer 174, which are positioned between the pixel electrode 171 and the common electrode 175, can each also be referred to as an organic layer (a layer containing an organic compound). The pixel electrode 171 preferably has a function of reflecting infrared light. An end portion of the pixel electrode 171 is covered with a partition 216. The common electrode 175 has a function of transmitting infrared light.

The photoelectric conversion element 30 has a function of sensing light. Specifically, the photoelectric conversion element 30 is a light-receiving element that receives the light 95 entering from the outside of the semiconductor device 900A and converts it into an electric signal. The light 95 can also be expressed as light that is emitted from the light-emitting device 130 and then reflected by a target. The light 95 may enter the photoelectric conversion element 30 through a lens described later.

A light-blocking layer BM is provided on a surface of the substrate 152 that is on the substrate 151 side. The light-blocking layer BM has openings at a position overlapping with the photoelectric conversion element 30 and at a position overlapping with the light-emitting device 130. Providing the light-blocking layer BM can control the range where the photoelectric conversion element 30 senses light.

For the light-blocking layer BM, a material that blocks light emitted from the light-emitting device can be used. The light-blocking layer BM preferably absorbs infrared light. As the light-blocking layer BM, a black matrix can be formed using a metal material or a resin material containing pigment (e.g., carbon black) or dye, for example.

Here, the photoelectric conversion element 30 senses light emitted from the light-emitting device 130 and reflected by a target. However, in some cases, light emitted from the light-emitting device 130 is reflected inside the semiconductor device 900A and enters the photoelectric conversion element 30 without through the target. The light-blocking layer BM can reduce the influence of such stray light. For example, in the case where the light-blocking layer BM is not provided, light 123a emitted from the light-emitting device 130 is reflected by the substrate 152 and reflected light 123b enters the photoelectric conversion element 30 in some cases. Providing the light-blocking layer BM can inhibit incidence of the reflected light 123b on the photoelectric conversion element 30. Consequently, noise can be reduced, and the sensitivity of a sensor using the photoelectric conversion element 30 can be increased.

In the light-emitting device 130, the common layer 172, the light-emitting layer 193, and the common layer 174, which are positioned between the pixel electrode 191 and the common electrode 175, can each also be referred to as an EL layer. The pixel electrode 191 preferably has a function of reflecting infrared light. An end portion of the pixel electrode 191 is covered with the partition 216. The pixel electrode 171 and the pixel electrode 191 are electrically insulated from each other with the partition 216. The common electrode 175 has a function of transmitting infrared light.

The light-emitting device 130 has a function of emitting infrared light. Specifically, the light-emitting device 130 is an electroluminescent device that emits light to the substrate 152 side by applying a voltage between the pixel electrode 191 and the common electrode 175 (see light 94).

It is preferable that the light-emitting layer 193 be formed not to overlap with a light-receiving region of the photoelectric conversion element 30. This inhibits absorption of the light 95 by the light-emitting layer 193, increasing the amount of light with which the photoelectric conversion element 30 is irradiated.

The pixel electrode 171 is electrically connected to the source or the drain of the transistor 31 through an opening provided in the insulating layer 214. The end portion of the pixel electrode 171 is covered with the partition 216.

The pixel electrode 191 is electrically connected to a source or a drain of the transistor 131 through an opening provided in the insulating layer 214. The end portion of the pixel electrode 191 is covered with the partition 216. The transistor 131 has a function of controlling driving of the light-emitting device 130.

The transistor 31 and the transistor 131 are over and in contact with the same layer (the substrate 151 in FIG. 18A).

At least part of a circuit electrically connected to the photoelectric conversion element 30 is preferably formed using the same material and the same process as a circuit electrically connected to the light-emitting device 130. In that case, the thickness of the semiconductor device can be reduced compared with the case where the two circuits are separately formed, resulting in simplification of the manufacturing steps.

The photoelectric conversion element 30 and the light-emitting device 130 are preferably covered with a protective layer 195. In FIG. 18A, the protective layer 195 is provided over and in contact with the common electrode 175. Providing the protective layer 195 can inhibit entry of impurities such as water into the photoelectric conversion element 30 and the light-emitting device 130, so that the reliability of the photoelectric conversion element 30 and the light-emitting device 130 can be increased. The protective layer 195 and the substrate 152 are bonded to each other with an adhesive layer 142.

[Semiconductor Device 900B]

Figure 18B:
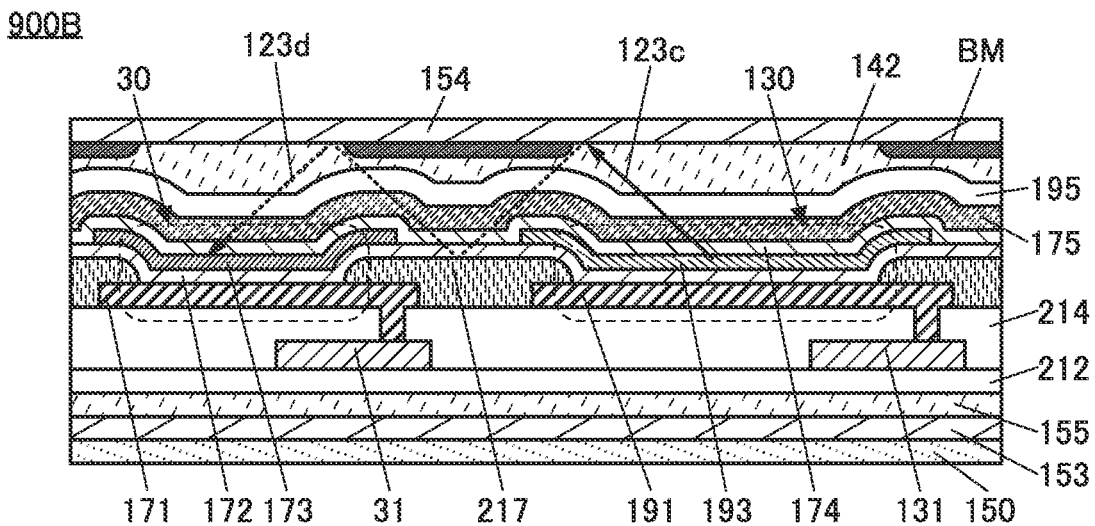

FIG. 18B illustrates cross-sectional views of a semiconductor device 900B. Note that in the description of the semiconductor device below, a structure similar to that of the above-mentioned semiconductor device will not be described in some cases.

The semiconductor device 900B illustrated in FIG. 18B differs from the semiconductor device 900A in that the substrate 151, the substrate 152, and the partition 216 are not included and a substrate 153, a substrate 154, an adhesive layer 155, an insulating layer 212, and a partition 217 are included.

The adhesive layer 150 is provided on the outer side of the substrate 153. The semiconductor device 900B can be fixed to an object with the adhesive layer 150.

The substrate 153 and the insulating layer 212 are bonded to each other with the adhesive layer 155. The substrate 154 and the protective layer 195 are bonded to each other with the adhesive layer 142.

The semiconductor device 900B has a structure obtained in such a manner that the insulating layer 212, the transistor 31, the transistor 131, the photoelectric conversion element 30, the light-emitting device 130, and the like are formed over a formation substrate and then transferred onto the substrate 153. The substrate 153 and the substrate 154 preferably have flexibility. Accordingly, the flexibility of the semiconductor device 900B can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example.

Glass that is thin enough to have flexibility may be used for one or both of the substrate 153 and the substrate 154.

As the substrate included in the semiconductor device of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

The partition 217 preferably absorbs light emitted from the light-emitting device. As the partition 217, a black matrix can be formed using a resin material containing a pigment or dye, for example. Moreover, the partition 217 can be formed of a colored insulating layer by using a brown resist material.

In some cases, light 123*c* emitted from the light-emitting device 130 is reflected by the substrate 154 and the partition 217 and reflected light 123*d* is incident on the photoelectric conversion element 30. In other cases, the light 123*c* passes through the partition 217 and is reflected with a transistor, a wiring, or the like, and thus reflected light enters the photoelectric conversion element 30. When the partition 217 absorbs the light 123*c*, incidence of the reflected light 123*d* on the photoelectric conversion element 30 can be inhibited. Consequently, noise can be reduced, and the sensitivity of a sensor using the photoelectric conversion element 30 can be increased.

The partition 217 preferably absorbs at least light with the wavelength that is sensed by the photoelectric conversion element 30. For example, in the case where the photoelectric conversion element 30 senses green light emitted from the light-emitting device 130, the partition 217 preferably absorbs at least green light. For example, when the partition 217 includes a red color filter, the green light 123*c* can be absorbed and thus incidence of the reflected light 123*d* on the photoelectric conversion element 30 can be inhibited.

[Semiconductor Device 900C]

Figure 18C:
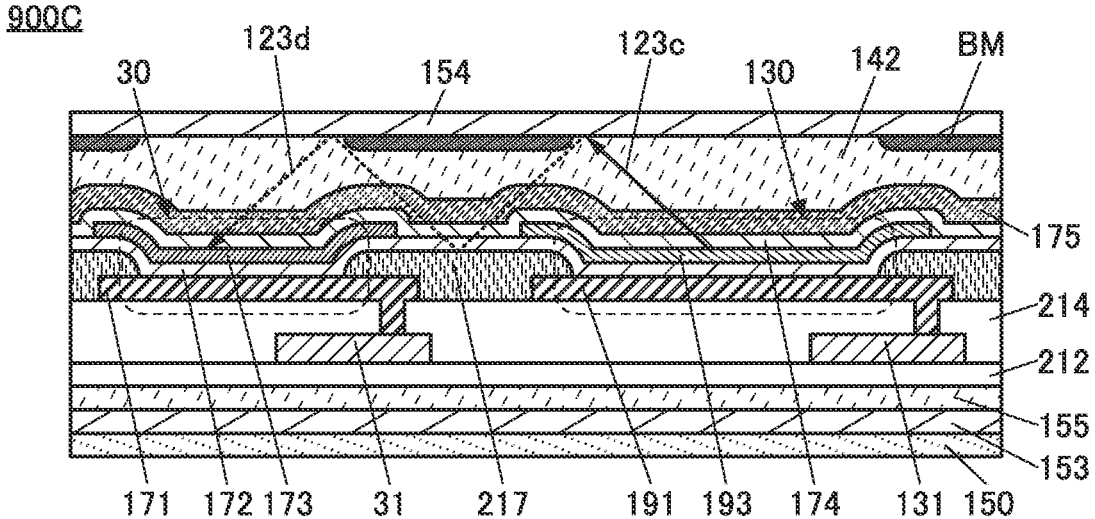

FIG. 18C illustrates a cross-sectional view of a semiconductor device 900C.

The semiconductor device 900C differs from the semiconductor device 900B in that the protective layer 195 is not provided over the photoelectric conversion element 30 and the light-emitting device 130. In the semiconductor device 900C, the common electrode 175 and the substrate 154 are bonded to each other with the adhesive layer 142.

[Semiconductor Device 900D, Semiconductor Device 900E, and Semiconductor Device 900F]

Figure 19A:
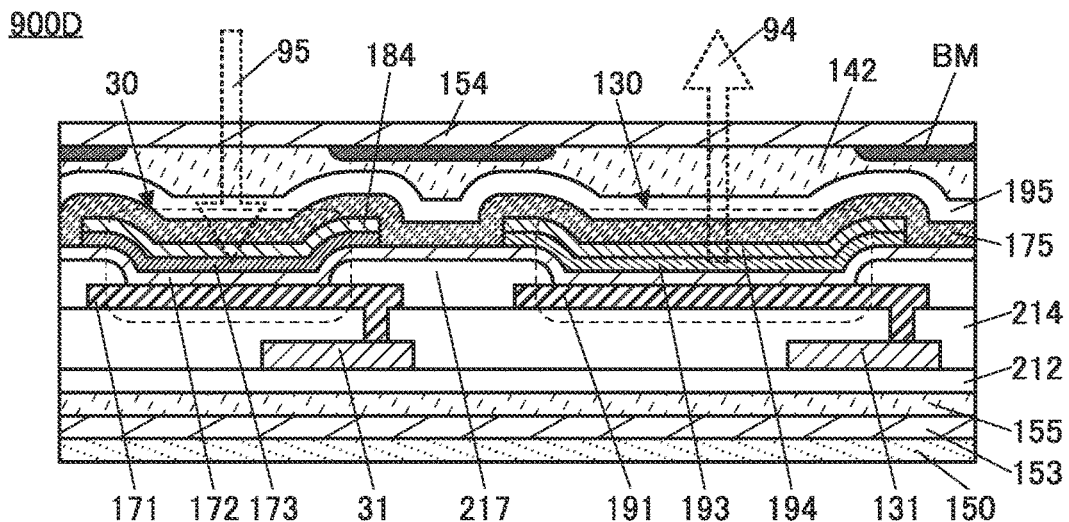
FIG. 19A to FIG. 19C are cross-sectional views each illustrating a structure example of a semiconductor device.
Figure 19B:
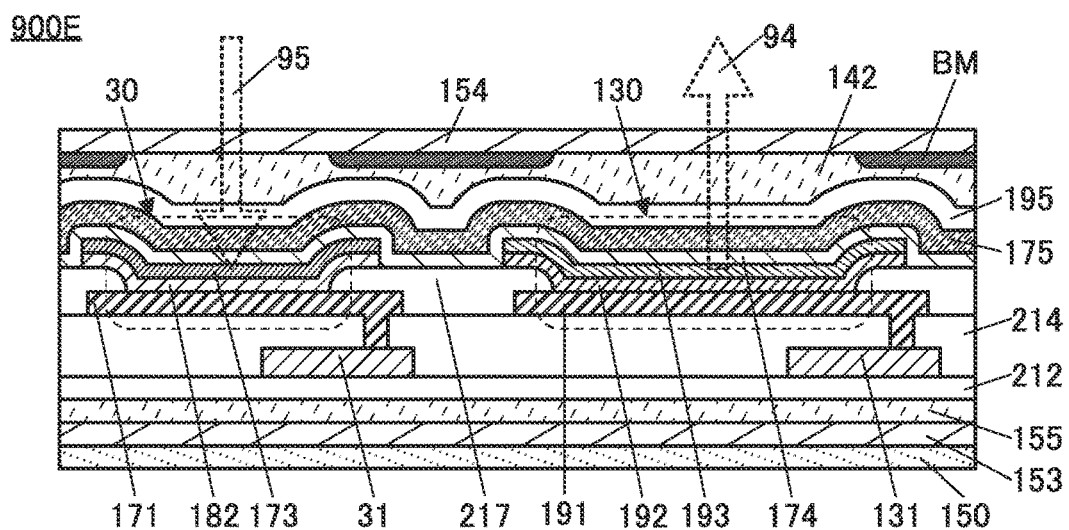
Figure 19C:
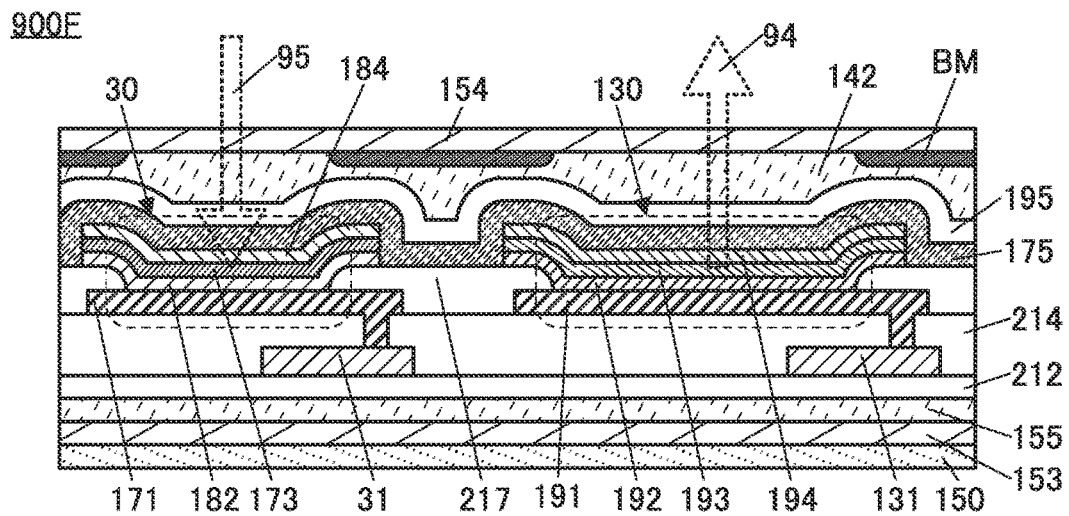

FIG. 19A illustrates a cross-sectional view of the semiconductor device 900D, FIG. 19B illustrates a cross-sectional view of the semiconductor device 900E, and FIG. 19C illustrates a cross-sectional view of the semiconductor device 900F.

The semiconductor device 900D is different from the semiconductor device 900B in that the common layer 174 is not included and a buffer layer 184 and a buffer layer 194 are included. The buffer layer 184 and the buffer layer 194 may each have a single-layer structure or a stacked-layer structure.

In the semiconductor device 900D, the photoelectric conversion element 30 includes the pixel electrode 171, the common layer 172, the active layer 173, the buffer layer 184, and the common electrode 175. In the semiconductor device 900D, the light-emitting device 130 includes the pixel electrode 191, the common layer 172, the light-emitting layer 193, the buffer layer 194, and the common electrode 175.

The semiconductor device 900E is different from the display device 900B in that the common layer 172 is not included and a buffer layer 182 and a buffer layer 192 are included. The buffer layer 182 and the buffer layer 192 may each have a single-layer structure or a stacked-layer structure.

In the semiconductor device 900E, the photoelectric conversion element 30 includes the pixel electrode 171, the buffer layer 182, the active layer 173, the common layer 174, and the common electrode 175. In the semiconductor device 900E, the light-emitting device 130 includes the pixel electrode 191, the buffer layer 192, the light-emitting layer 193, the common layer 174, and the common electrode 175.

The semiconductor device 900F is different from the semiconductor device 900A in that the common layer 172 and the common layer 174 are not included and the buffer layer 182, the buffer layer 184, the buffer layer 192, and the buffer layer 194 are included.

In the semiconductor device 900F, the photoelectric conversion element 30 includes the pixel electrode 171, the buffer layer 182, the active layer 173, the buffer layer 184, and the common electrode 175. In the semiconductor device 900F, the light-emitting device 130 includes the pixel electrode 191, the buffer layer 192, the light-emitting layer 193, the buffer layer 194, and the common electrode 175.

In the formation of the photoelectric conversion element 30 and the light-emitting device 130, not only the active layer 173 and the light-emitting layer 193 but also other layers can be formed separately.

An example is illustrated in which in the semiconductor device 900D, the buffer layer 184 between the common electrode 175 and the active layer 173 and the buffer layer 194 between the common electrode 175 and the light-emitting layer 193 are formed separately. As the buffer layer 194, one or both of an electron-injection layer and an electron-transport layer can be formed, for example.

An example is illustrated in which in the semiconductor device 900E, the buffer layer 182 between the pixel electrode 171 and the active layer 173 and the buffer layer 192 between the pixel electrode 191 and the light-emitting layer 193 are formed separately. As the buffer layer 192, one or both of a hole-injection layer and a hole-transport layer can be formed, for example.

An example is illustrated in which in the display device 900F, the photoelectric conversion element 30 and the light-emitting device 130 do not have a common layer between the pair of electrodes (the pixel electrode 171 or the pixel electrode 191 and the common electrode 175). The photoelectric conversion element 30 and the light-emitting device 130 included in the semiconductor device 900F can be manufactured in the following manner: the pixel electrode 171 and the pixel electrode 191 are formed over the insulating layer 214 using the same material in the same process; the buffer layer 182, the active layer 173, and the buffer layer 184 are formed over the pixel electrode 171; the buffer layer 192, the light-emitting layer 193, and the buffer layer 194 are formed over the pixel electrode 191; and then, the common electrode 175 is formed so as to cover the pixel electrode 171, the buffer layer 182, the active layer 173, the buffer layer 184, the pixel electrode 191, the buffer layer 192, the light-emitting layer 193, and the buffer layer 194. Note that the formation order of the stacked-layer structure of the buffer layer 182, the active layer 173, and the buffer layer 184 and the stacked-layer structure of the buffer layer 192, the light-emitting layer 193, and the buffer layer 194 is not particularly limited. For example, after the buffer layer 182, the active layer 173, and the buffer layer 184 are formed, the buffer layer 192, the light-emitting layer 193, and the buffer layer 194 may be formed. Conversely, the buffer layer 192, the light-emitting layer 193, and the buffer layer 194 may be formed before the buffer layer 182, the active layer 173, and the buffer layer 184 are formed. Alternate formation of the buffer layer 182, the buffer layer 192, the active layer 173, the light-emitting layer 193, and the like in this order is also possible.

A more detailed structure of the semiconductor device of one embodiment of the present invention will be described below with reference to FIG. 20 to FIG. 22.

[Semiconductor Device 100A]

Figure 20:
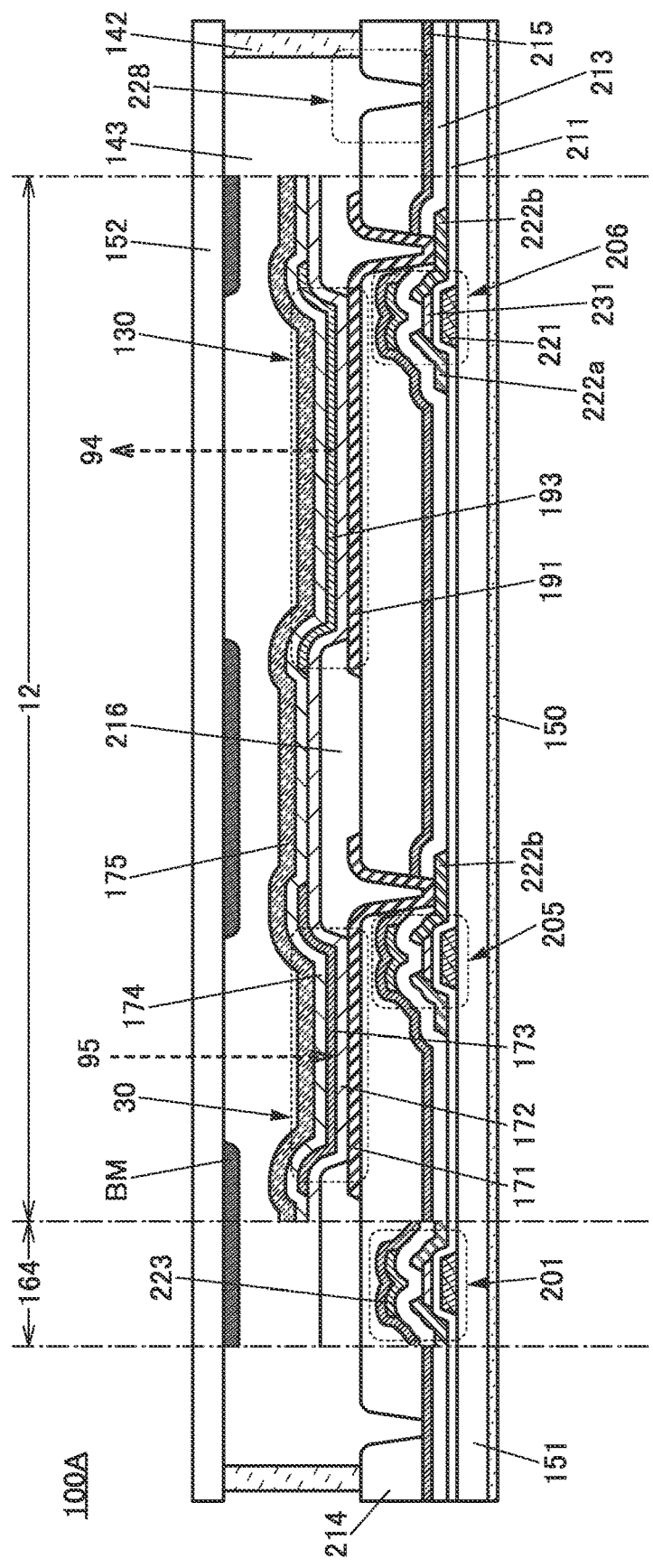
FIG. 20 is a cross-sectional view illustrating a structure example of a semiconductor device.

FIG. 20 illustrates a cross-sectional view of a display device 100A.

The semiconductor device 100A has a structure in which the substrate 152 and the substrate 151 are attached to each other.

The semiconductor device 100A includes a pixel portion 12, a circuit 164, and the like. FIG. 20 illustrates an example of cross sections of part of a region including the circuit 164, part of a region including the pixel portion 12, and part of a region including an end portion in the semiconductor device 100A.

As the circuit 164, for example, the gate driver circuit 13, the read circuit 14, and the A/D converter circuit 15 which are described in Embodiment 1 can be used. When the pixel portion 12 and the circuit 164 are formed over the same substrate, a semiconductor device separately formed with a silicon wafer or the like as a circuit does not need to be used, so that the number of components of the semiconductor device can be reduced.

The semiconductor device 100A illustrated in FIG. 20 includes a transistor 201, a transistor 205, a transistor 206, the light-emitting device 130, the photoelectric conversion element 30, and the like between the substrate 151 and the substrate 152.

The substrate 152 and the insulating layer 214 are attached to each other with the adhesive layer 142. A solid sealing structure, a hollow sealing structure, or the like can be employed to seal the light-emitting device 130 and the photoelectric conversion element 30. In FIG. 20, a space 143 surrounded by the substrate 152, the adhesive layer 142, and the insulating layer 214 is filled with an inert gas (e.g., nitrogen or argon), that is, a hollow sealing structure is employed. The adhesive layer 142 may be provided so as to overlap with the light-emitting device 130. The space 143 surrounded with the substrate 152, the adhesive layer 142, and the insulating layer 214 may be filled with a resin different from that of the adhesive layer 142.

The light-emitting device 130 has a stacked-layer structure in which the pixel electrode 191, the common layer 172, the light-emitting layer 193, the common layer 174, and the common electrode 175 are stacked in this order from the insulating layer 214 side. The pixel electrode 191 is connected to a conductive layer 222b included in the transistor 206 through an opening provided in the insulating layer 214. The transistor 206 has a function of controlling driving of the light-emitting device 130. The end portion of the pixel electrode 191 is covered with the partition 216. The pixel electrode 191 includes a material that reflects infrared light, and the common electrode 175 includes a material that transmits infrared light.

The photoelectric conversion element 30 has a stacked-layer structure in which the pixel electrode 171, the common layer 172, the active layer 173, the common layer 174, and the common electrode 175 are stacked in this order from the insulating layer 214 side. The pixel electrode 171 is electrically connected to the conductive layer 222b included in the transistor 205 through an opening provided in the insulating layer 214. The end portion of the pixel electrode 171 is covered with the partition 216. The pixel electrode 171 includes a material that reflects infrared light, and the common electrode 175 includes a material that transmits infrared light.

The light 94 emitted from the light-emitting device 130 is emitted toward the substrate 152 side. The light 95 enters the photoelectric conversion element 30 through the substrate 152 and the space 143. For the substrate 152, a material having a high infrared-light-transmitting property is preferably used.

The pixel electrode 171 and the pixel electrode 191 can be formed using the same material in the same process. The common layer 172, the common layer 174, and the common electrode 175 are used in both the photoelectric conversion element 30 and the light-emitting device 130. The photoelectric conversion element 30 and the light-emitting device 130 can have the same structure except the structures of the active layer 173 and the light-emitting layer 193. Thus, the photoelectric conversion element 30 can be incorporated in the semiconductor device 100A without a significant increase in the number of manufacturing steps.

A light-blocking layer BM is provided on a surface of the substrate 152 that is on the substrate 151 side. The light-blocking layer BM has openings at a position overlapping with the photoelectric conversion element 30 and at a position overlapping with the light-emitting device 130. Providing the light-blocking layer BM can control the range where the photoelectric conversion element 30 senses light. Furthermore, with the light-blocking layer BM, direct incidence of light from the light-emitting device 130 on the photoelectric conversion element 30 without through a target can be inhibited. Hence, a sensor with less noise and high sensitivity can be obtained.

The transistor 201, the transistor 205, and the transistor 206 are all formed over the substrate 151. These transistors can be formed using the same materials in the same process.

An insulating layer 211, an insulating layer 213, an insulating layer 215, and the insulating layer 214 are provided in this order over the substrate 151. Part of the insulating layer 211 functions as gate insulating layers of the transistors. Part of the insulating layer 213 functions as gate insulating layers of the transistors. The insulating layer 215 is provided so as to cover the transistors. The insulating layer 214 is provided so as to cover the transistors and has a function of a planarization layer. Note that there is no limitation on the number of gate insulating layers and the number of insulating layers covering the transistors, and each insulating layer may have either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the semiconductor device.

An inorganic insulating film is preferably used as each of the insulating layer 211, the insulating layer 213, and the insulating layer 215. As the inorganic insulating film, for example, a silicon nitride film, a silicon oxynitride film, a silicon oxide film, a silicon nitride oxide film, an aluminum oxide film, an aluminum nitride film, or the like which is an inorganic insulating film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the semiconductor device 100A. This can inhibit entry of impurities from the end portion of the semiconductor device 100A through the organic insulating film. Alternatively, the organic insulating film may be formed such that an end portion of the organic insulating film is positioned inward from the end portion of the semiconductor device 100A, to prevent the organic insulating film from being exposed at the end portion of the semiconductor device 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 20, an opening is formed in the insulating layer 214. Thus, the entry of impurities into the pixel portion 12 from the outside through the insulating layer 214 can be inhibited even when an organic insulating film is used for the insulating layer 214. Thus, the reliability of the semiconductor device 100A can be increased.

Each of the transistor 201, the transistor 205, and the transistor 206 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the semiconductor device of this embodiment. For example, a planar transistor, a staggered transistor, or an inverted staggered transistor can be used. A top-gate or bottom-gate transistor structure may be used. Alternatively, gates may be provided above and below a semiconductor layer in which a channel is formed.

The structure in which the semiconductor layer where a channel is formed is provided between two gates is used for the transistor 201, the transistor 205, and the transistor 206. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and either an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case degradation of the transistor characteristics can be inhibited.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon or single crystal silicon).

The semiconductor layer preferably includes indium, M (M is one kind or two or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one kind or two or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target including a polycrystalline oxide is preferably used as the sputtering target, in which case the semiconductor layer having crystallinity is easily formed. Note that the atomic ratio in the semiconductor layer to be formed may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be formed is sometimes in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistors included in the circuit 164 and the transistors included in the pixel portion 12 may have the same structure or different structures. A plurality of transistors included in the circuit 164 may have the same structure or two or more kinds of structures. Similarly, a plurality of transistors included in the pixel portion 12 may have the same structure or two or more kinds of structures.

The adhesive layer 150 is provided on the outer side of the substrate 151. The semiconductor device 100A can be fixed to an object with the adhesive layer 150.

A variety of optical members can be arranged on the outer side of the substrate 152. Examples of the optical members include a polarizing plate, a retardation plate, a light diffusion layer (e.g., diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outer side of the substrate 152.

For each of the substrate 151 and the substrate 152, glass, quartz, ceramic, sapphire, resin, or the like can be used. When a flexible material is used for the substrate 151 and the substrate 152, the flexibility of the semiconductor device can be increased.

As the adhesive layer 142 and the adhesive layer 155, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

The light-emitting device 130 has a top-emission structure, a bottom-emission structure, a dual-emission structure, or the like. A conductive film that transmits infrared light is used as the electrode through which light is extracted. A conductive film that reflects infrared light is preferably used as the electrode through which no light is extracted.

The light-emitting device 130 includes at least the light-emitting layer 193. The light-emitting device 130 may further include, as a layer other than the light-emitting layer 193, a layer containing a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like. For example, the common layer 172 preferably includes one or both of a hole-injection layer and a hole-transport layer. For example, the common layer 174 preferably includes one or both of an electron-transport layer and an electron-injection layer.

For the common layer 172, the light-emitting layer 193, and the common layer 174, either a low molecular compound or a high molecular compound may be used, and the common layer 172, the light-emitting layer 193, and the common layer 174 may also contain an inorganic compound. The layers that constitute the common layer 172, the light-emitting layer 193, and the common layer 174 can each be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

The active layer 173 of the photoelectric conversion element 30 includes a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer 193 of the light-emitting device 130 and the active layer 173 of the photoelectric conversion element 30 can be formed by the same method (e.g., a vacuum evaporation method) and thus the same manufacturing apparatus can be used.

Examples of an n-type semiconductor material included in the active layer 173 are electron-accepting organic semiconductor materials such as fullerene (e.g., $C_{60}$ and $C_{70}$) and derivatives thereof. As a p-type semiconductor material contained in the active layer 173, an electron-donating organic semiconductor material such as copper(II) phthalocyanine (CuPc) or tetraphenyldibenzoperiflanthene (DBP) can be enumerated.

For example, the active layer 173 is preferably formed through co-evaporation of an n-type semiconductor and a p-type semiconductor.

As materials that can be used for conductive layers such as a variety of wirings and electrodes that constitute the semiconductor device, in addition to a gate, a source, and a drain of a transistor, a metal such as aluminum, titanium, chromium, nickel, copper, yttrium, zirconium, molybdenum, silver, tantalum, or tungsten, an alloy containing the metal as its main component, and the like can be enumerated. A single-layer structure or a stacked-layer structure including a film containing such a material can be used.

As a light-transmitting conductive material, a conductive oxide such as indium oxide, indium tin oxide, indium zinc oxide, zinc oxide, or zinc oxide containing gallium, or graphene can be used. A metal material such as gold, silver, platinum, magnesium, nickel, tungsten, chromium, molybdenum, iron, cobalt, copper, palladium, or titanium, or an alloy material containing the metal material can also be used. A nitride of the metal material (e.g., titanium nitride) or the like may also be used. Note that in the case of using the metal material or the alloy material (or the nitride thereof), the thickness is preferably set small enough to be able to transmit light. A stacked film of the above materials can be used as a conductive layer. For example, a stacked film or the like of indium tin oxide and an alloy of silver and magnesium is preferably used because it can increase the conductivity. These can also be used for conductive layers such as a variety of wirings and electrodes that constitute a semiconductor device, and conductive layers (conductive layers functioning as a pixel electrode or a common electrode) included in a display element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be enumerated.

[Semiconductor Device 100B]

Figure 21:
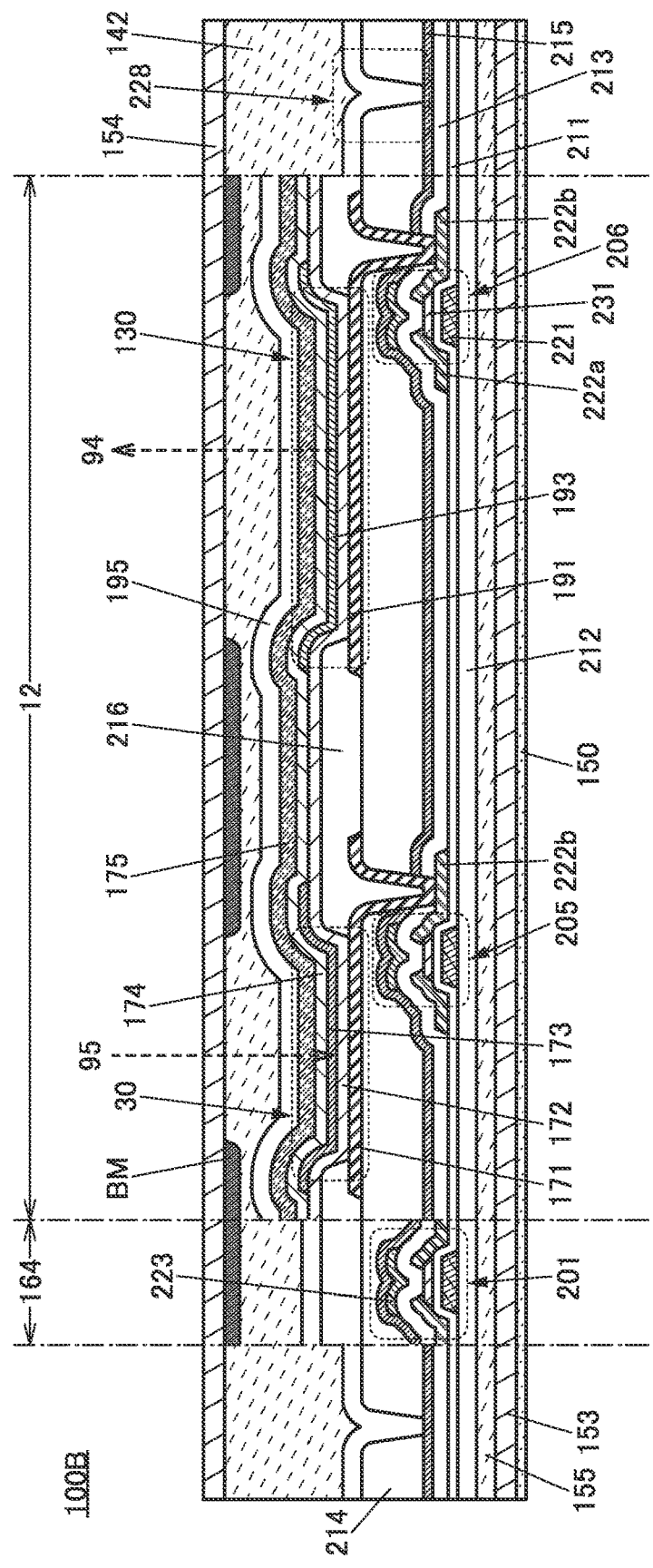
FIG. 21 is a cross-sectional view illustrating a structure example of a semiconductor device.

FIG. 21 illustrates a cross-sectional view of a semiconductor device 100B.

The semiconductor device 100B differs from the semiconductor device 100A mainly in that the substrate 151 and the substrate 152 are not included, the substrate 153, the substrate 154, the adhesive layer 155, and the insulating layer 212 are included, and the protective layer 195 is included.

The substrate 153 and the insulating layer 212 are bonded to each other with the adhesive layer 155. The substrate 154 and the protective layer 195 are bonded to each other with the adhesive layer 142. The adhesive layer 142 is provided so as to overlap with the photoelectric conversion element 30 and the light-emitting device 130; that is, the semiconductor device 100B employs a solid sealing structure.

The semiconductor device 100B is formed in such a manner that the insulating layer 212, the transistor 201, the transistor 205, the transistor 206, the photoelectric conversion element 30, the light-emitting device 130, and the like which are formed over a formation substrate are transferred onto the substrate 153. The substrate 153 and the substrate 154 preferably have flexibility. Accordingly, the flexibility of the semiconductor device 100B can be increased.

The adhesive layer 150 is provided on the outer side of the substrate 153. The semiconductor device 100B can be fixed to an object with the adhesive layer 150.

The inorganic insulating film that can be used for the insulating layer 211, the insulating layer 213, and the insulating layer 215 can be used for the insulating layer 212.

Providing the protective layer 195 covering the photoelectric conversion element 30 and the light-emitting device 130 can inhibit entry of impurities such as water into the photoelectric conversion element 30 and the light-emitting device 130, so that the reliability of the photoelectric conversion element 30 and the light-emitting device 130 can be increased.

In the region 228 in the vicinity of an end portion of the semiconductor device 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the semiconductor device 100B through the organic insulating film can be inhibited. Thus, the reliability of the semiconductor device 100B can be increased.

The protective layer 195 may have a stacked-layer structure of an organic insulating film and an inorganic insulating film. In that case, an end portion of the inorganic insulating film preferably extends beyond an end portion of the organic insulating film.

[Semiconductor Device 100C]

FIG. 22A illustrates a cross-sectional view of a semiconductor device 100C.

The semiconductor device 100C differs from the semiconductor device 100B in transistor structures.

The semiconductor device 100C includes a transistor 208, a transistor 209, and a transistor 210 over the substrate 153.

Each of the transistor 208, the transistor 209, and the transistor 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 225 and the insulating layer 215. One of the conductive layer 222a and the conductive layer 222b serves as a source, and the other serves as a drain.

The pixel electrode 191 of the light-emitting device 130 is electrically connected to the one of the pair of low-resistance regions 231n of the transistor 208 through the conductive layer 222b.

The pixel electrode 171 of the photoelectric conversion element 30 is electrically connected to the other of the pair of low-resistance regions 231n of the transistor 209 through the conductive layer 222b.

FIG. 22A illustrates an example in which the insulating layer 225 covers the top surface and a side surface of the semiconductor layer. Meanwhile, in FIG. 22B, the insulating layer 225 overlaps with the channel formation region 231i of the semiconductor layer 231 and does not overlap with the low-resistance regions 231n. The structure illustrated in FIG. 22B can be obtained by processing the insulating layer 225 with the conductive layer 223 as a mask, for example. In FIG. 22B, the insulating layer 215 is provided so as to cover the insulating layer 225 and the conductive layer 223, and the conductive layer 222a and the conductive layer 222b are connected to the corresponding low-resistance regions 231n through the openings in the insulating layer 215. Furthermore, an insulating layer 218 covering the transistor may be provided.

[Metal Oxide]

A metal oxide that can be used for the semiconductor layer will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

A metal oxide with a low carrier concentration is preferably used for the semiconductor layer. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect that is an oxygen vacancy into which hydrogen has entered can function as a donor of a metal oxide. However, it is difficult to evaluate the defects quantitatively. Thus, the metal oxide is sometimes evaluated in terms of not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with sufficiently reduced concentration of impurities such as hydrogen is used for a channel formation region of a transistor, stable electrical characteristics can be given.

The carrier concentration of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

In this specification and the like, CAAC (c-axis aligned crystal) and CAC (Cloud-Aligned Composite) may be stated. CAAC refers to an example of a crystal structure, and CAC refers to an example of a function or a material composition.

As the semiconductor layer, a CAC-OS can be used, for example.

A CAC-OS or a CAC-metal oxide has a conducting function in part of the material and has an insulating function in part of the material, and has a function of a semiconductor as the whole material. Note that, in the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide is composed of a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current drive capability in the on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is unlikely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter, IGZO), which is a kind of metal oxide containing indium, gallium, and zinc, has a stable structure in some cases by being formed of the above-described nanocrystals. In particular, crystals of IGZO tend to be difficult to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures that show different properties. Two or more kinds among the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, and still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The substrate temperature during the formation of the metal oxide film is preferably lower than or equal to 350° C., further preferably higher than or equal to room temperature and lower than or equal to 200° C., and still further preferably higher than or equal to room temperature and lower than or equal to 130° C. The substrate temperature during the formation of the metal oxide film is preferably room temperature because productivity can be increased.

The metal oxide film can be formed by a sputtering method. Alternatively, a PLD method, a PECVD method, a thermal CVD method, an ALD method, or a vacuum evaporation method, for example, may be used.

In the light-receiving element, at least one of the layers other than the active layer can have a structure in common with a layer in the light-emitting device (EL device). Also in the light-receiving element, all of the layers other than the active layer can have structures in common with the layers in the light-emitting device (EL device). For example, the light-emitting device and the light-receiving element can be formed over one substrate only by adding a step of forming the active layer in the manufacturing process of the light-emitting device. In the light-receiving element and the light-emitting device, their pixel electrodes can be formed using the same material in the same process, and their common electrodes can be formed using the same material in the same process. When a circuit electrically connected to the light-receiving element and a circuit electrically connected to the light-emitting device are formed using the same materials in the same process, the manufacturing process of the semiconductor device can be simplified. In such a manner, a semiconductor device that incorporates a light-receiving element and is highly convenient can be manufactured without complicated steps.

The semiconductor device of this embodiment includes a coloring layer between the light-receiving element and the light-emitting device. A partition that electrically isolates the light-receiving element and the light-emitting device may also function as the coloring layer. The coloring layer can absorb stray light in the semiconductor device, which can increase the sensitivity of a sensor using the light-receiving element.

At least part of this embodiment can be implemented in combination with the other embodiments described in this specification, as appropriate.

Embodiment 3

In this embodiment, electronic devices of embodiments of the present invention will be described.

Electronic devices in this embodiment are each provided with the semiconductor device of one embodiment of the present invention. For example, the semiconductor device of one embodiment of the present invention can be used in a display portion of the electronic device. Since the semiconductor device of one embodiment of the present invention has a function of sensing light, a contact input operation and a contactless input operation can be performed. In addition, biometric authentication can be performed with the use of an image capturing function of the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 23A:
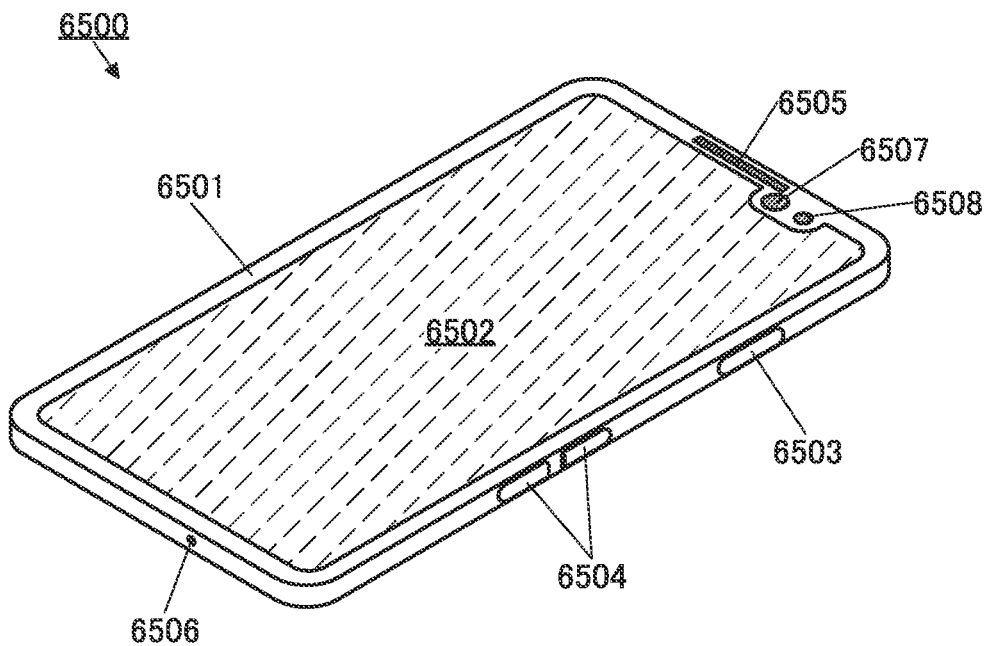
FIG. 23A and FIG. 23B are drawings illustrating an example of an electronic device.

An electronic device 6500 illustrated in FIG. 23A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The semiconductor device of one embodiment of the present invention can be used in the display portion 6502.

Figure 23B:
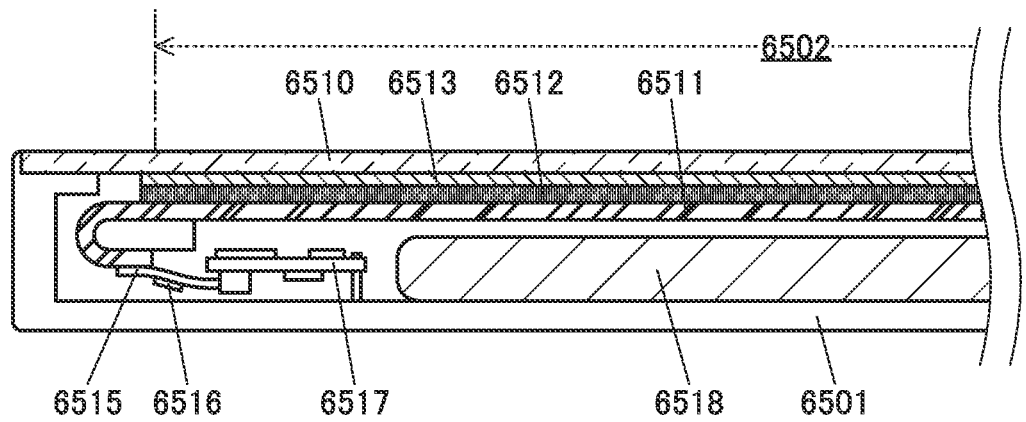

FIG. 23B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded with the housing 6501 and the protection member 6510.

The display panel 6511, the optical member 6512, and the touch sensor panel 6513 are fixed to the protection member 6510 with an adhesive layer (not illustrated). Note that the semiconductor device of one embodiment of the present invention can be used in the display panel 6511, and the touch sensor panel 6513 may be omitted in the case where only a sensor function of the display device is used.

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

The display device with flexibility of one embodiment of the present invention can be used for the display panel 6511. Thus, an extremely lightweight electronic device can be obtained. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is provided on the rear side of a pixel portion.

Figure 24A:
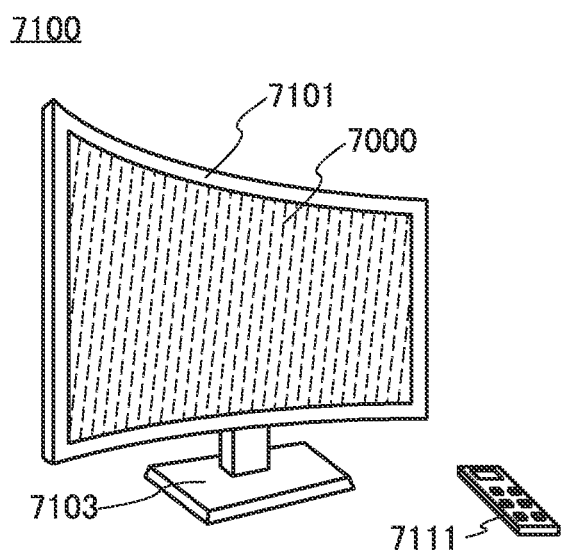
FIG. 24A to FIG. 24D are drawings illustrating examples of electronic devices.

FIG. 24A illustrates an example of a television device. In a television device 7100, a display portion 7000 is incorporated in a housing 7101. Here, a structure in which the housing 7101 is supported with a stand 7103 is illustrated.

The semiconductor device of one embodiment of the present invention can be used for the display portion 7000.

Operation of the television device 7100 illustrated in FIG. 24A can be performed with an operation switch provided in the housing 7101 or a separate remote controller 7111. Alternatively, the television device 7100 may be operated in such a manner that the touch sensor or the near-touch sensor provided in the display portion 7000 is made to function and a finger or the like touches or is made closer to the display portion 7000. The remote controller 7111 may be provided with a display portion for displaying information output from the remote controller 7111. With operation keys or a touch panel provided in the remote controller 7111, channels and volume can be controlled and video displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 24B:
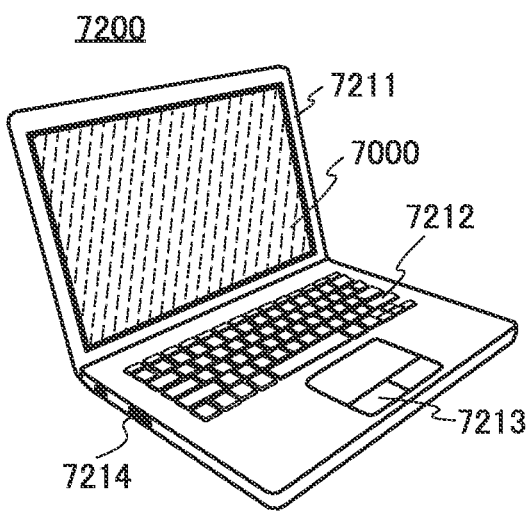

FIG. 24B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The semiconductor device of one embodiment of the present invention can be used for the display portion 7000.

Figure 24C:
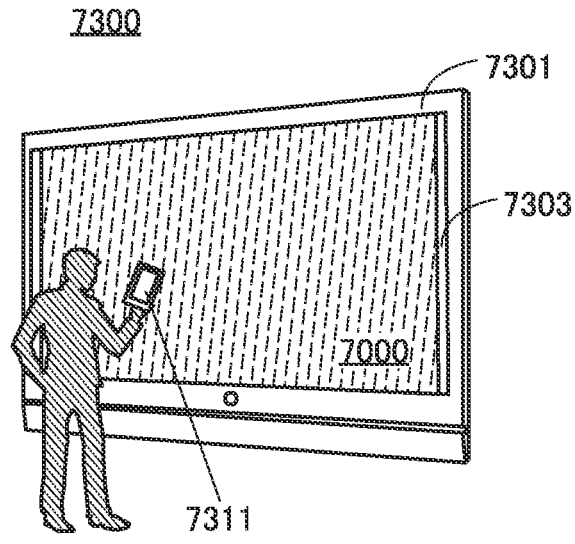
Figure 24D:
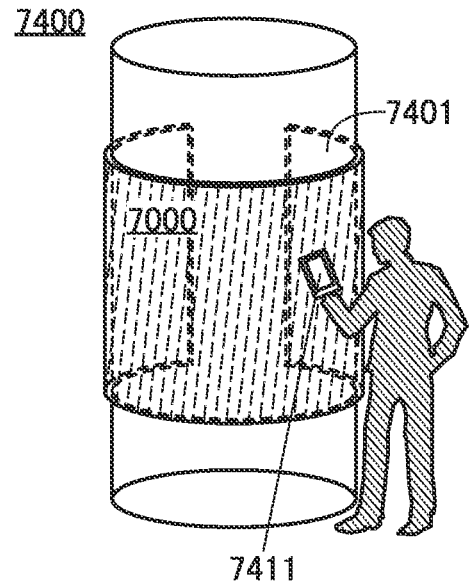

FIG. 24C and FIG. 24D show examples of digital signage.

Digital signage 7300 illustrated in FIG. 24C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 24D is digital signage 7400 attached to a cylindrical pillar 7401. The digital signage 7400 includes the display portion 7000 provided along a curved surface of the pillar 7401.

The semiconductor device of one embodiment of the present invention can be used for the display portion 7000 in FIG. 24C and FIG. 24D.

The larger the display portion 7000 is, the larger amount of data can be provided at a time. The larger display portion 7000 attracts more attention, so that the advertising effectiveness can be enhanced, for example.

When the touch sensor or the near-touch sensor provided in the display portion 7000 is made to function, not only display of an image or a moving image on the display portion 7000 but also intuitive operation by the user is possible. Moreover, for an application for obtaining information such as route information or traffic information, usability can be enhanced by intuitive operation.

Furthermore, as illustrated in FIG. 24C and FIG. 24D, it is preferable that the digital signage 7300 or the digital signage 7400 be capable of working with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

Furthermore, it is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

The electronic devices illustrated in FIG. 25A to FIG. 25F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 25A to FIG. 25F have a variety of functions. The electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium, for example. Note that the functions of the electronic devices are not limited thereto, and the electronic devices can have a variety of functions. The electronic devices may include a plurality of display portions. The electronic devices may each include a camera or the like and have a function of shooting a still image or a moving image and storing the shot image in a recording medium (an external recording medium or a recording medium incorporated in the camera), a function of displaying the shot image on the display portion, or the like.

The details of the electronic devices illustrated in FIG. 25A to FIG. 25F will be described below. When the semiconductor device of one embodiment of the present invention is used in the electronic devices illustrated in FIG. 25A to FIG. 25F, an input operation is possible even without contact. In addition, biometric authentication can be performed with the use of an image capturing function of the display portion. Thus, the electronic device can have improved functionality and convenience, for example.

Figure 25A:
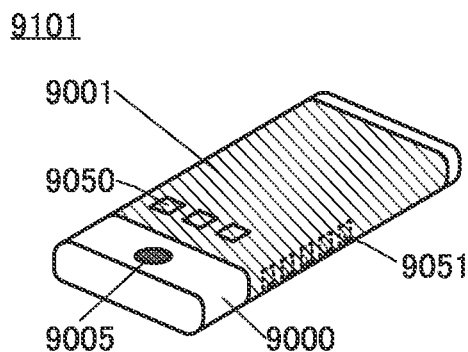
FIG. 25A to FIG. 25F are drawings illustrating examples of electronic devices.

FIG. 25A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 25A shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icons 9050 or the like may be displayed in the position where the information 9051 is displayed.

Figure 25B:
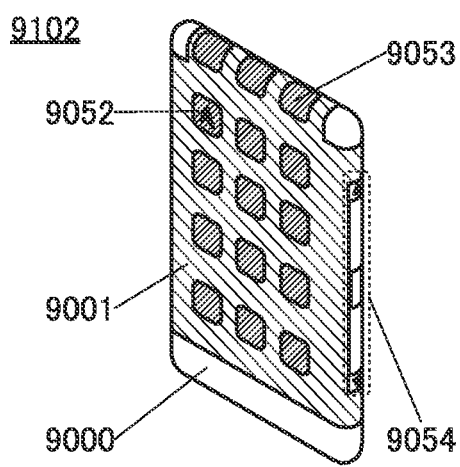

FIG. 25B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 25C:
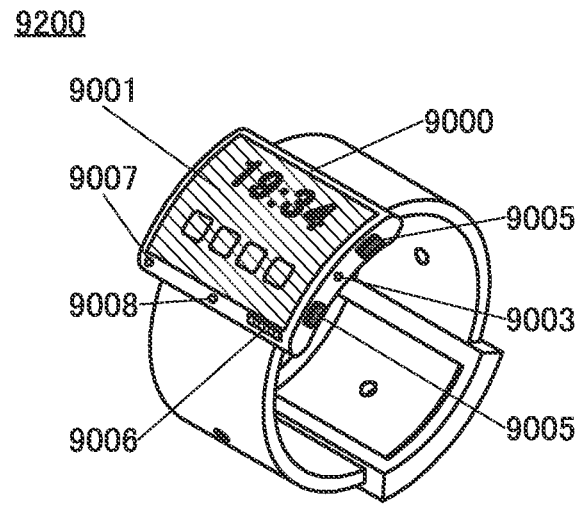

FIG. 25C is a perspective view illustrating a watch-type portable information terminal 9200. For example, the portable information terminal 9200 can be used as a smartwatch. The display surface of the display portion 9001 is curved, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and can be recharged. Note that the recharging operation may be performed through wireless power feeding.

Figure 25D:
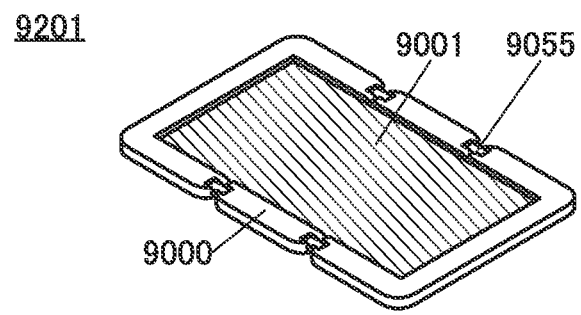
Figure 25E:
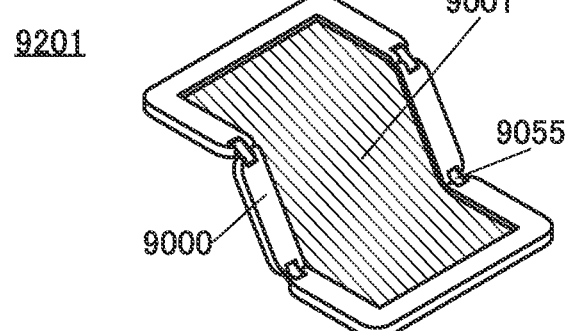
Figure 25F:
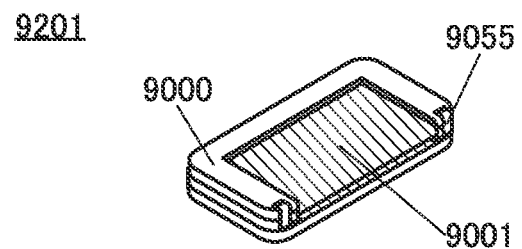

FIG. 25D to FIG. 25F are perspective views showing a foldable portable information terminal 9201. FIG. 25D is a perspective view of an unfolded state of the portable information terminal 9201, FIG. 25F is a perspective view of a folded state thereof, and FIG. 25E is a perspective view of a state in the middle of change from one of FIG. 25D and FIG. 25F to the other. The portable information terminal 9201 is highly portable in the folded state and has high display browsability in the unfolded state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

At least part of this embodiment can be implemented in combination with the other embodiments described in this specification, as appropriate.

REFERENCE NUMERALS

10: imaging device, 10A: imaging device, 11: pixel, 12: pixel portion, 13: gate driver circuit, 13A: gate driver circuit, 13B: gate driver circuit, 13C: gate driver circuit, 14: circuit, 15: A/D converter circuit, 16: wiring, 16A: wiring, 16B: wiring, 16C: wiring, 17: wiring, 17A: wiring, 17B: wiring, 17C: wiring, 18: wiring, 19: wiring, 21: load circuit, 22: CDS circuit, 23: signal output circuit, 24: shift register circuit, 25: wiring, 26: wiring, 27: wiring, 28: wiring, 30: photoelectric conversion element, 31: transistor, 32: transistor, 33: transistor, 34: transistor, 35: capacitor, 36: transistor, 37: transistor, 38: capacitor, 40: wiring, 41: wiring, 42: wiring, 44: wiring, 45: wiring, 46: wiring, 47: wiring, 52: current, 52a: current, 52b: current, 54: current, 61a: capacitor, 61b: capacitor, 62: transistor, 63: transistor, 64: transistor, 65: transistor, 66: transistor, 71: wiring, 72: wiring, 73: wiring, 74: wiring, 75: wiring, 76: wiring, 77: wiring, 81: period, 82: period, 83: period, 84: period, 85a: period, 85b: period, 86a: period, 86b: period, 90: semiconductor device, 90A: semiconductor device, 91: substrate, 92: substrate, 93: light-emitting apparatus, 94: light, 95: light, 97: finger, 99: fingerprint, 100A: semiconductor device, 100B: semiconductor device, 100C: semiconductor device, 101: transistor, 102: transistor, 103: transistor, 104: transistor, 105: transistor, 106: transistor, 107: transistor, 108: transistor, 109: transistor, 111: capacitor, 112: capacitor, 120: transistor, 123a: light, 123b: reflected light, 123c: light, 123d: reflected light, 130: light-emitting device, 131: transistor, 142: adhesive layer, 143: space, 150: adhesive layer, 151: substrate, 152: substrate, 153: substrate, 154: substrate, 155: adhesive layer, 164: circuit, 171: pixel electrode, 172: common layer, 173: active layer, 174: common layer, 175: common electrode, 182: buffer layer, 184: buffer layer, 191: pixel electrode, 192: buffer layer, 193: light-emitting layer, 194: buffer layer, 195: protective layer, 201: transistor, 205: transistor, 206: transistor, 208: transistor, 209: transistor, 210: transistor, 211: insulating layer, 212: insulating layer, 213: insulating layer, 214: insulating layer, 215: insulating layer, 216: partition, 217: partition, 218: insulating layer, 221: conductive layer, 222a: conductive layer, 222b: conductive layer, 223: conductive layer, 225: insulating layer, 228: region, 231: semiconductor layer, 231i: channel formation region, 231n: low-resistance region, 802a: housing, 802b: housing, 802c: housing, 803a: hinge, 803b: hinge, 900A: semiconductor device, 900B: semiconductor device, 900C: semiconductor device, 900D: semiconductor device, 900E: semiconductor device, 900F: semiconductor device, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. An imaging device comprising:
a pixel and a CDS circuit,
wherein the CDS circuit includes a first transistor, a second transistor, a third transistor, a first capacitor, and a second capacitor,
wherein the pixel is electrically connected to one of a source and a drain of the first transistor and one electrode of the first capacitor through a wiring,
wherein the other of the source and the drain of the first transistor is electrically connected to one electrode of the second capacitor, and
wherein one of a source and a drain of the second transistor is directly connected to a gate of the third transistor, the other electrode of the first capacitor, and the other electrode of the second capacitor.

2. The imaging device according to claim 1,
wherein the pixel has a first period in which imaging data written to the pixel is output as a first signal to the wiring, and a second period in which the imaging data written to the pixel is reset and a second signal is output to the wiring, and
wherein the CDS circuit has a function of turning on the second transistor in the first period and a function of turning off the second transistor in the second period.

3. The imaging device according to claim 1,
wherein the first transistor and the second transistor each include a metal oxide in a channel formation region, and
wherein the metal oxide contains In, Zn, and M (M is Al, Ti, Ga, Sn, Y, Zr, La, Ce, Nd, or Hf).

4. A method for driving an imaging device, the imaging device comprising a pixel and a current mirror circuit,
wherein the pixel and the current mirror circuit are electrically connected to a wiring,
wherein the current mirror circuit includes a first transistor and a second transistor, and
wherein one of a source and a drain of the first transistor is electrically connected to the wiring,
the method comprising:
outputting imaging data written to the pixel as a first signal to the wiring in a first period; and
resetting the imaging data written to the pixel, in a second period, and outputting a second signal from the pixel to the wiring,
wherein in the first period, a first potential is supplied to a gate of the first transistor, a gate of the second transistor, and one of a source and a drain of the second transistor, and a power supply potential is supplied to the other of the source and the drain of the second transistor,
wherein in the second period, a second potential is supplied to the gate of the first transistor, the gate of the second transistor, and the one of the source and the drain of the second transistor, and the power supply potential is supplied to the other of the source and the drain of the second transistor, and
wherein a difference between the second potential and the power supply potential is greater than a difference between the first potential and the power supply potential.

5. The method for driving an imaging device, according to claim 4,
the imaging device comprising a CDS circuit,
wherein the CDS circuit includes a third transistor, a fourth transistor, a fifth transistor, a first capacitor, and a second capacitor,
wherein the wiring is electrically connected to one of a source and a drain of the third transistor and one electrode of the first capacitor,
wherein the other of the source and the drain of the third transistor is electrically connected to one electrode of the second capacitor, and
wherein one of a source and a drain of the fourth transistor is electrically connected to a gate of the fifth transistor, the other electrode of the first capacitor, and the other electrode of the second capacitor,
wherein in the first period, the fourth transistor is in an on state, and
wherein in the second period, the fourth transistor is in an off state.

6. The method for driving an imaging device, according to claim 5,
wherein the third transistor and the fourth transistor each include a metal oxide in a channel formation region, and
wherein the metal oxide contains In, Zn, and M (M is Al, Ti, Ga, Sn, Y, Zr, La, Ce, Nd, or Hf).

* * * * *